United States Patent [19]
Williams

[11] Patent Number: 5,689,144
[45] Date of Patent: Nov. 18, 1997

[54] FOUR-TERMINAL POWER MOSFET SWITCH HAVING REDUCED THRESHOLD VOLTAGE AND ON-RESISTANCE

[75] Inventor: Richard K. Williams, Cupertino, Calif.

[73] Assignee: Siliconix incorporated, Santa Clara, Calif.

[21] Appl. No.: 649,747

[22] Filed: May 15, 1996

[51] Int. Cl.$^6$ ............................................. H03K 17/687
[52] U.S. Cl. .................... 307/130; 327/534; 327/565; 327/566; 327/536; 327/537
[58] Field of Search ..................... 307/130, 116; 327/389, 434, 534, 565, 566, 536, 537; 257/58, 341, 401; 326/68, 97, 98, 114; 437/913

[56] References Cited

U.S. PATENT DOCUMENTS

| | | | |
|---|---|---|---|
| 4,942,440 | 7/1990 | Baliga et al. | 357/23.1 |
| 5,287,024 | 2/1994 | Wadsworth | 327/427 |
| 5,420,451 | 5/1995 | Williams et al. | 257/402 |
| 5,448,198 | 9/1995 | Toyoshima et al. | 327/530 |
| 5,461,338 | 10/1995 | Hirayama et al. | 327/534 |

*Primary Examiner*—William M. Shoop, Jr.
*Assistant Examiner*—Albert W. Paladini
*Attorney, Agent, or Firm*—Skjerven, Morrill, MacPherson, Franklin & Friel; David E. Steuber

[57] ABSTRACT

The threshold voltage and on-resistance of a four-terminal power MOSFET switch are reduced by partially forward-biasing (to, for example, 0.5 V) the junction between the body and electrical source of the MOSFET. Preferably, as the MOSFET is switched on and off to control the current to a load, the body is switched synchronously with the gate so that the source-body junction is partially forward-biased (i.e., biased at a level that is insufficient to cause a forward current to flow through the junction) when the MOSFET switch is turned on and the body is shorted to the source when the MOSFET switch is turned off, thereby reducing the leakage current through the MOSFET in its off state. The body bias may be derived directly from the gate voltage or from a separate voltage supply line. A current-limiting device and a voltage clamp may be used to limit the body current and voltage, respectively.

28 Claims, 47 Drawing Sheets

$R = \dfrac{V_{ce}(sat)}{I}$

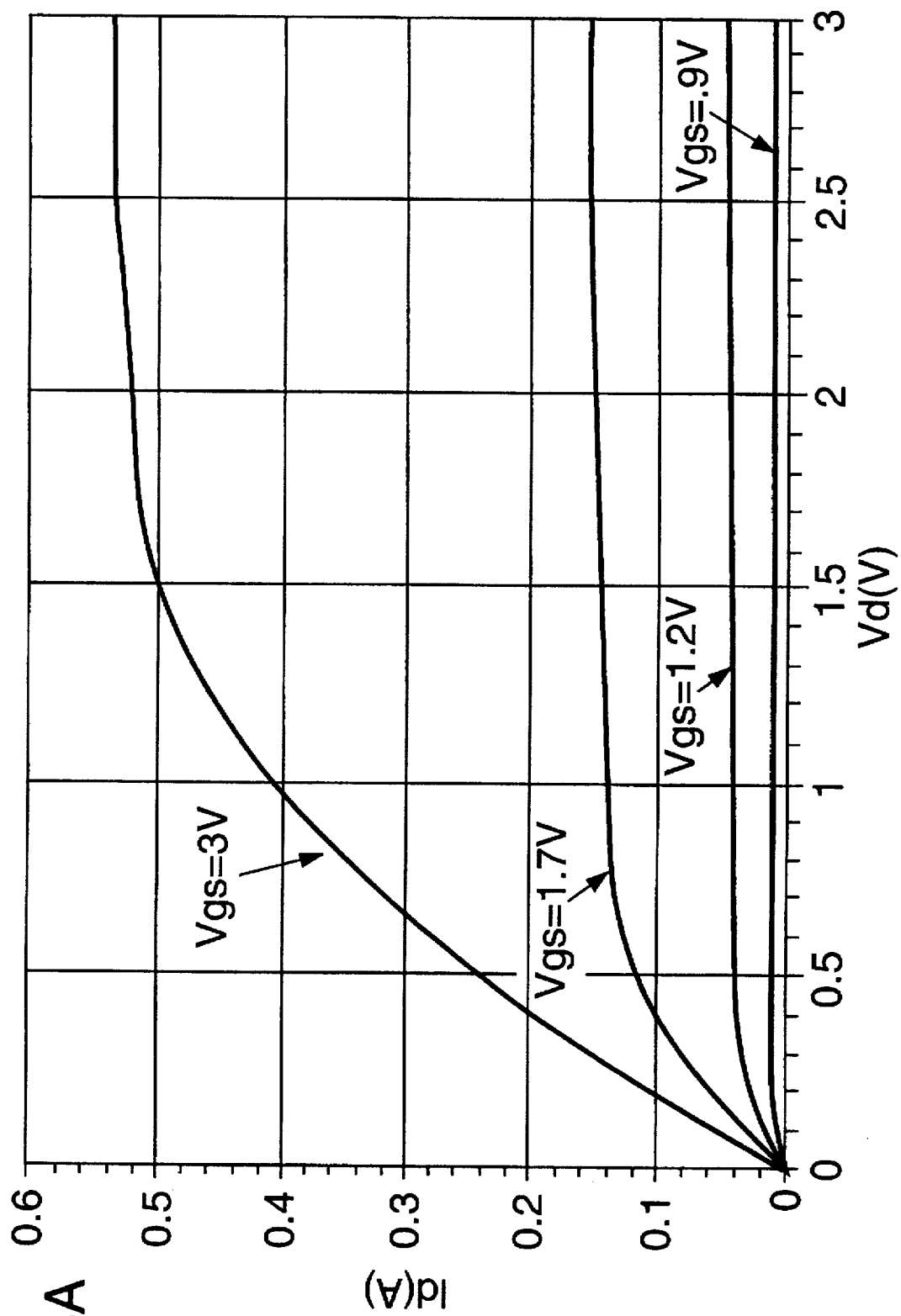

FIG. 8 $Q_{vtx}(0.7, 1 \cdot 10^{16}, 400 \cdot A) = 2.802 \cdot 10^{11}$

CURRENT LIMITER

GATE CURRENT LIMITER

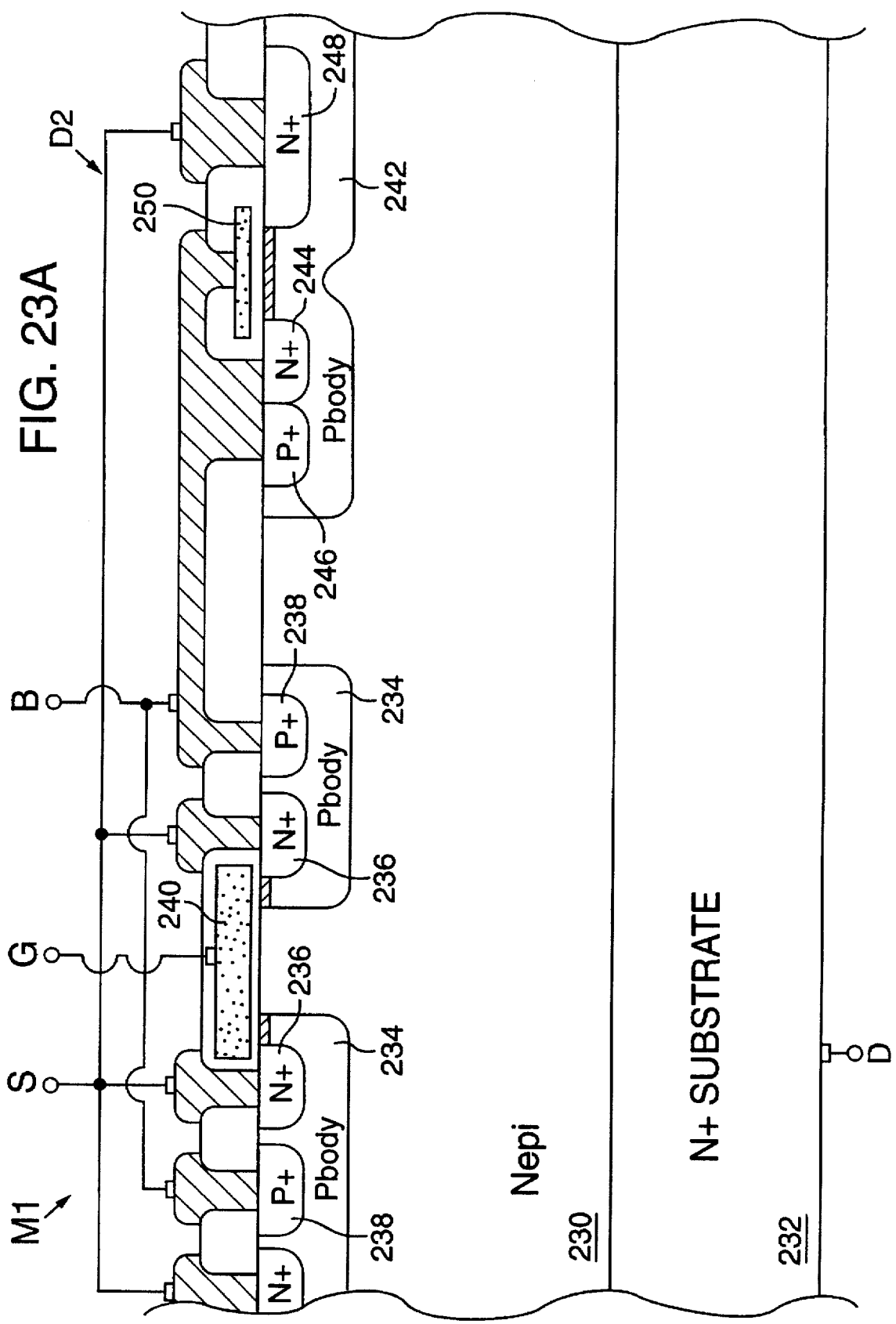

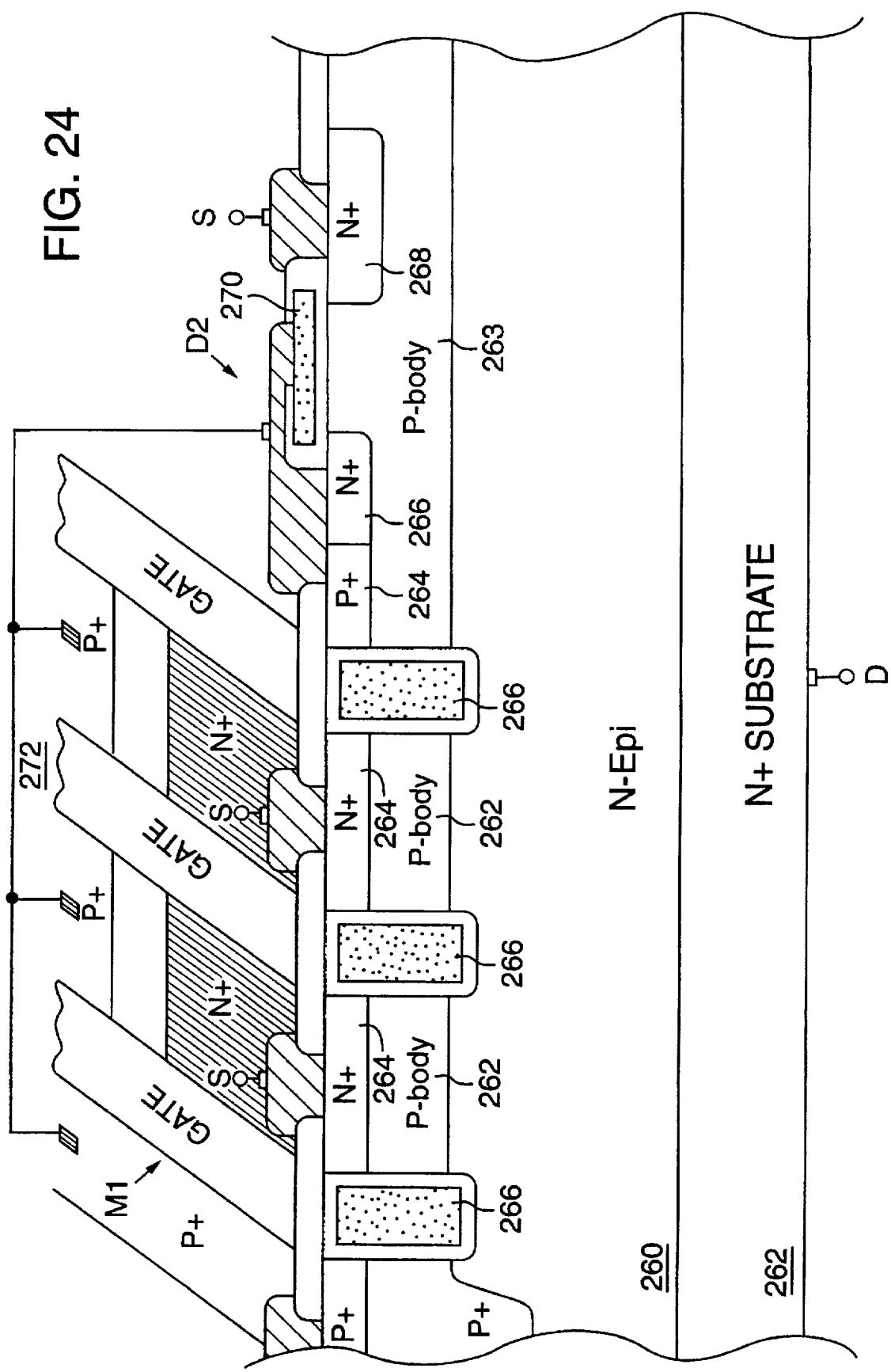

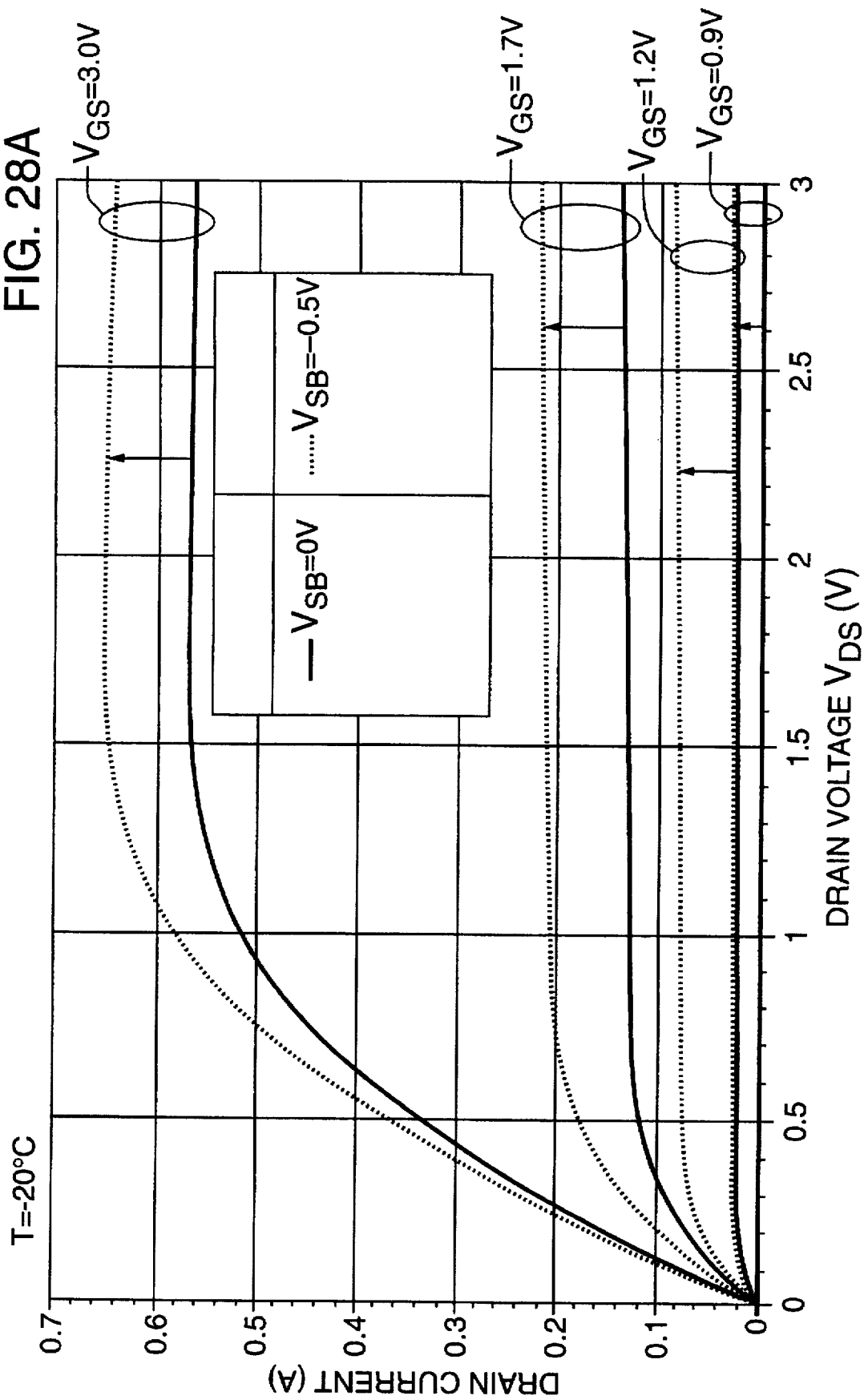

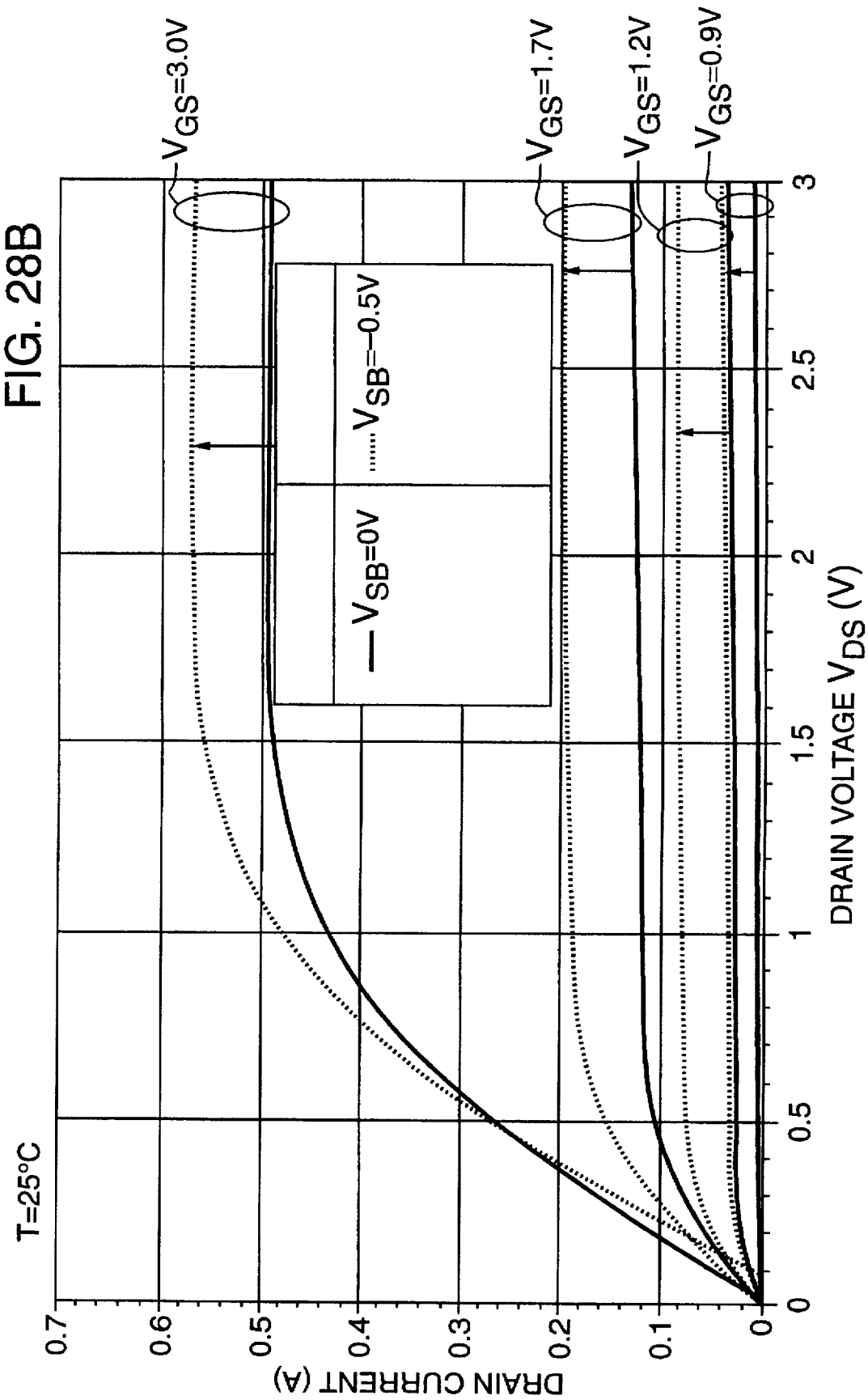

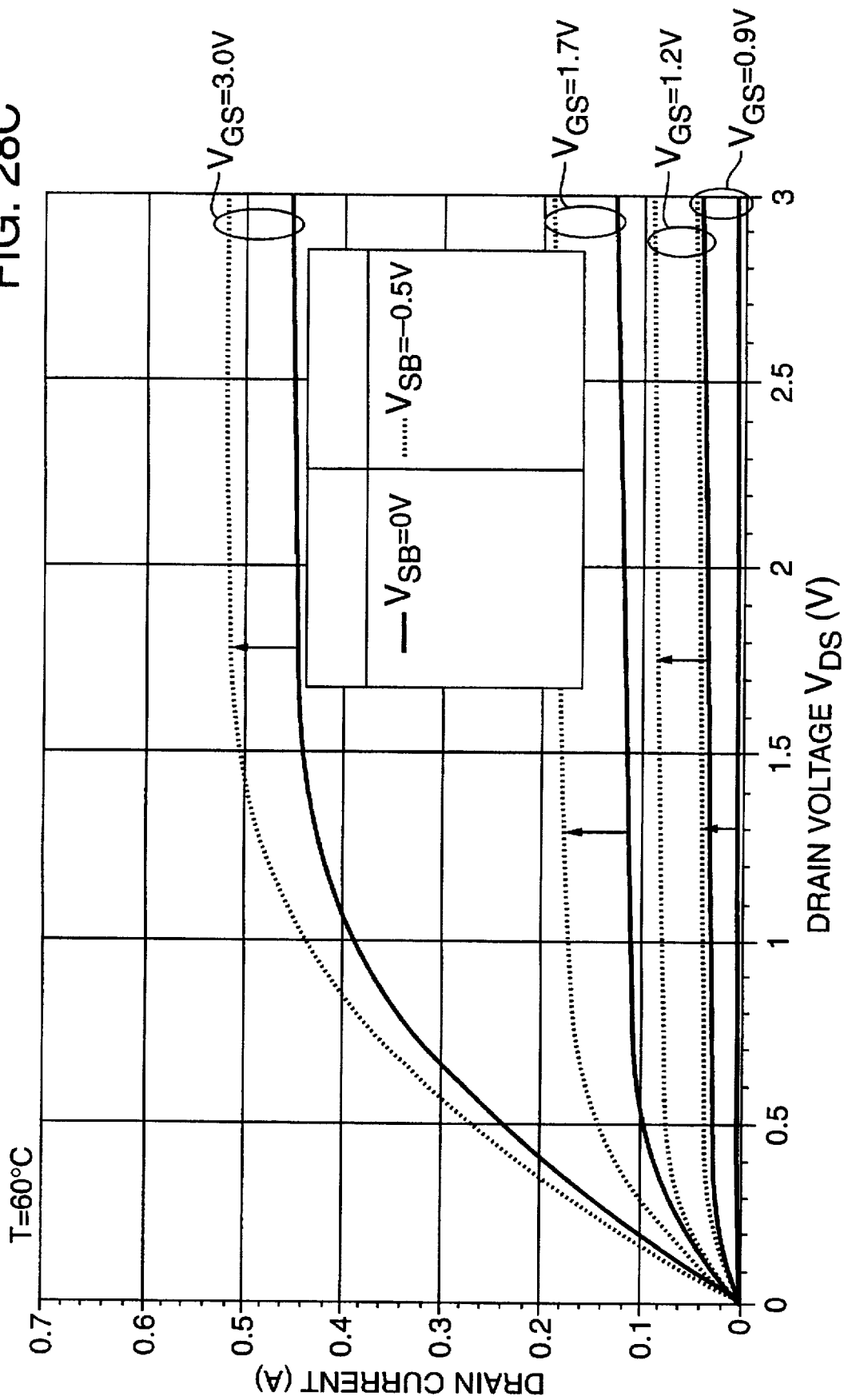

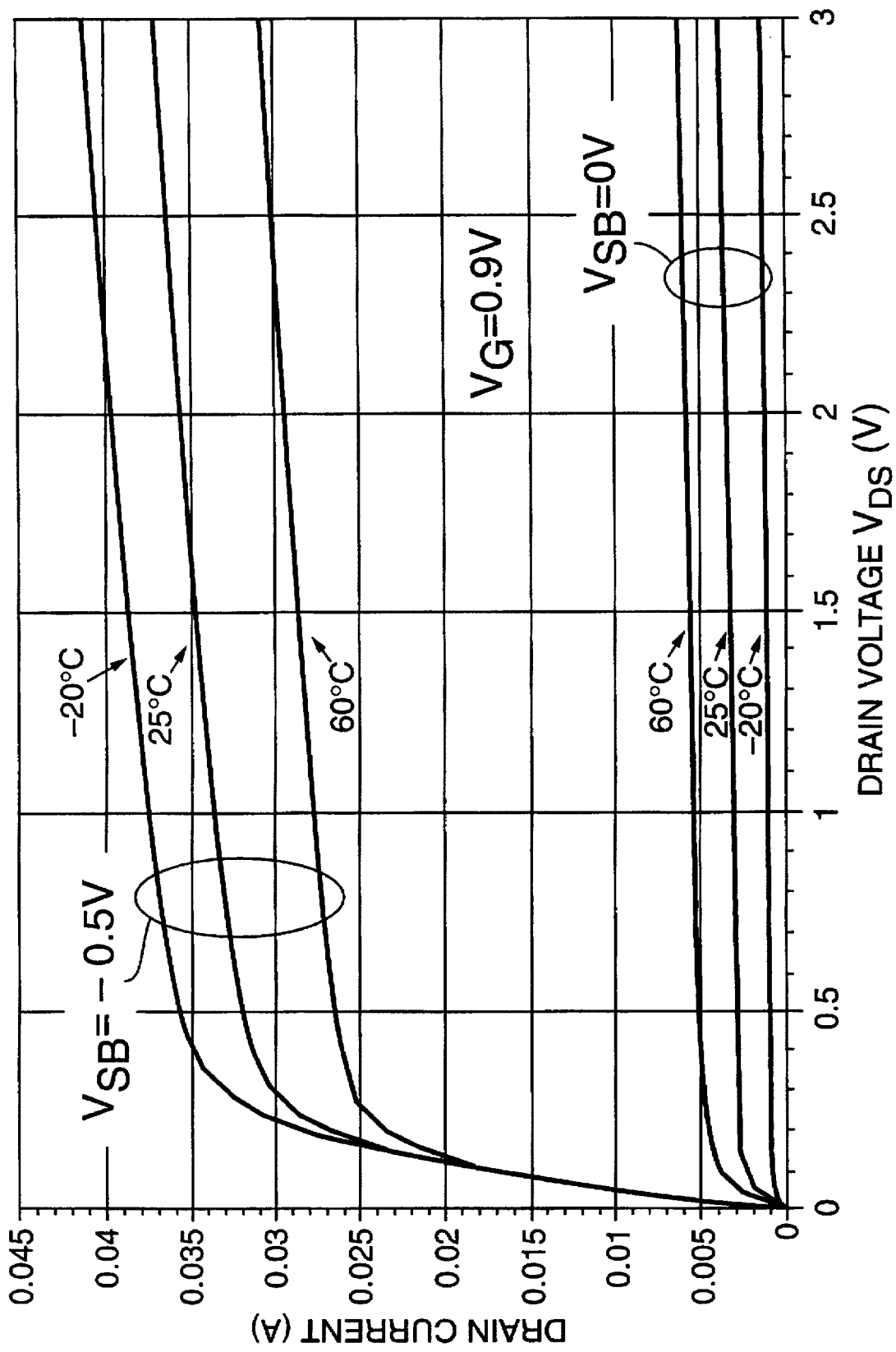

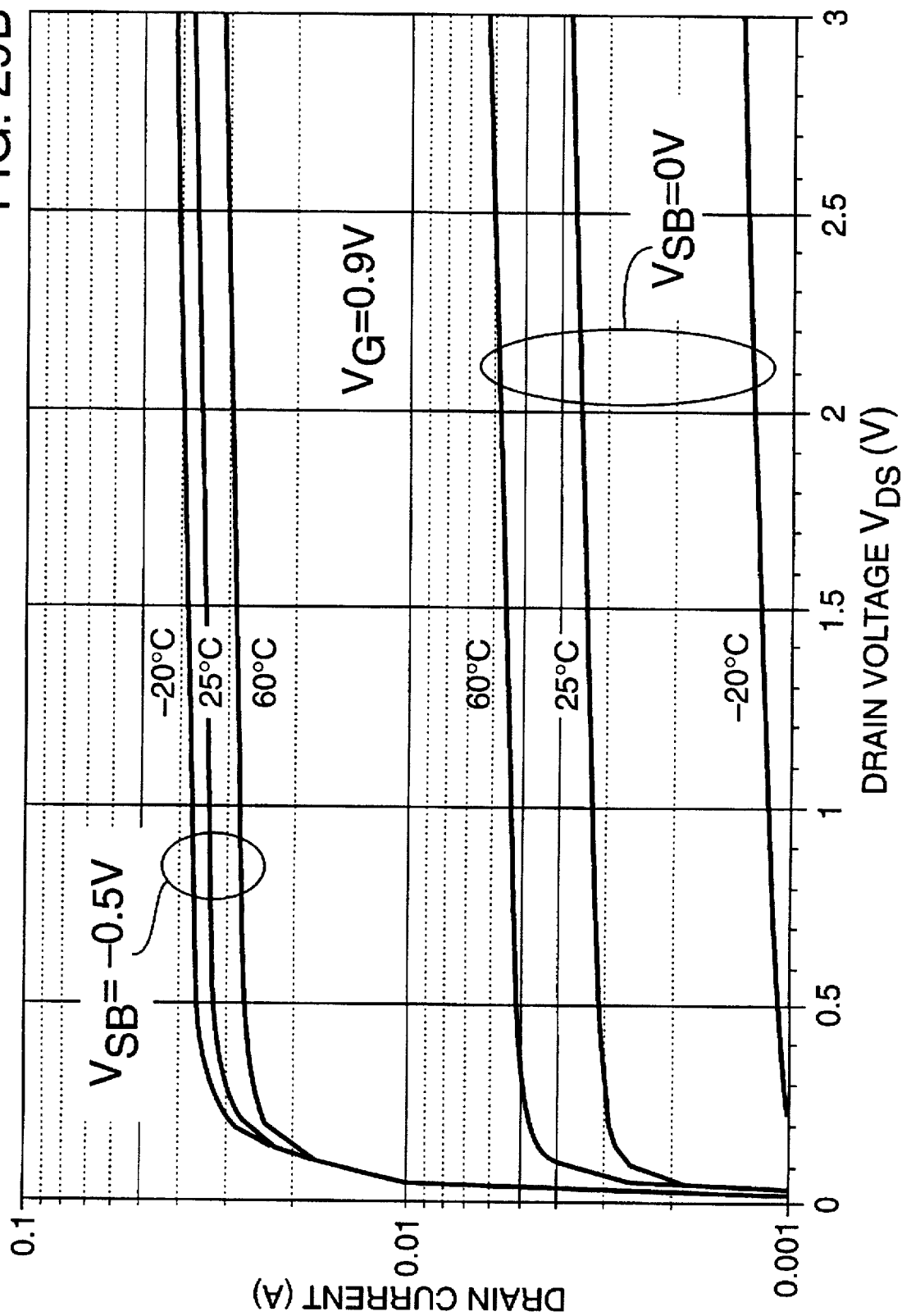

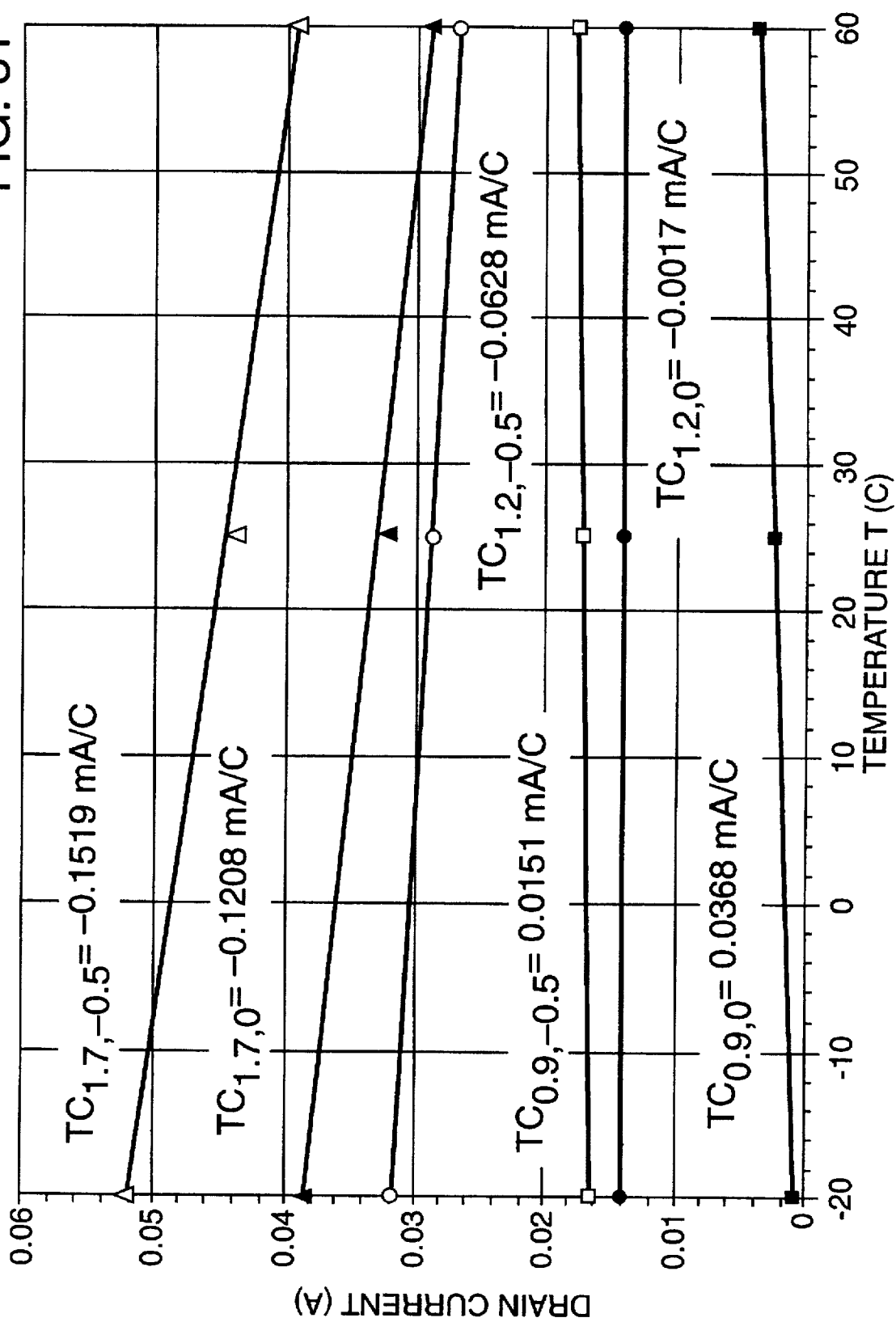

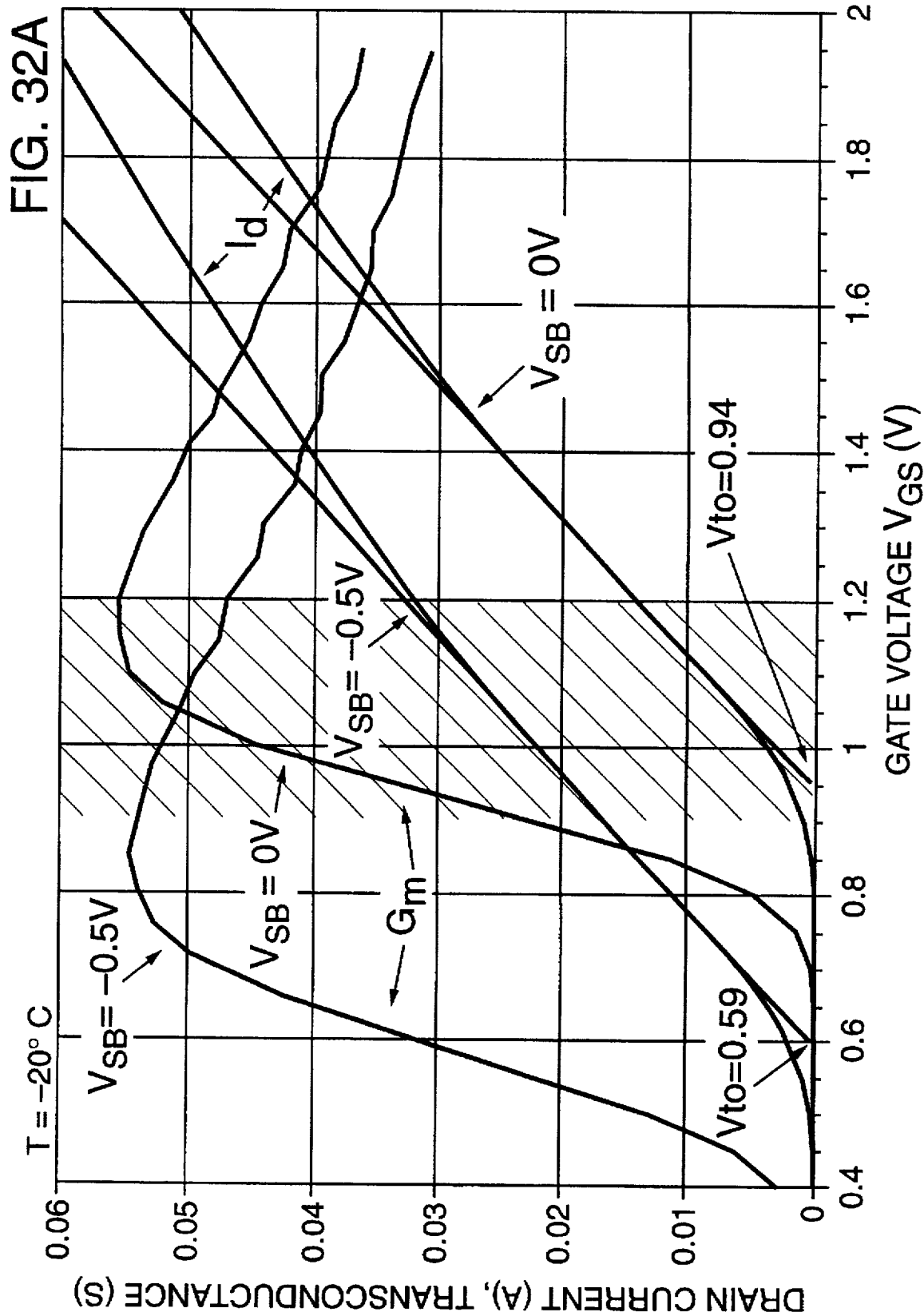

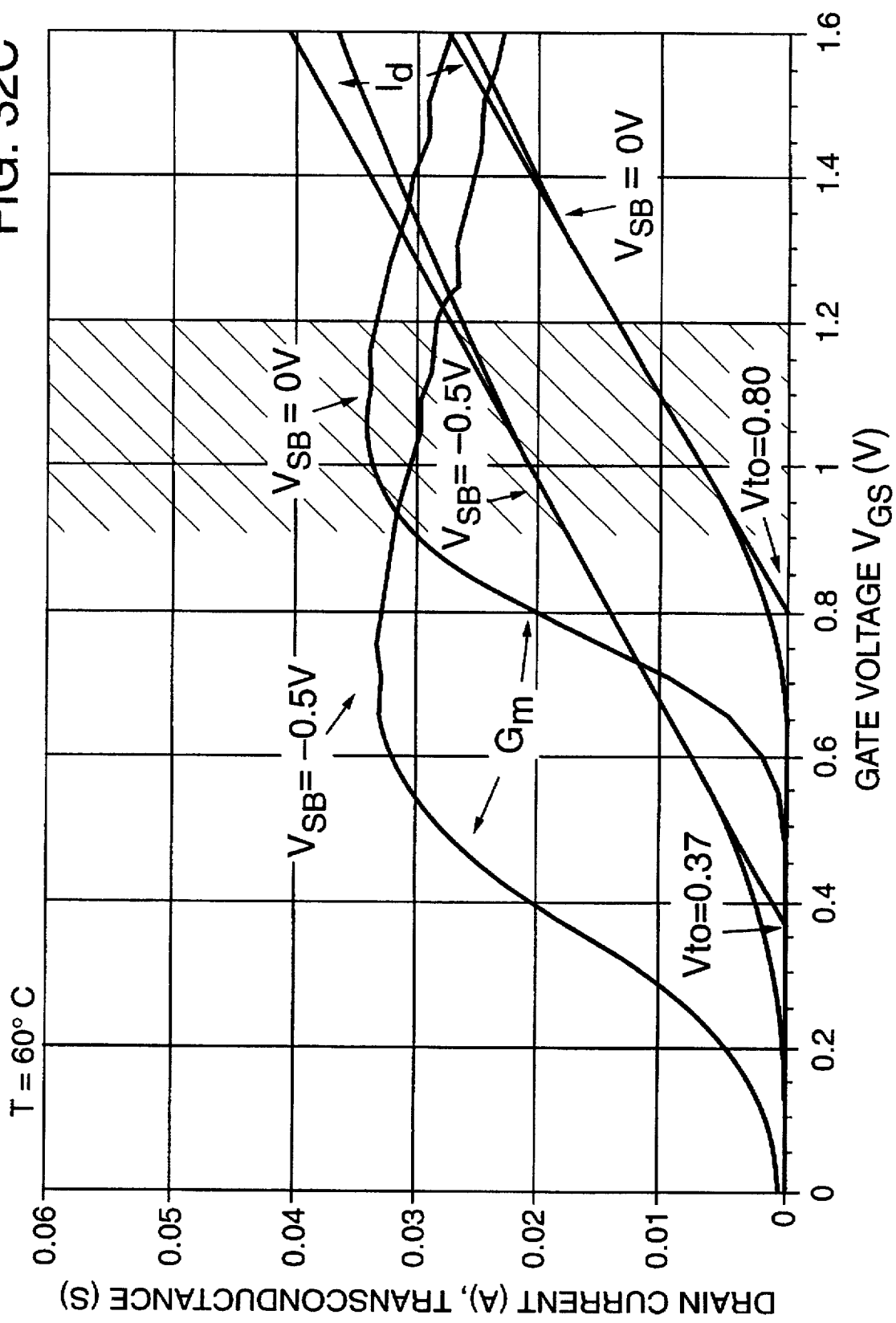

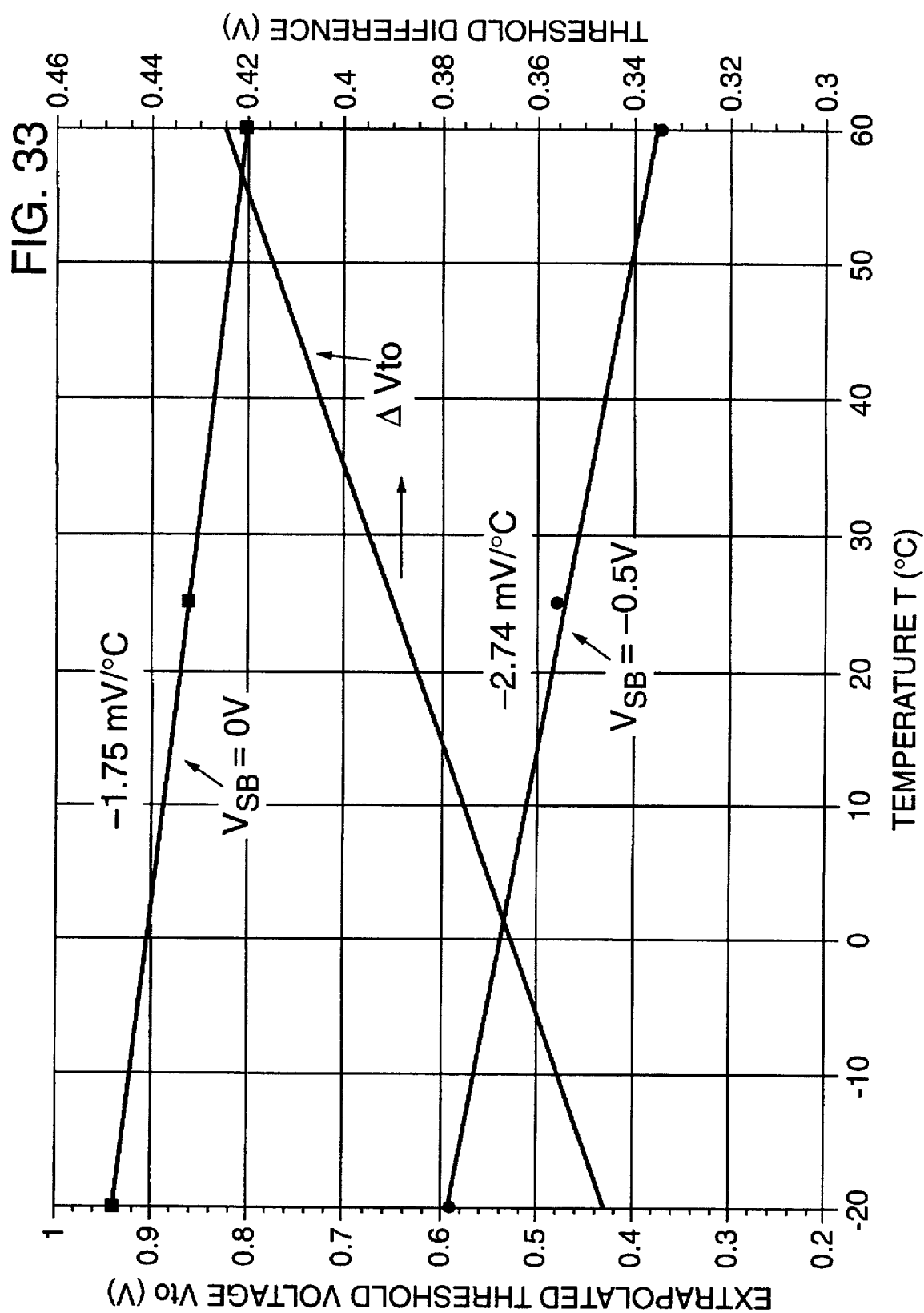

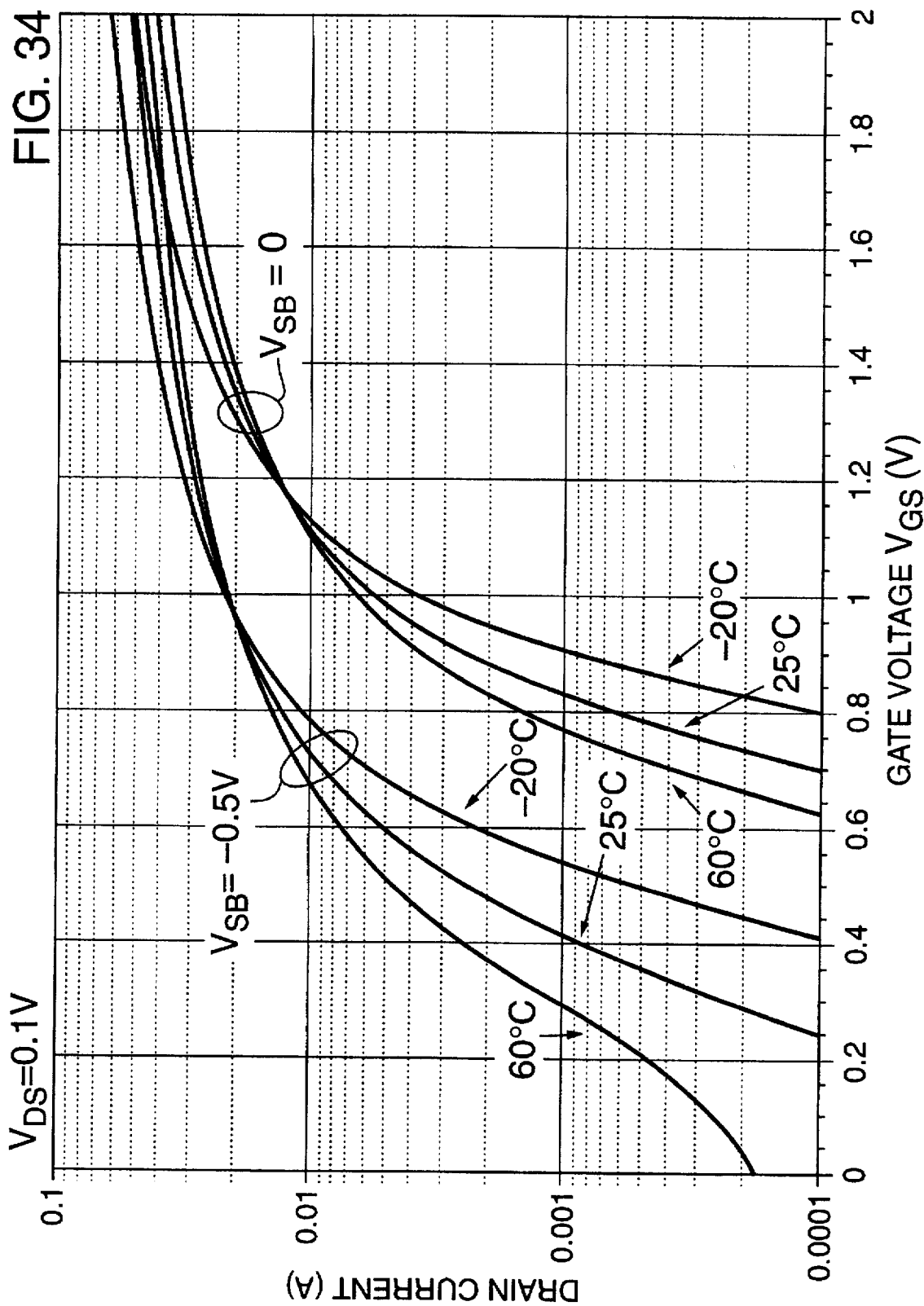

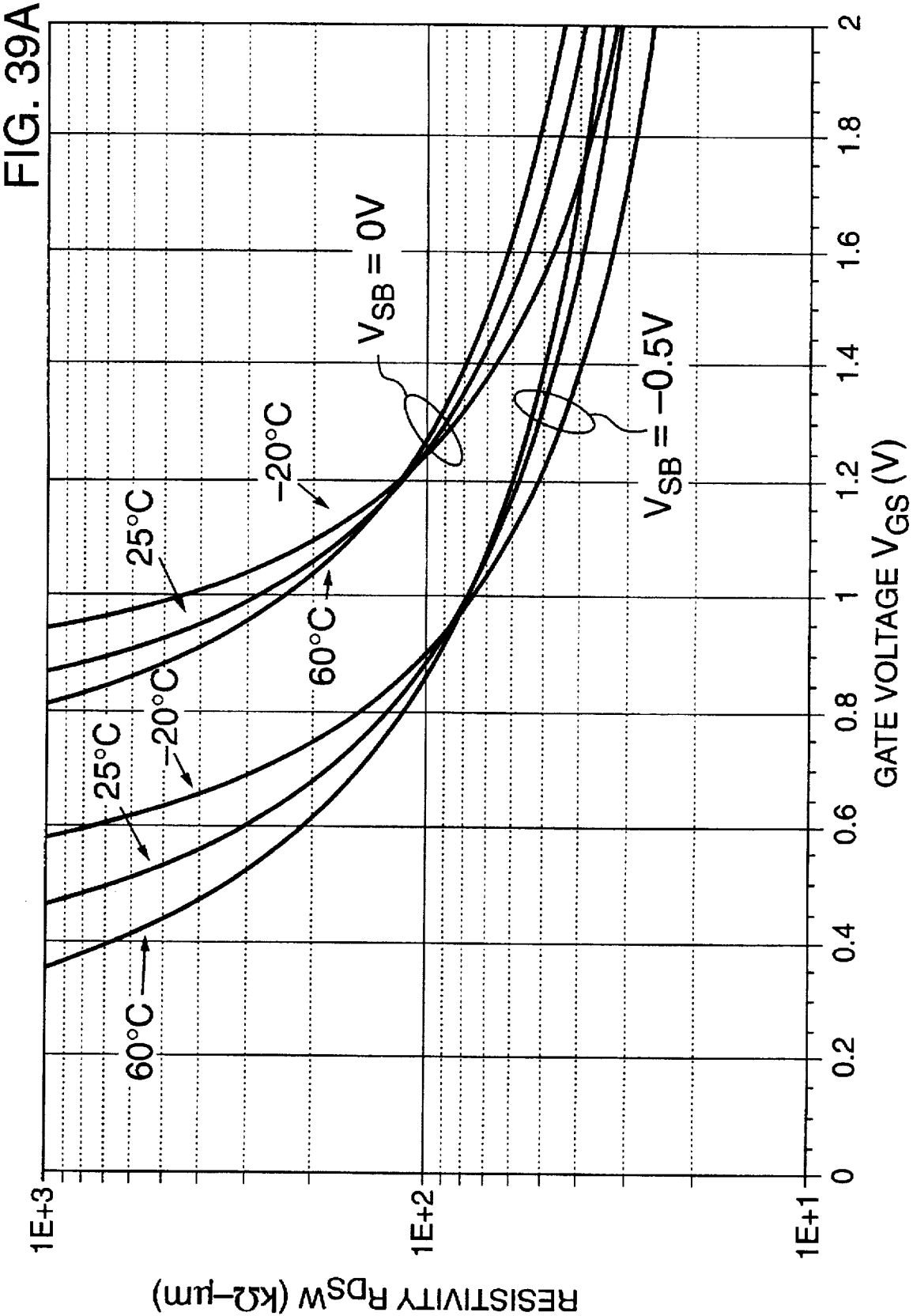

FOUR-TERMINAL POWER MOSFET SWITCH HAVING REDUCED THRESHOLD VOLTAGE AND ON-RESISTANCE

CROSS REFERENCE TO RELATED APPLICATIONS

This application is related to Application Ser. No. 08/648,334 filed on May 15, 1996 and Application Ser. No. 08/648,226 filed on May 13, 1996 each of which is incorporated herein by reference in its entirety.

FIELD OF THE INVENTION

This invention relates to MOSFET switches and in particular to a MOSFET switch which is suitable for use in low-voltage circuit.

BACKGROUND OF THE INVENTION

Until now the use of MOSFET switches at low operating voltages has been restricted to devices which have relatively low power requirements, such as watches, calculators, portable radios and beepers. In the low-voltage regime, MOSFET switches have not been used generally for devices which consume larger amounts of power, such as notebook and sub-notebook computers, cellular and microcellular phones, PDAs, and full-feature pagers.

Semiconductor electronics circuits typically include various types of components as well as one or more power switch elements. The switch elements must be capable of controlling loads such as motors, disconnecting or routing power from batteries, or acting as a synchronous rectifier or chopper in DC/DC power converters. The function of a power semiconductor switch in its "on" state is to conduct a high current (thereby delivering large amounts of power to a load) and/or to provide a low on-resistance (thereby minimizing the voltage drop and consequent power loss inserted into the circuit). At low operating voltages, the switch must meet at least two criteria: (i) a low voltage drop (or equivalent low resistance) across its terminals, and (ii) a capability of turning on fully at the lowest anticipated supply voltage. Ideally, a third criterion should also be satisfied, namely, that the switch should consume minimal amounts of power from the input drive circuit.

The two leading contenders for such a device are bipolar junction transistors (BJTs) and metal-oxide-silicon field-effect transistors (MOSFETs).

At low supply voltages, BJTs exhibit deficiencies that are associated with both their input and output characteristics. With a nominal input voltage of 0.7 V, it is possible to drive the base of a BJT at room temperature from a 0.9 V battery. With falling temperatures, however, the turn-on voltage of the BJT increases at a rate of 2.2 mV/° C. Thus at −50° C. the turn-on $V_{be}$ has increased to about 0.865 V, which is too high for use with a 0.9 V supply voltage.

While a BJT can conduct large currents at fairly low $V_{ce}$ drops, two additional problems are encountered. First, to exhibit a low power loss the BJT must be saturated, i.e. both its base-to-emitter and base-to-collector junctions must be forward-biased (meaning that in an NPN device its base voltage must be higher than both its emitter and collector voltages). To conduct a significant current in saturation, the base current must represent a significant fraction of the collector current, typically 10%–20%. This results in a substantial loss of power in the base drive and is inconsistent with the efficiencies and use-lifetimes demanded in battery-powered instruments.

Second, and more important, the output characteristics of a saturated BJT are equivalent to a voltage source and a resistor connected in series, both of which vary as a function of the base drive current. Deep in saturation the voltage source represents a 200 mV offset voltage, and at larger base currents the offset voltage increases. As shown in FIG. 1A, when the BJT operates as a switch, the voltage drop across the device increases as a function of both the collector current and the base current. The value FB in FIG. 1A refers to the "forced beta", or Ic/Ib. For slight increments of $V_{ce}$ above 0.2 V, the current increases substantially and the effective resistance ($V_{ce}/I_c$) drops precipitously (see FIG. 1B). At or below 0.2 V the device exhibits an extremely high resistance (approaching that of an open circuit) despite the large base drive.

FIG. 2 indicates that increasing the area of the BJT lowers the resistance of the device, but the offset voltage remains fixed at about 0.2 V. It is apparent, then, that switch-mode operation at a supply voltage of less than 200 mV is not possible with a BJT.

FIGS. 3A and 3B show that MOSFETs do not suffer from the series voltage problem, since all of the $I_d/V_{ds}$ curves originate at the origin. The vertical axis in FIG. 3A represents $I_d$ and the vertical axis in FIG. 3B represents log $I_d$. Both sets of curves show that $I_d$ increases in proportion to $V_{ds}$ until the device saturates (hence the name "linear" region). The reciprocal of the slope of the $I_d/V_{ds}$ curves in the linear region is the on-resistance $R_{ds}$ (on), which is constant and essentially independent of $I_d$ for a given gate drive. This contrasts with the $R=V_{ce}(sat)/I_c$ of a BJT, which as shown in FIG. 1B varies rapidly with changing $V_{ce}$.

The main problem with a MOSFET is that the gate voltage required to turn it on, referred to as the threshold voltage $V_t$, is more difficult to control in manufacturing than the turn-on voltage of a BJT. $V_t$ variations of ±150 mV around a nominal value are common. The result is that the value of $R_{ds}$(on) is extremely difficult to predict. This is shown in FIG. 4, which shows a plot of on-resistance (normalized to the on-resistance of a typical MOSFET having a $V_t$ of 0.8 V with its gate biased at a $V_{gs}$ of 1.2 V) as a function of the gate drive $V_{gs}$. Curve P1 represents a nominal device operating at a temperature of 25° C. As indicated, the resistance at a $V_{gs}$ of 0.9 V is about 2.5 times the resistance at a $V_{gs}$ of 1.2 V. Curve P2 represents a device (again operating at 25° C.) which, owing to manufacturing variations, has a $V_t$ which is 150 mV higher. The normalized resistance of this device is 1.5 at a $V_{gs}$ of 1.2 V and 10 at a $V_{gs}$ of 0.9 V. Finally, curve P3 represents the second device operating at −55° C. With this high $V_t$, process $V_t$ shifts at a rate of 3 mV/° C. As shown, the resistance at a $V_{gs}$ of 1.2 V is 3.4, and at a $V_{gs}$ of 0.9 V is off the graph.

FIGS. 5A, 5B and 6 illustrate further the comparative performance of BJTs and MOSFETs. FIGS. 5A and 5B illustrate circuit diagrams showing power semiconductor switches in a bridge configuration, where a push-pull output stage is used to connect each terminal of a load such as a motor. In FIG. 5A the switches are BJTs; in FIG. 5B the switches are MOSFETs. To energize the load two diagonal switches are driven simultaneously on to conduct current in a given direction. The current flow can be reversed by turning those switches off and turning the other diagonal pair of switches on. The voltage applied to the load can be considered AC with its peak-to-peak swing being twice the supply voltage (ignoring the voltage drops across the switches).

Unfortunately, as shown in FIG. 6, the voltage drops across the switches cannot be ignored. FIG. 6 shows a comparative graph of load current as a function of load resistance for circuits shown in FIGS. 5A and 5B. In the circuit of FIG. 5A, the BJTs are assumed to have a 0.25 V drop with no incremental resistance; in the circuit of FIG. 5B, the MOSFETs are assumed to have a resistance of 300 mΩ. The current for the BJTs at supply voltages of 0.9 V and 1.2 V is represented by curves P1 and P2, respectively; the current for the MOSFETs at the same supply voltages is represented by curves P3 and P4, respectively.

At very low load resistances, most of the supply voltage falls across the switches so that the influence of the $V_{ce}(sat)$ voltages of the BJTs is small. At a supply voltage of 0.9 V and a load resistance of 1 Ω, the $V_{ce}(sat)$ drop of 0.5 V (2×0.25 V) in the BJTs leaves a drop of 0.4 V across the load, resulting in a current of 400 mA. In the case of the MOSFET switches, the full 0.9 V is applied to the load, resulting in a current of 570 mA, or an increase of 50% as compared with the current through the BJTs. For a 40 Ω load, the resistance of the switches is virtually negligible. While the MOSFET circuit (FIG. 5B) conducts 22 mA (0.9 V/40 Ω), the BJTs (FIG. 5A) can deliver only 10 mA ((0.9 V−0.5 V)/40 Ω), or less than half that of the MOSFET bridge. Note, moreover, that this comparison is unfairly weighted toward the BJT version since it would take an unreasonably large BJT to eliminate its incremental resistance.

FIG. 6 makes it clear that in low voltage situations the performance of MOSFET switches is far superior to the performance of BJT switches. In the past, the on-resistance of power MOSFETs has been reduced by shortening the channel length, optimizing the drain doping concentration, packing more cells or gate perimeter into a given area, and lowering the threshold voltage. Once all of these techniques have been employed to achieve a minimal on-resistance for a given breakdown resistance and gate oxide thickness, practically the only technique that remains available to improve the on-resistance at low levels of $V_{gs}$ is to further reduce the threshold voltage. However, as described above, process variability makes the fabrication of reproducible, extremely low $V_t$ devices difficult. Also, MOSFET devices with extremely low threshold voltages are subject to increased channel leakage at process and temperature extremes. Thus, what is needed is a power MOSFET switch with a low on-resistance and a low threshold voltage with minimal sensitivity to process and temperature variations.

SUMMARY OF THE INVENTION

The power MOSFET switch of this invention has a low on-resistance under "starved" gate drive conditions (e.g., a supply voltage in the range of 0.8 V–3.0 V) and has minimal sensitivity to process variations. The MOSFET is a four-terminal MOSFET, with the source, drain, body and gate having separate terminals. The body and gate terminals are driven synchronously such that the body is partially forward-biased with respect to the electrical source when the gate is driven so as to turn the MOSFET on, i.e., the forward-bias is at a level (e.g., 0.5 V) that is not sufficient to cause a significant forward current to flow through the PN junction between the body and electrical source. When the power MOSFET is turned off, the body is preferably shorted to the electrical source so as to minimize the leakage current in the off state. (In an N-channel device the "electrical source" is the more negative of the source/drain terminals; in a P-channel device the "electrical source" is the more positive of the source/drain terminals).

As a result of the so-called "body effect", forward-biasing the source-body junction of the device lowers its threshold voltage in absolute terms (i.e., in an N-channel device the threshold voltage becomes less positive; in a P-channel device the threshold voltage becomes less negative). The source-body junction can be forward-biased by using a clamped or unclamped body bias voltage supplied by the gate, through a resistor or current source. Alternatively, the body bias can be generated by a separate body bias buffer with or without a means of limiting the maximum body bias when the MOSFET is turned on.

The body effect in the MOSFET is enhanced by overdoping the body (which may be in an epitaxial layer or a well) and by introducing a shallow threshold adjust implant in the channel or the gate oxide layer to reduce the threshold voltage (absolute value) of the MOSFET.

The MOSFET of this invention may be lateral or double-diffused (lateral, quasi-lateral or vertical), and it may be planar or trench-gated.

BRIEF DESCRIPTION OF THE DRAWINGS

FIGS. 3A and 3B illustrate graphs showing the I–V characteristics of a MOSFET.

FIGS. 11A–11C illustrate timing diagrams showing, in particular, the behavior of the body voltage and the threshold voltage as a MOSFET in accordance with this invention is switched from off to on.

FIG. 23A illustrates a cross-sectional view of a vertical double-diffused MOSFET in accordance with this invention.

FIG. 24 illustrates a cross-sectional view of a vertical trench-gated MOSFET in accordance with this invention.

FIGS. 28A–28C illustrate graphs showing drain current as a function of gate voltage in conventional and body-biased MOSFETs at temperatures of −20° C., 25° C. and 60° C., respectively.

FIGS. 29A and 29B illustrate graphs showing drain current as a function of drain voltage in conventional and body-biased MOSFETs at temperatures of −20° C., 25° C. and 60° C., respectively, and at a gate voltage of 0.9 V.

FIG. 31 illustrates a graph showing drain current as a function of temperature at various levels of gate drive and body bias.

FIGS. 32A–32C illustrate graphs showing drain current and transconductance as a function of gate voltage for conventional and body-biased MOSFETs at temperatures of −20° C., 25° C. and 60° C., respectively.

FIG. 33 illustrates a graph showing the extrapolated threshold voltage as a function of temperature for conventional and body-biased MOSFETs as well as the difference between the extrapolated threshold voltages for the two types of devices.

FIG. 34 illustrates a graph showing the subthreshold drain current as a function of gate voltage for conventional and body-biased MOSFETs at temperatures of −20° C., 25° C. and 60° C., respectively, at a drain voltage of 0.1 V.

FIG. 39A illustrates a graph showing the resistivity of conventional and body-biased MOSFETs as a function of gate voltage at temperatures of −20° C., 25° C. and 60° C.

DESCRIPTION OF THE INVENTION

This invention uses an intentionally forward-biased body-source junction to produce a power MOSFET which has a low threshold voltage (absolute value) and which therefore can be used at very low operating voltages. A primary objective of forward-biasing the source-body junction is to reduce the on-resistance of the power MOSFET when it is used as a switch element, not to alter the small signal transconductance of the device.

Figure 7:
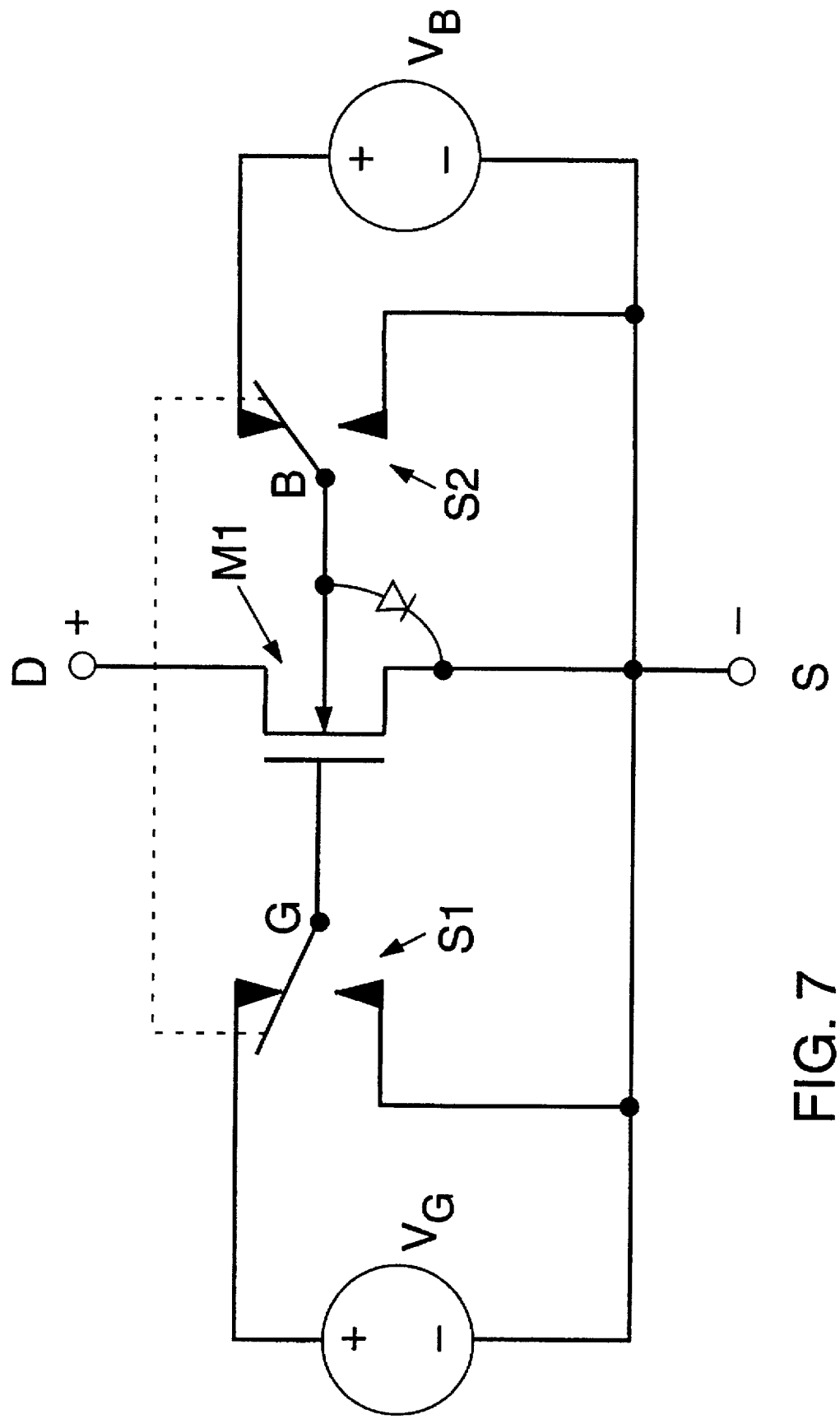
FIG. 7 illustrates a basis circuit diagram of a MOSFET constructed in accordance with this invention.

The basic principle of this invention is illustrated in FIG. 7. MOSFET M1 has a drain terminal D, a source terminal S, a gate terminal G, and a body terminal B. Since MOSFET M1 is an N-channel MOSFET, the drain terminal D is biased positively with respect to the source terminal S. Single-pole, double-throw switches S1 and S2 are ganged together such that when MOSFET M1 is turned on by biasing the gate terminal G to a positive voltage $V_G$, the body terminal B is biased positively by a voltage $V_B$ with respect to the source terminal S. Since MOSFET M1 is an N-channel MOSFET, its body includes P-type material while its source includes N-type material. Therefore biasing the body terminal B positively with respect to the source terminal S forward-biases the junction between the body and source of MOSFET M1. The magnitude of the body bias voltage $V_B$ can vary, but ideally $V_B$ should result in minimal minority carrier injection. In practice, at room temperature this limits $V_B$ to voltages under 0.7 V. Forward-biasing the source-body junction of MOSFET M1 in this way lowers the threshold voltage $V_t$ of MOSFET M1.

Thus the act of turning on MOSFET M1 automatically reduces the threshold voltage of MOSFET M1, which by definition is the minimum voltage at which the MOSFET can be turned on. In this way, $V_G$ can be reduced to a level below that which would be required if the source body junction of MOSFET M1 were not forward-biased. Assuming that $V_G$ is the supply voltage that is available in the circuitry in which MOSFET M1 is connected, this in effect means that MOSFET M1 can be used with lower supply voltages. Moreover, the on-resistance of MOSFET M1 will be lower at a given level of $V_G$. The body bias supply $V_B$ will typically be less than $V_G$ since $V_B$ should be limited to 0.7 V and $V_G$ is always set at the maximum available gate drive. In principle, then, $V_B$ can be derived from the same source as $V_G$, but it may also be derived from an independent source.

To turn MOSFET M1 off, switches S1 and S2 are thrown so as to connect the gate terminal G and the body terminal B to the source terminal. This removes the gate drive voltage $V_G$ and simultaneously increases the threshold voltage of MOSFET M1 by removing the body bias voltage $V_B$. Alternatively, MOSFET M1 can be turned off by reversing the polarity of the gate voltage, but normally it is more convenient to reduce the gate-to-source voltage $V_{GS}$ to zero.

The following equation expresses the threshold voltage $V_t$ of MOSFET M1 as a function of the source-to-body voltage $V_{SB}$:

$$V_t(V_{SB}) = V_{to} + \gamma \{ \sqrt{\psi_B + V_{SB}} - \sqrt{\psi_B} \} \quad (1)$$

where $V_{to}$ is the extrapolated threshold voltage (i.e., the voltage where the MOSFET current extrapolates to zero), $\gamma$ is the body effect factor ($V^{-1/2}$), and $\Psi_B$ is the bulk voltage (i.e., the voltage needed to bend the energy bands in the silicon body region, often assumed to be twice the Fermi potential $$2\phi_f = 2\frac{kT}{q} \ln \frac{N_B}{n_i} \quad (2)$$

but actually somewhat larger in a strong inversion (typically 0.65–0.8 V).

According to Tsividis, The MOS Transistor,McGraw-Hill, New York (1987), the bulk voltage $\Psi_B$ in turn is defined by the following relationship:

$$\Psi_B = 2\phi_f + 6\phi_t \quad (3)$$

where $\phi_f$ is the above work function of the bulk silicon and $\phi_t$ is the thermal voltage, typically 26 mV. The work functions $\phi_f$ and $\phi_t$ are defined as follows:

$$\phi_f = \phi_t \ln \left\{ \frac{N_b}{n_i} \right\} \quad (4)$$

$$\phi_t = \frac{kT}{q} \quad (5)$$

where $N_B$ is the doping concentration of the body, $n_i$ is the intrinsic carrier density of silicon ($1.45 \times 10^{10}$ cm$^{-3}$ at room temperature) k is the Boltzmann content, T is the temperature (° K.), and q is the charge of an electron.

Figure 8:
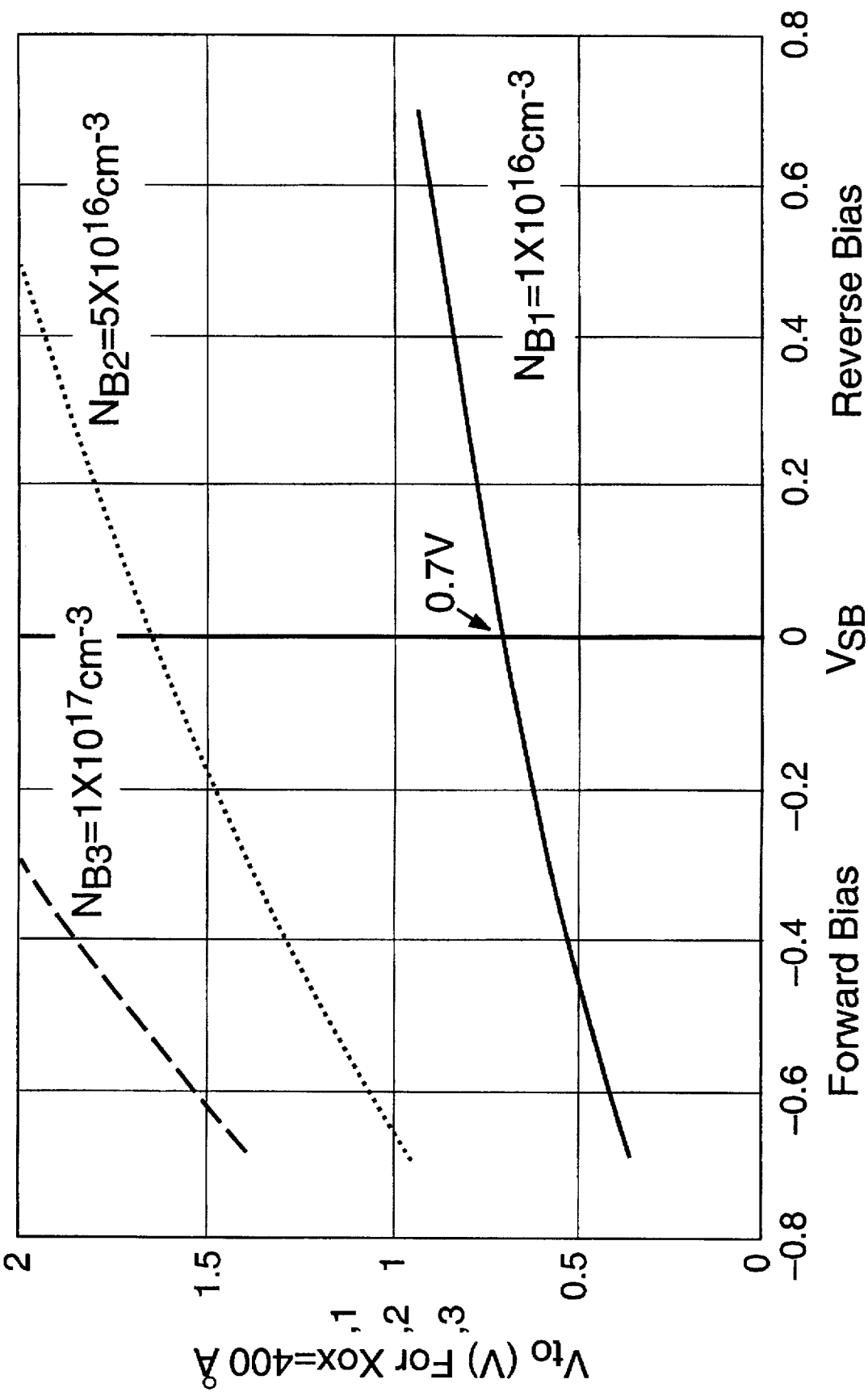
FIG. 8 illustrates a graph showing the threshold voltage of a MOSFET as a function of the source-body bias at different level of body dopant concentration.

FIG. 8 illustrates a graph showing the variation of the threshold voltage as a function of the voltage $V_{SB}$ across the source-body junction. Positive values of $V_{SB}$ indicate a reverse bias and negative values of $V_{SB}$ indicate a forward bias. The thickness of the gate oxide of the MOSFET was 400 Å. The curve designated $N_{B1}$ represents the threshold voltage with the body doped to a concentration of $1 \times 10^{16}$ cm$^{-3}$ with a threshold adjust implant of $2.8 \times 10^{11}$ cm$^{-2}$, which yields a threshold voltage $V_{to}$ of 0.7 V when $V_{SB}$ is equal to zero. The curves designated $N_{B2}$ and $N_{B3}$ represent the threshold voltage when the body concentration is increased to $5 \times 10^{16}$ cm$^{-3}$ and $1 \times 10^{17}$ cm$^{-3}$, respectively, with the other factors held constant. As indicated, the threshold voltage increases with increasing values of $V_{SB}$. FIG. 8 indicates that the threshold voltage varies only slightly with a body doping concentration of $1 \times 10^{16}$ cm$^{-3}$ while the variation increases with increasing body doping concentration. However, when the body doping concentration is increased, the value of the threshold voltage increases significantly.

The data shown in FIG. 8 can be derived mathematically by differentiating equation (1) as follows:

$$\frac{dV_t(V_{SB})}{dV_{SB}} = \frac{\gamma}{2\sqrt{\psi_B + V_{SB}}} \quad (6)$$

$$\gamma = \frac{\sqrt{2q\epsilon_{si}N_B}}{C_{ox}} = \frac{\epsilon_{ox}\sqrt{2q\epsilon_{si}N_B}}{X_{ox}} \quad (7)$$

Equations (6) and (7) indicate that increasing the body doping level $N_B$ increases the derivative $dV_t/dV_{SB}$, thereby increasing the benefits of partially forward-biasing the source-body junction.

The natural threshold voltage $V_{to}$ is given by:

$$V_{to} = V_{FB} \pm \psi_B \pm \gamma \sqrt{\psi_B} \quad (8)$$

$$= V_{FB} \pm \psi_B \pm \left( \frac{\epsilon_{ox}\sqrt{2q\epsilon_{si}N_B}}{X_{ox}} \right)\sqrt{\psi_B} \quad (9)$$

$$V_{FB} = \phi_{MS} - \frac{qQ_f}{C_{ox}} \quad (10)$$

$$Q_{vtadj} = C_{ox} ([V_{FB} \pm \psi_B \pm \gamma \sqrt{\psi_B}] - V_{to} \text{ (target)}) \quad (11)$$

This indicates that the natural threshold $V_{to}$ is also a function of the body doping concentration $N_B$. Thus equations (6) and (9) confirm the data shown in FIG. 8, namely, that the benefits of a higher body effect and greater threshold voltage shift ($dV_t/dV_{sb}$) are offset by a higher threshold voltage $V_t$.

To limit the increase in the threshold voltage which results from a high body doping concentration, a thick oxide layer or a large value of γ, the channel must be counter-doped with a shallow threshold adjust implant. The magnitude of the threshold adjust implant is given by:

$$\Delta V_t = \tag{12}$$

$$\frac{\epsilon_{ox}}{X_{ox}}\left(\left[V_{FB} \pm \psi_B \pm \left(\frac{\epsilon_{ox}\sqrt{2q\epsilon_{si}N_B}}{X_{ox}}\right)\sqrt{\psi_B}\right] - V_{to} \text{ (target)}\right)$$

$$\Delta V_t = \frac{qQ_{vtadj}}{C_{ox}} = 0.519 \text{ V} \tag{13}$$

As noted above, the curves in FIG. 8 were shifted downward by a threshold voltage adjust implant (e.g., phosphorus or arsenic at a dosage of $2.8 \times 10^{11}$ cm$^{-2}$).

Rearranging equation (11) yields:

$$\gamma = \frac{\sqrt{2q\epsilon_{si}N_b}}{C_{ox}} = \frac{\epsilon_{ox}\sqrt{2q\epsilon_{si}N_B}}{X_{ox}} \tag{14}$$

Accordingly, the device represented by curve $N_{B1}$ had a threshold of 0.7 V+0.519 V=1.219 V prior to the threshold adjust implant. While the device is represented by curves $N_{B2}$ and $N_{B3}$ were also shifted downward by 0.519 V as a result of the threshold adjust implant, the threshold voltages of these devices are still too high to be useful.

Figure 9:
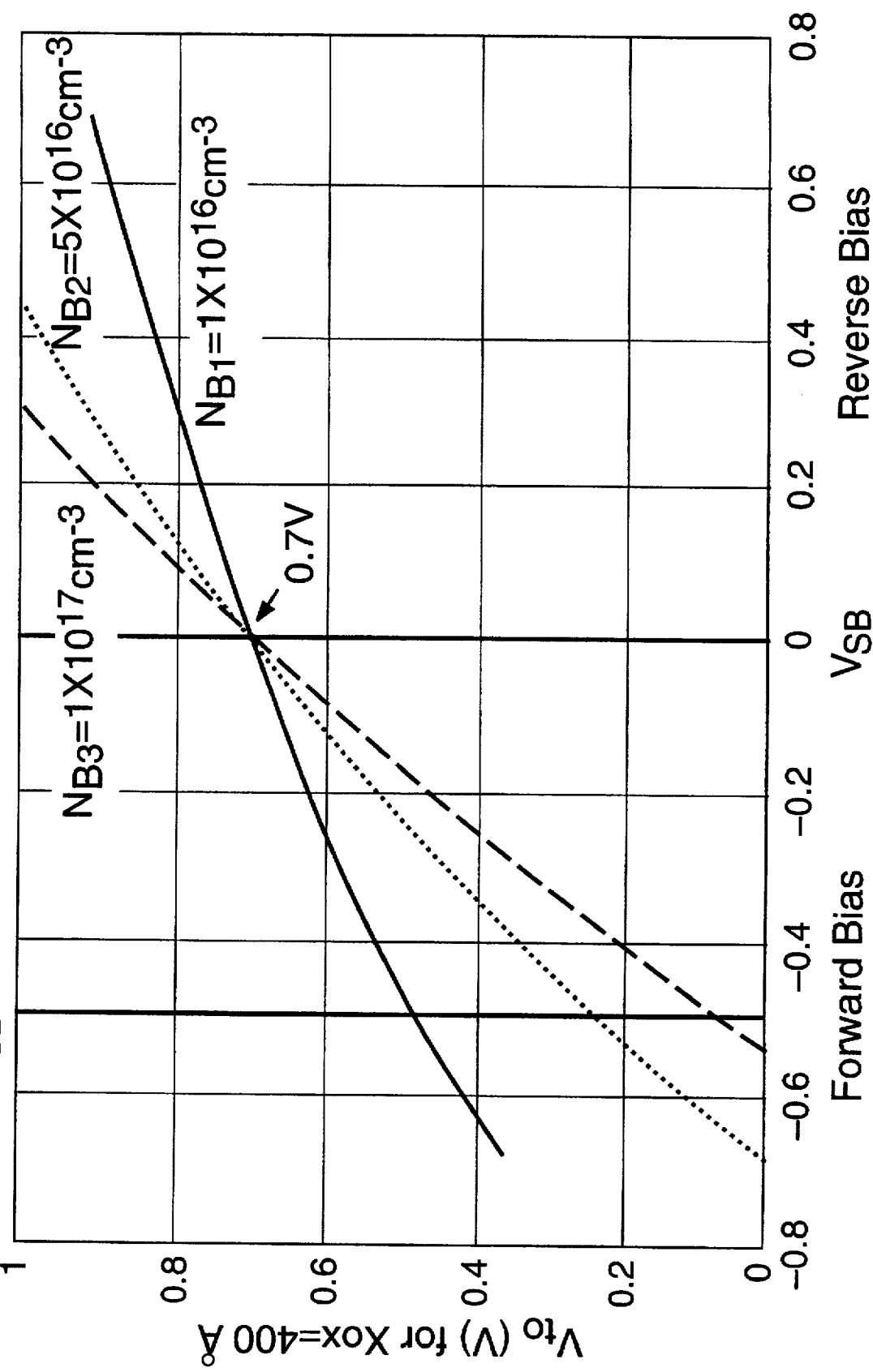
FIG. 9 illustrates a graph similar to the graph of FIG. 8 after a threshold adjust implant has been performed to reduce the threshold voltage of the MOSFET.

To compensate for the increased threshold voltage which accompanies a higher $dV_t/dV_{SB}$, the dosage of the threshold adjust implant must be increased. FIG. 9 illustrates how raising the threshold adjust implant can be used to increase $dV_t/dV_{SB}$ without increasing the threshold voltage itself. The devices represented by curves $N_{B1}$, $N_{B2}$ and $N_{B3}$ in FIG. 9 have the same body dopant concentrations and gate oxide layer thicknesses (400 Å) as the devices represented by the corresponding curves in FIG. 8. It is noteworthy that the threshold voltage for the device represented by curve $N_{B3}$ approaches zero at $V_{SB}$=−0.5 V. For the device represented by curve $N_{B1}$, the threshold voltage at $V_{SB}$=0.5 V is approximately 0.5 V. The condition at which $V_{SB}$=−0.5 V is significant because it is just below the voltage at which a significant forward current will flow through the source-body junction.

Figure 10A:
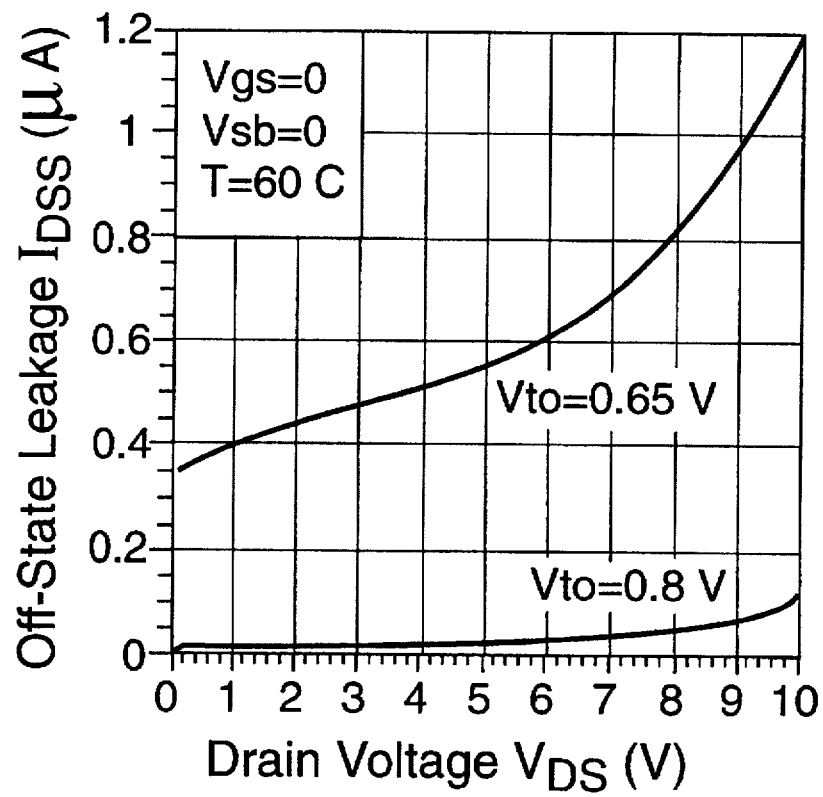
FIG. 10A illustrates a graph showing the leakage current in the off-state of a MOSFET as a function of the voltage across the device at two levels of threshold voltage.

While FIG. 9 illustrates how a low threshold voltage can be induced electrically, the resulting devices are not equivalent to a device fabricated with an extremely low natural threshold voltage. The cost of inducing a low threshold voltage is increased leakage when the device is in its off condition. FIG. 10A illustrates a graph showing the leakage current in the off state ($I_{DSS}$) as a function of the voltage across the device ($V_{DS}$) at two levels of $V_{to}$ (0.65 V and 0.8 V) when T=60° C. and $V_{SB}$=$V_{GS}$=0. The leakage current at $V_{DS}$=5 V increases from 0.1 to 5.5 μA, or by a factor of 55, for a 150 mV decrease in $V_{to}$. Clearly, a low on-resistance at a starved gate drive condition leads to leakage.

Figure 10B:
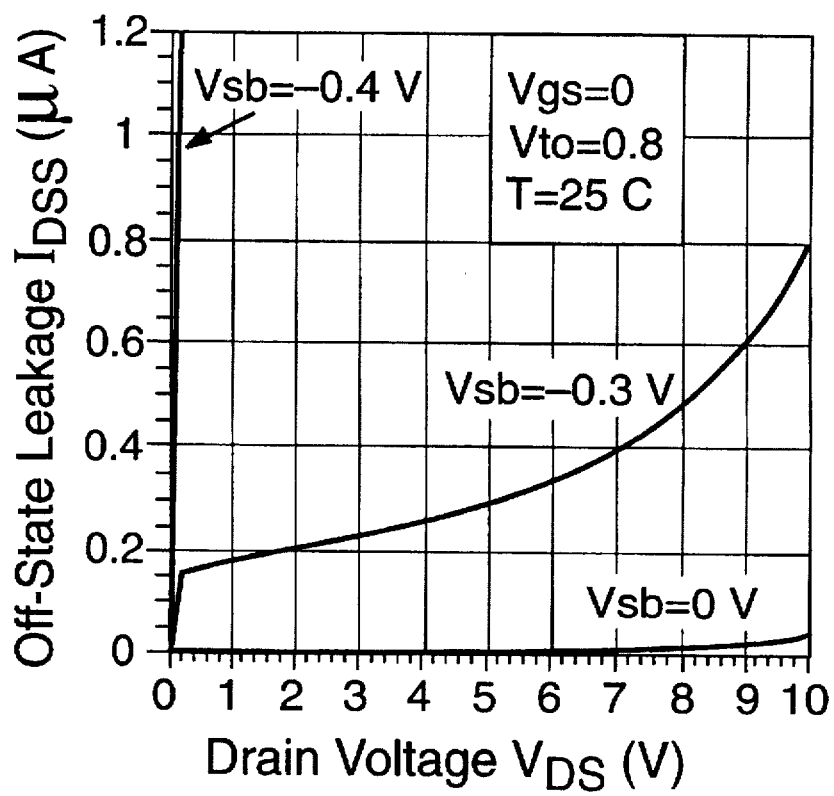
FIG. 10B illustrates a graph showing the leakage current in the off-state of a MOSFET as a function of the voltage across the device at three levels of body bias.

FIG. 10B illustrates a graph showing $I_{DDS}$ as a function of $V_{DS}$ at three levels of body bias $V_{SB}$ when T=25° C., $V_{GS}$=0 and $V_{to}$=0.8 V. Partial forward-biasing the body-source junction at 0.3 V increases $I_{DSS}$ substantially above the $V_{SB}$=0 condition. Setting $V_{SB}$ at 0.4 V leads to a nearly "on" device.

FIGS. 10A and 10B clearly indicate that to insure low off-state current leakage a device must have a $V_{to}$ greater than 0.65 V (ideally between 0.7 and 0.8 V) at room temperature and must have a $V_{SB}$≈0. In other words, either a low $V_{to}$ or an electrically induced $V_{to}(V_{SB})$ lead to undesirably high off-state leakage. In accordance with this invention, the trade-off between a low $V_{to}$ and current leakage is avoided by employing a moderately high $V_{to}$ device and electrically inducing a low $V_{to}$ by biasing the body only during the on-state of the device.

The solution to this problem is to switch the body synchronously with the gate, so that a forward-bias is applied to the source-body junction when the device is turned on, while the body is shorted to the source when the device is turned off. The switching process is illustrated in FIGS. 11A–11D. FIG. 11D is similar to FIG. 7 and shows MOSFET M1 connected to control the power to a load. The circuit is supplied by a voltage source $V_{DD}$. The gate of MOSFET M1 is controlled by switch S1, and the body of MOSFET M1 is controlled by switch S2.

Figure 11A:
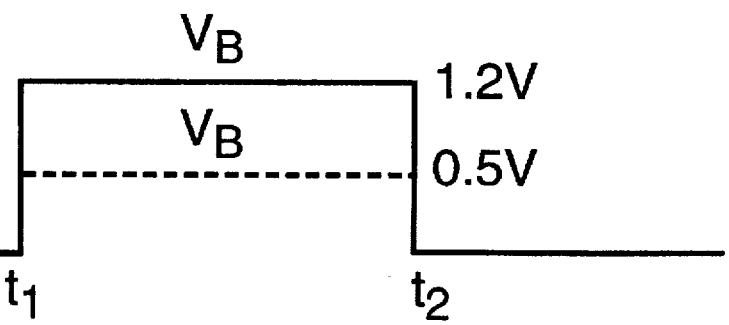
Figure 11B:
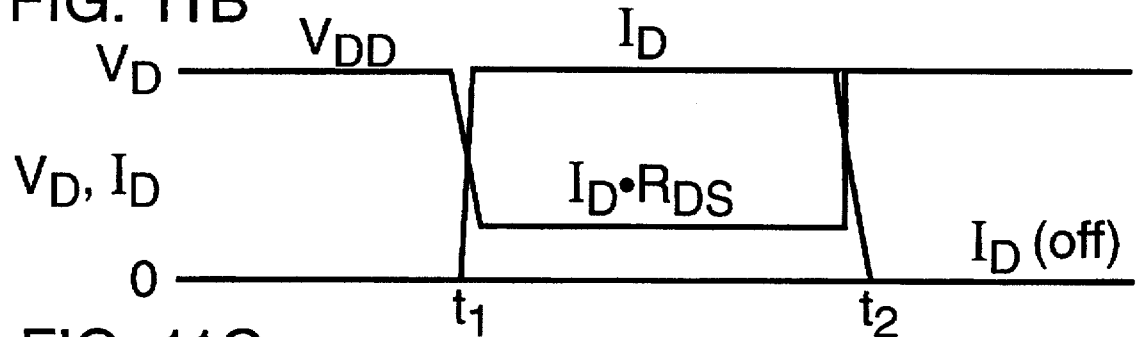
Figure 11C:
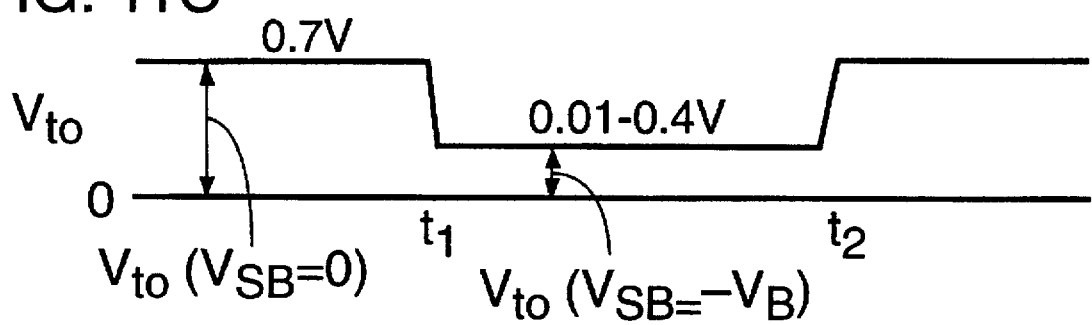
Figure 11D:
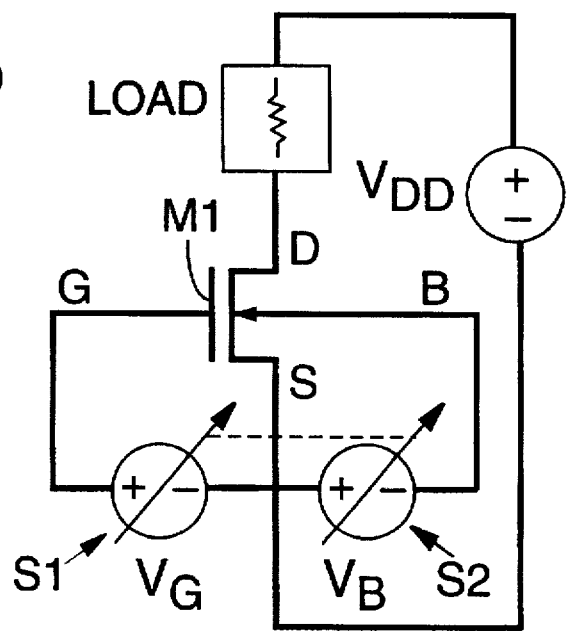
FIG. 11D illustrates a circuit diagram of a MOSFET in accordance with this invention.

FIGS. 11A–11D show the results of turning MOSFET M1 on at a time $t_1$ and turning it off at a time $t_2$. As shown in FIG. 11A, the gate voltage $V_G$ is increased to 1.2 V and the body voltage $V_B$ is increased to 0.5 V at the time that MOSFET M1 is turned on. As shown in FIG. 11B, the drain current $I_D$ increases when MOSFET M1 is turned on, and the voltage across MOSFET M1 falls from the supply voltage $V_{DD}$ to a voltage which is determined by the on-resistance $R_{DS}$ of MOSFET M1. The small leakage current that flows when MOSFET M1 is turned off is not shown in FIG. 11B. FIG. 11C shows that the threshold voltage falls from 0.7 V when MOSFET M1 is turned off to a threshold voltage in the range of 0.01–0.4 V when MOSFET M1 is turned on. This results from using switch S2 to apply a forward-bias to the source-body junction of MOSFET M1 when it is turned on. As indicated in FIG. 11B, switches S1 and S2 are ganged together so that the source-body bias is applied synchronously with the gate drive which turns MOSFET M1 on.

There are numerous circuits that can be used to obtain a forward-biased source-body junction in the MOSFET. For example, in a discrete device typically only three voltage levels are available—gate, source and drain voltages—and the body potential must be derived from one of these voltages.

Figure 12A:
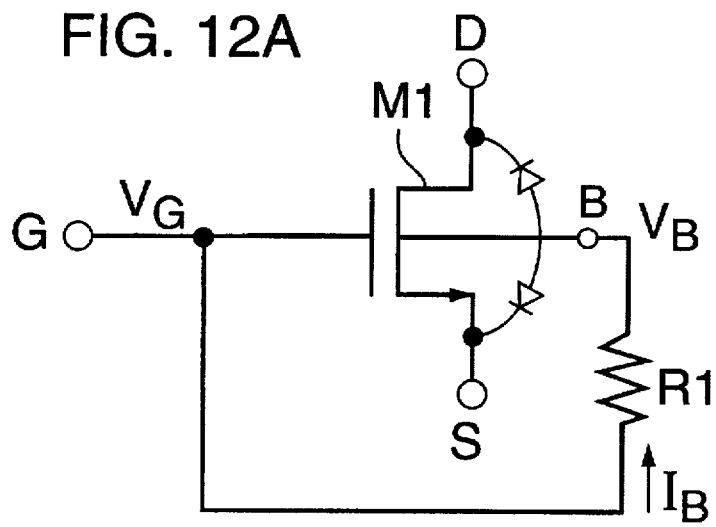
FIG. 12A illustrates a circuit diagram of a MOSFET in which the body bias is derived form the gate bias using a current-limiting resistor.

A solution to the problem is shown in FIG. 12A, where a resistor R1 is connected between the gate and body terminals of the MOSFET M1. Increasing the gate voltage $V_G$ also raises the body potential $V_B$, thereby lowering the threshold voltage of MOSFET M1. Resistor R1 acts as a current-limiting resistor which prevents the body current from reaching excessive levels. Values for R1 in the range 10kΩ to 10MΩ are possible, but values in the range of 100KΩ to a few MΩ offer a reasonable balance between the on-state body current (which ideally should be zero) and lowering the threshold voltage of the device.

The body voltage $V_B$ of the arrangement shown in FIG. 12A is determined by a voltage divider consisting of resistor R1 and the source-body junction of MOSFET M1. Since the source-body junction acts as a PN diode, the body current $I_B$ can be expressed in terms of the voltage across the diode $V_j$ using the well-known diode equation described in S. M. Sze, *Physics of Semiconductor Devices*, John Wiley & Sons (1981), pages 87–89. This results in the following equation for the body current:

$$I_B = \frac{V_{GS} - V_j}{R_B} = \frac{V_{GS}}{R_B} - \frac{1}{R_B}\left(\frac{kT}{q}\right)\ln\left(\frac{I_B}{I_o}\right) \tag{15}$$

$$= \frac{V_{GS} - 0.7}{R_B} \tag{16}$$

where $V_j$ is the voltage across the source-body junction, $R_B$ is value of resistor R1, and $I_o$ is the saturation current of a PN diode as given by the equation $$I_O = \frac{qAn_i^2}{N_D} \sqrt{\frac{D}{\tau}} \quad (17)$$

where q is the charge of an electron, A is the area of the PN junction, $n_i$ is the intrinsic carrier concentration of silicon, $\tau$ and D are the minority carrier lifetime and diffusivity in the lightly doped side of the junction, and $N_D$ is the dopant concentration on the lightly doped side of the junction.

Equation (16) is an approximation which can be used for large values of $R_B$. For a 2.3MΩ resistor R1, for example, a 3 V gate drive would result in 1 μA of body current.

A possible shortcoming of the circuit shown in FIG. 12A is that the resistor R1 determines the magnitude of the body current, but the maximum body voltage $V_B$ is determined by the current-voltage characteristics of the PN junction between the source and body of MOSFET M1. The voltage drop across the source-body junction maybe higher than is desirable, and in addition the forward current across the source-body junction may lead to charge storage which can increase the time it takes to turn the MOSFET off. Moreover, the body current and stored minority carrier charge may vary significantly with the gate voltage. For example, a resistor R1 chosen for a gate bias of 3 V may allow excessive currents at a gate bias of 10 V. Also, high levels of stored charge can lead to non-uniform current conduction during turn-off of the MOSFET. Finally, using a large resistor R1 to minimize the body current $I_B$ when MOSFET M1 is turned on results in a nearly floating base when MOSFET M1 is turned off, and when higher drain voltages may be present. The floating base results in a $BV_{ceo}$-type breakdown which maybe a small fraction of the ideal $BV_{dss}$ diode breakdown.

Figure 12B:
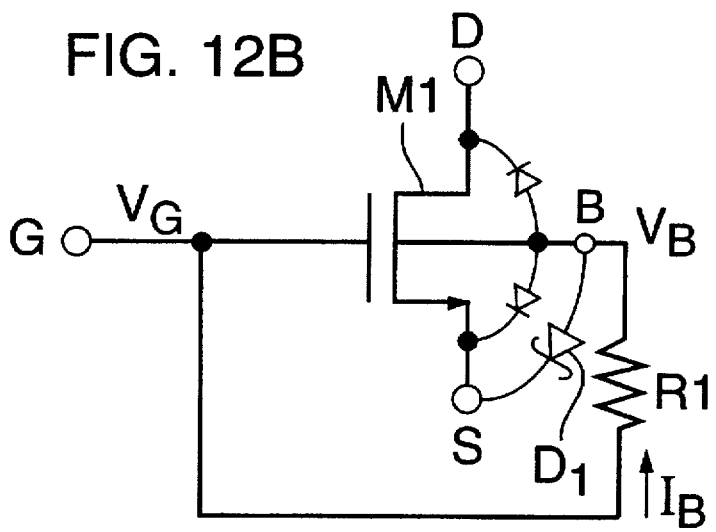
FIG. 12B illustrates a circuit diagram of a MOSFET in which the body bias is derived form the gate bias using a current-limiting resistor and a Schottky diode clamp.
Figure 12C:
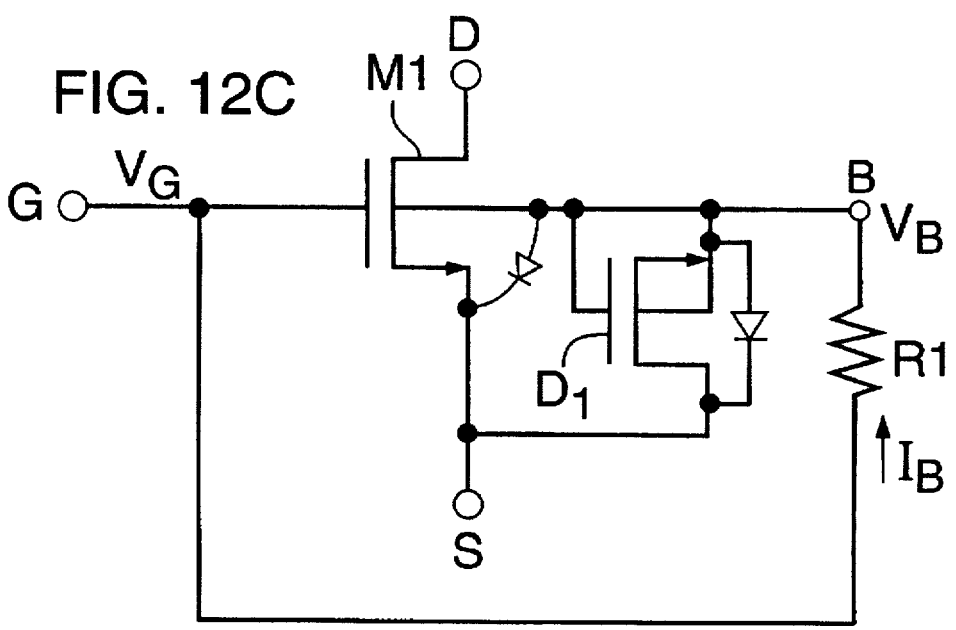
FIG. 12C illustrates a circuit diagram of a MOSFET in which the body bias is derived form the gate bias using a current-limiting resistor and a pseudo-Schottky diode clamp.

The maximum body voltage and current may be intentionally limited by clamping the body voltage as in the arrangements shown in FIGS. 12B and 12C. In 12B, a Schottky diode D1 is connected in parallel with the source-body junction. Depending on the value of resistor R1, Schottky diode D1 could limit the body voltage to a voltage in the vicinity of 0.2 V. In the arrangement shown in FIG. 12C, a pseudo-Schottky diode D2 has been used to clamp the body of MOSFET M1. Pseudo-Schottky diode D2 is a MOSFET whose source, body and gate terminals are connected together, in accordance with the teachings of the above-referenced Application Ser. No. 08/648,334. An advantage of this embodiment is that the pseudo-Schottky diode can be integrated with MOSFET M1. In the arrangements shown in FIG. 12B and 12C, the clamping device must have a lower voltage than the voltage across the source-body junction of MOSFET M1, or the source-body junction of the MOSFET itself may conduct an equal or greater current than the clamp. The forward voltage of the Schottky diode D1 and psuedo-Schottky diode D2 track that of the PN diode (source-body junction) with temperature. Increasing the temperature decreases the $V_{BE}$ of the PN diode but likewise decreases the voltage across the pseudo-Schottky diode D2, thereby avoiding conduction in the PN diode.

Figure 13:
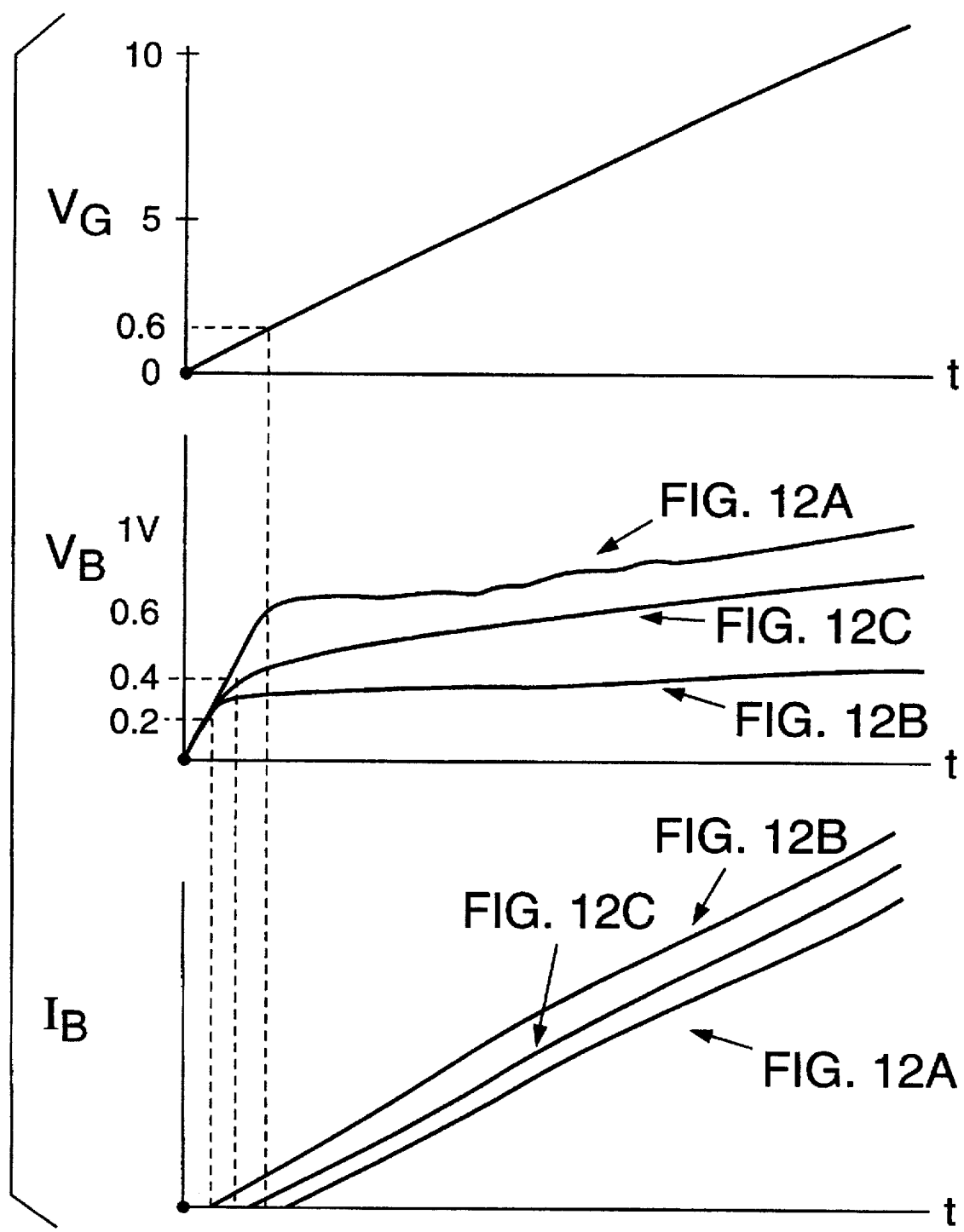
FIG. 13 illustrates a graph showing the behavior of the body voltage and body current in the MOSFETs of FIGS. 12A–12C as the gate voltage is increased over time.

The graphs shown in FIG. 13 illustrate what happens to the body voltage $V_B$ and body current $I_B$ as the gate voltage $V_G$ is increased linearly with time. The three curves for $V_B$ and $I_B$ represent the arrangements of FIGS. 12A–12C. As indicated, the body voltage $V_B$ is clamped at about 0.2 V with a Schottky diode clamp (FIG. 12B), at about 0.4 V with a pseudo-Schottky clamp (FIG. 12C), and at about 0.6 V with no clamp (FIG. 12A). As soon as the clamping potential is reached, in each instance the body current increases almost linearly with increasing $V_G$. Because the clamp limits the maximum body voltage, however, the current and stored charge in the source-body diode of MOSFET M1 is reduced.

Figure 14A:
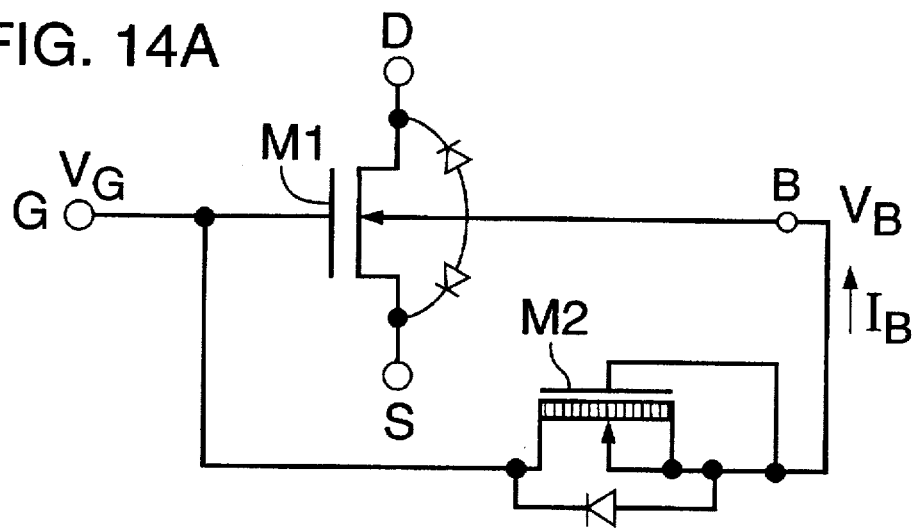
FIG. 14A illustrates a circuit diagram of a MOSFET in which the body bias is derived from the gate bias using a current-limiting depletion mode MOSFET.
Figure 14B:
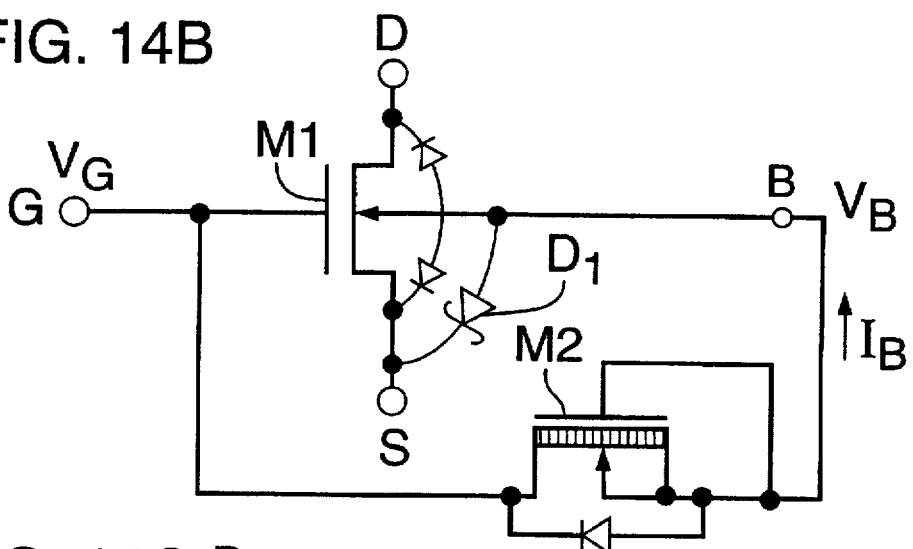
FIG. 14B illustrates a circuit diagram of a MOSFET in which the body bias is derived from the gate bias using a current-limiting depletion mode MOSFET and a Schottky diode clamp.
Figure 14C:
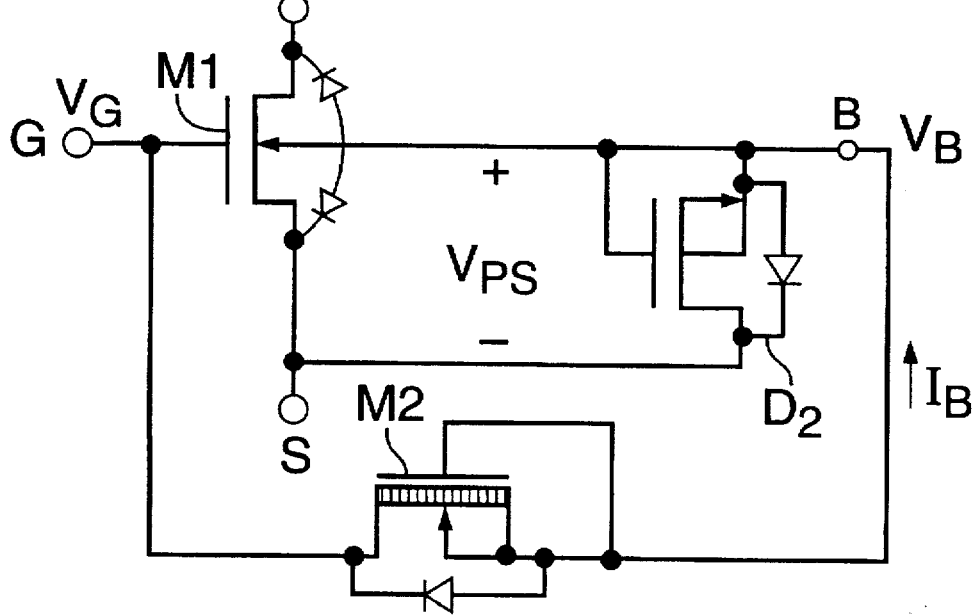
FIG. 14C illustrates a circuit diagram of a MOSFET in which the body bias is derived from the gate bias using a current-limiting depletion mode MOSFET and a pseudo-Schottky diode clamp.

The body current at relatively high gate voltages can be lowered by using a depletion mode MOSFET as a current limiter. FIGS. 14A–14C illustrate arrangements that are identical to those shown in FIGS. 12A–12C except that in each case the current limiting resistor R1 has been replaced by an N-channel depletion mode MOSFET M2. The gate and source terminals of depletion mode MOSFET M2 are tied together. For small values of $V_G$, depletion mode MOSFET M2 acts as a resistor having a resistance of $R_{DS}$ ($V_{GS}=-V_p$), and the circuit behaves the same as the corresponding circuit shown in FIGS. 7A–7C. After $V_B$ is clamped (by the source-body junction of MOSFET M1 in FIG. 14A, the Schottky diode D1 in FIG. 14B, or the pseudo-Schottky diode D2 in FIG. 14C) the body current $I_B$ starts to flow, increasing in proportion to $V_G$ at a slope of $R_{DS}(V_{GS}=0)$, until depletion mode MOSFET M2 saturates and limits the current.

Figure 15:
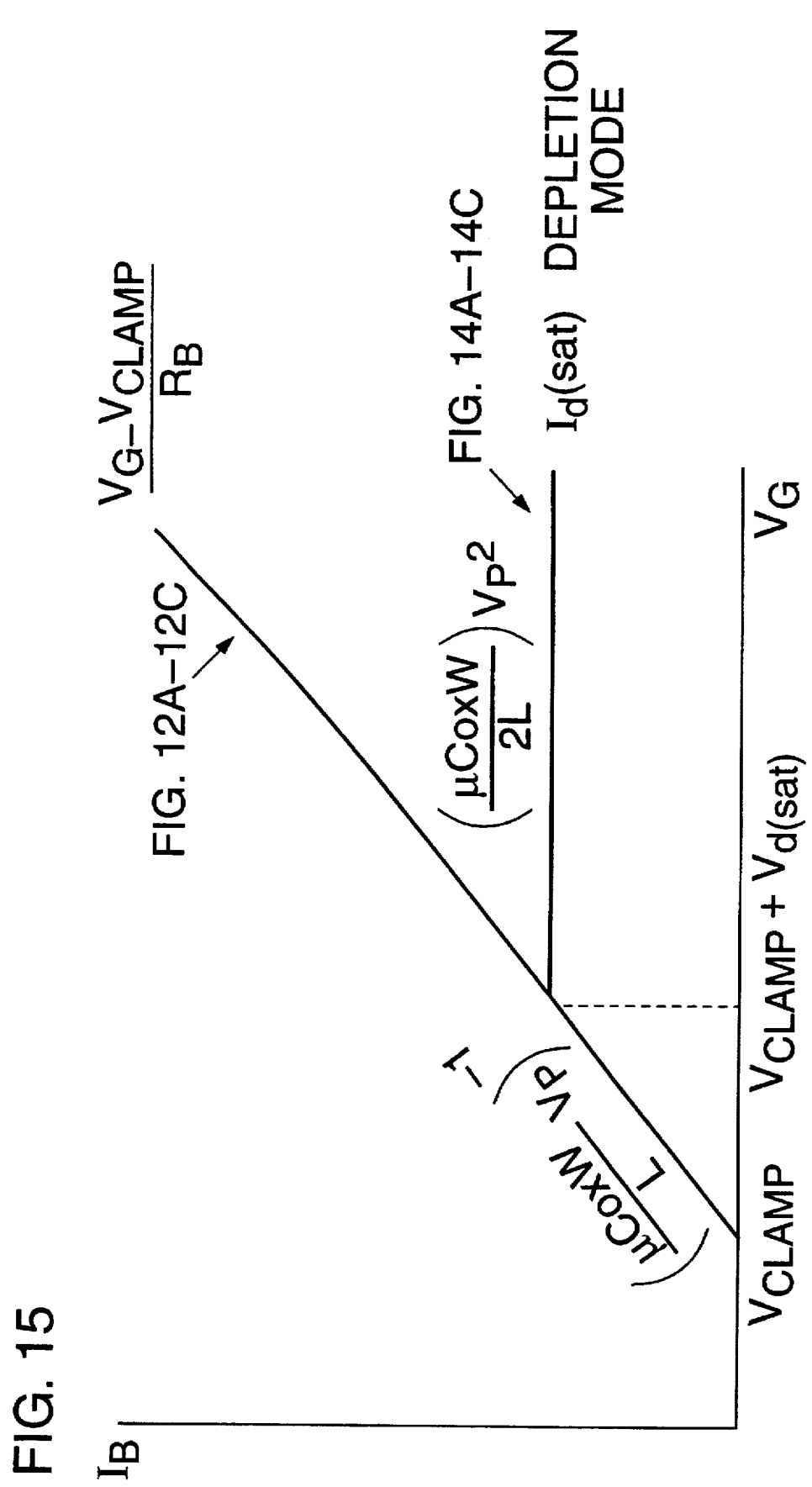
FIG. 15 illustrates a graph showing a comparison between the base current in the embodiments shown in FIGS. 12A–12C and the embodiments shown in FIGS. 14A–14C as a function of the gate drive voltage.

FIG. 15 illustrates the body current as a function of the gate voltage for the clamped circuits shown in FIGS. 12A–12C and the clamped and current-limited circuits shown in FIGS. 14A–14C. It is immediately apparent that the current-limiting depletion mode MOSFET M2 reduces the body current at a high gate bias to a small fraction of what it would be with a current-limiting resistor. The extent of this reduction can be estimated by assuming a depletion mode MOSFET with a linear resistance $R_{Ds}$(on) equal to the resistance $R_B$ of the resistor R1:

$$R_B = \frac{1}{\frac{\mu C_{ox} W}{L} \cdot V_P} \quad (18)$$

This results in a body current $I_B$ of:

$$I_B = \frac{V_G - V_{clamp}}{R_B} = (V_G - V_{clamp}) \left( \frac{\mu C_{ox} W}{L} \cdot V_P \right) \quad (19)$$

A depletion mode MOSFET of this size, when saturated, conducts a current of:

$$I_B - I_D(sat) = \frac{\mu C_{ox} W}{2L} \cdot V_P^2 \quad (20)$$

Taking the ratio of equation (18) to equation (19) yields the ratio of the body currents in the embodiments shown in FIGS. 12A–12C and 14A–14C, respectively:

$$\frac{I_D}{I_D(sat)} = \frac{V_G - V_{clamp}}{2V_P} \quad (21)$$

For example, comparing the embodiments shown in FIGS. 12C and 14C and assuming a 0.5 V pinchoff voltage for depletion mode MOSFET M2 and a 0.4 V clamping voltage for pseudo-Schottky diode D2, the current at a gate voltage $V_G$ of 10.4 V is 10 times larger in the embodiment of FIG. 12C. This assumes that resistor R1 has a resistance value comparable to that of depletion mode MOSFET M2.

Figure 16A:
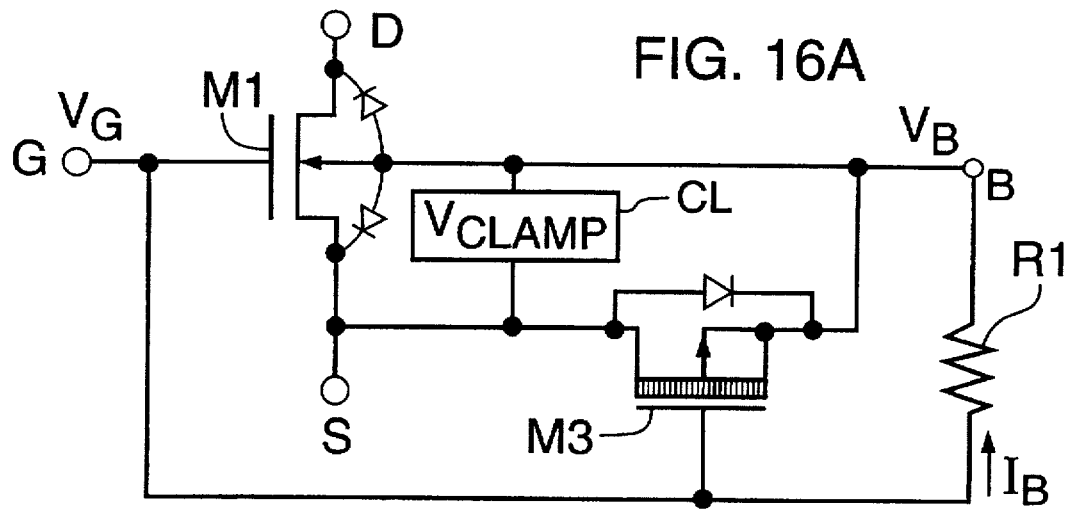
FIG. 16A illustrates a circuit diagram of a MOSFET in which a depletion mode MOSFET is used to short the body to the source when the device is turned off.
Figure 16B:
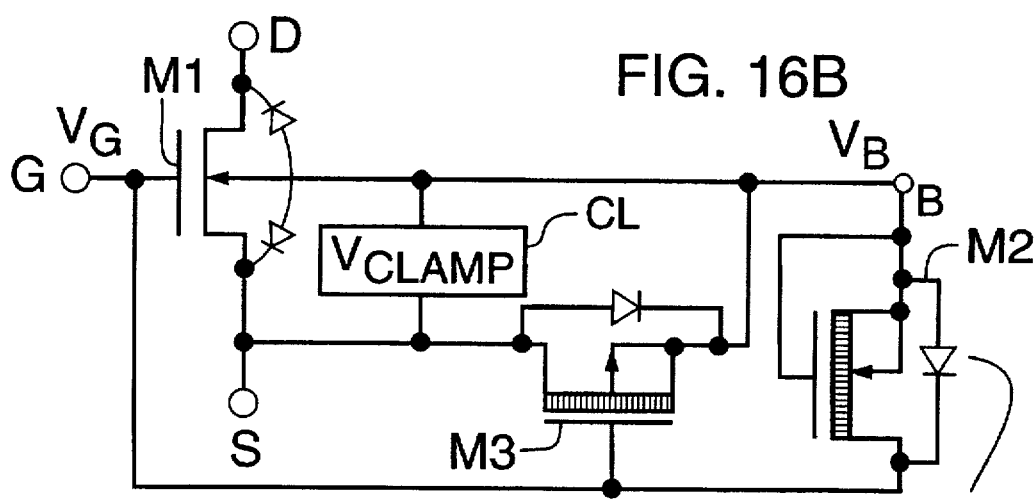
FIG. 16B illustrates a circuit diagram similar to FIG. 16A further including a second depletion mode MOSFET for limiting the body current.
Figure 16C:
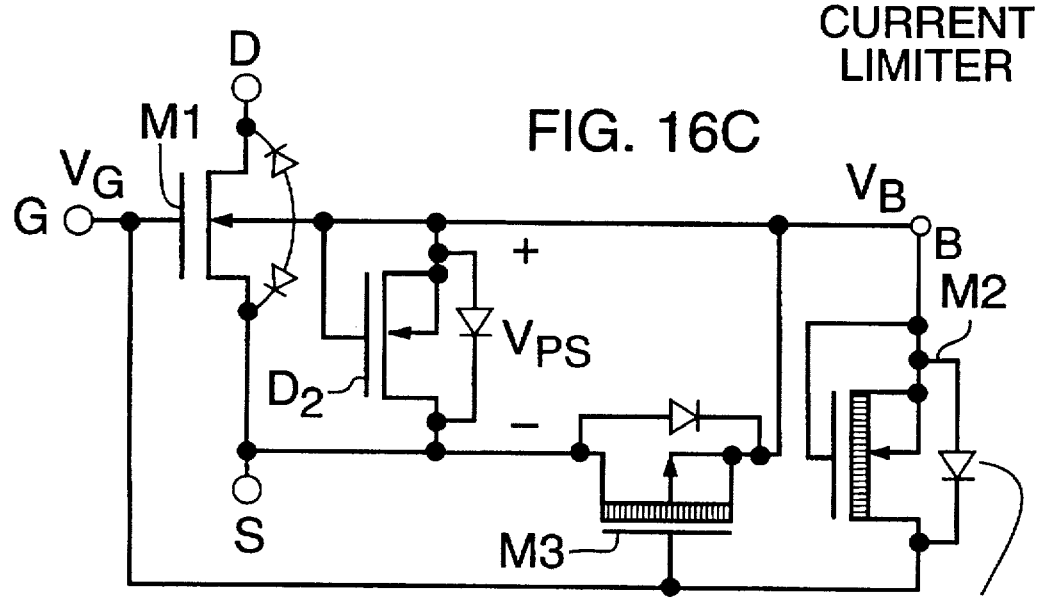
FIG. 16C illustrates a circuit diagram similar to FIG. 16B further including a pseudo-Schottky diode as a clamp between the body and source of the main power MOSFET.

As indicated above, the body and source of MOSFET M1 should be shorted together when the device is turned off in order to minimize leakage currents. FIGS. 16A–16C illustrate several circuits for accomplishing this. The circuit shown in FIG. 16A is similar to the circuits of FIGS. 12B and 12C, with the addition of a P-channel depletion mode MOSFET M3 connected between the source and body terminals of MOSFET M1. When $V_G$ is pulled high to turn MOSFET M1 on the gate voltage of PMOSFET M3 rises to a level above the source voltage of PMOSFET M3. Thus PMOSFET M3 turns off, allowing the source-body junction of MOSFET M1 to become forward-biased. The body voltage $V_B$ is limited by a clamping device CL which could be the Schottky diode D1 or the pseudo-Schottky diode D2 shown in FIGS. 12B and 12C. When $V_G$ is reduced to turn off MOSFET M1, PMOSFET M3 turns on, thereby shorting the source and body of MOSFET M1 together.

FIG. 16B shows an alternative version which includes the current limiting depletion mode NMOSFET M2 of FIGS. 14A–14C, which as described above limits the body current after the clamping device CL becomes operative. FIG. 16C shows a similar circuit with the pseudo-Schottky diode D2 used as the clamping device.

In the embodiments shown in FIGS. 12A–12C, 14A–14C and 16A–16C, the body bias $V_B$ is derived from the gate terminal of the power MOSFET. These embodiments are particularly appropriate for the manufacture of a discrete device, in which only the source, drain and gate voltages are available. If a separate supply line, typically referred to as $V_{batt}$ or $V_{cc}$ is available, the body bias may be derived from the supply line rather than from the gate terminal of the MOSFET. As a result, the gate terminal draws no current. FIGS. 17A, 17B and 18–20 illustrate several embodiments which use a separate supply line to produce the body bias.

Figure 17A:
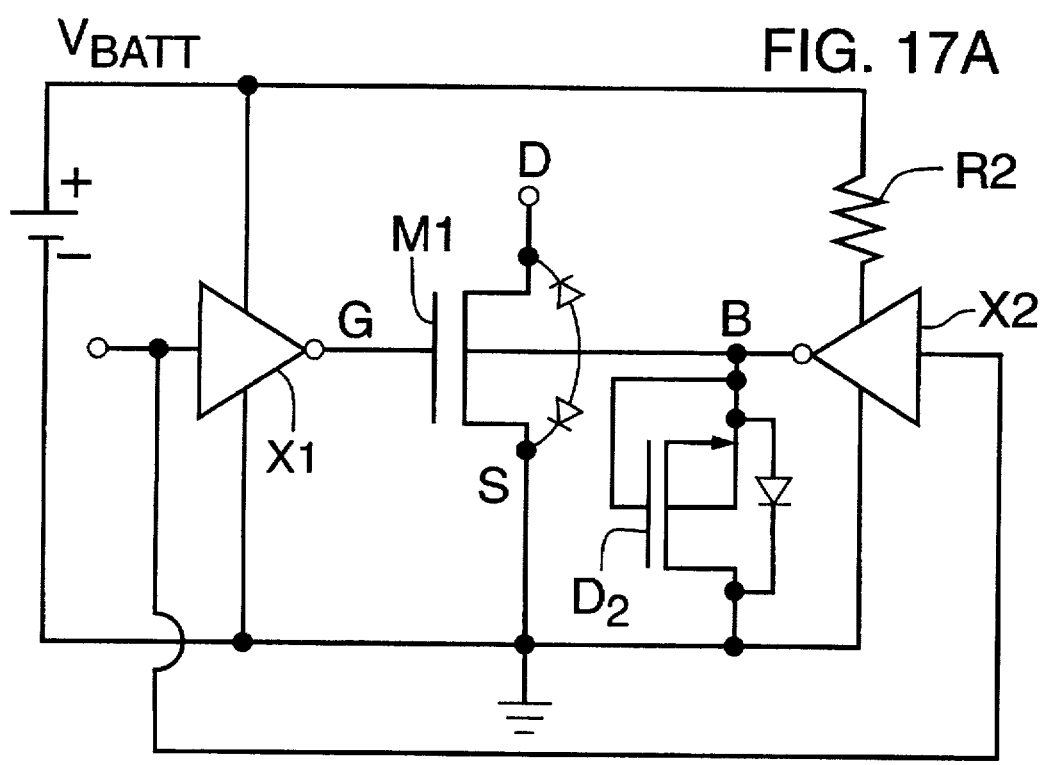
FIG. 17A illustrates a circuit diagram of a MOSFET in which both the gate drive and body bias are derived from a separate voltage supply line using a pair of inverters and a resistor.
Figure 17B:
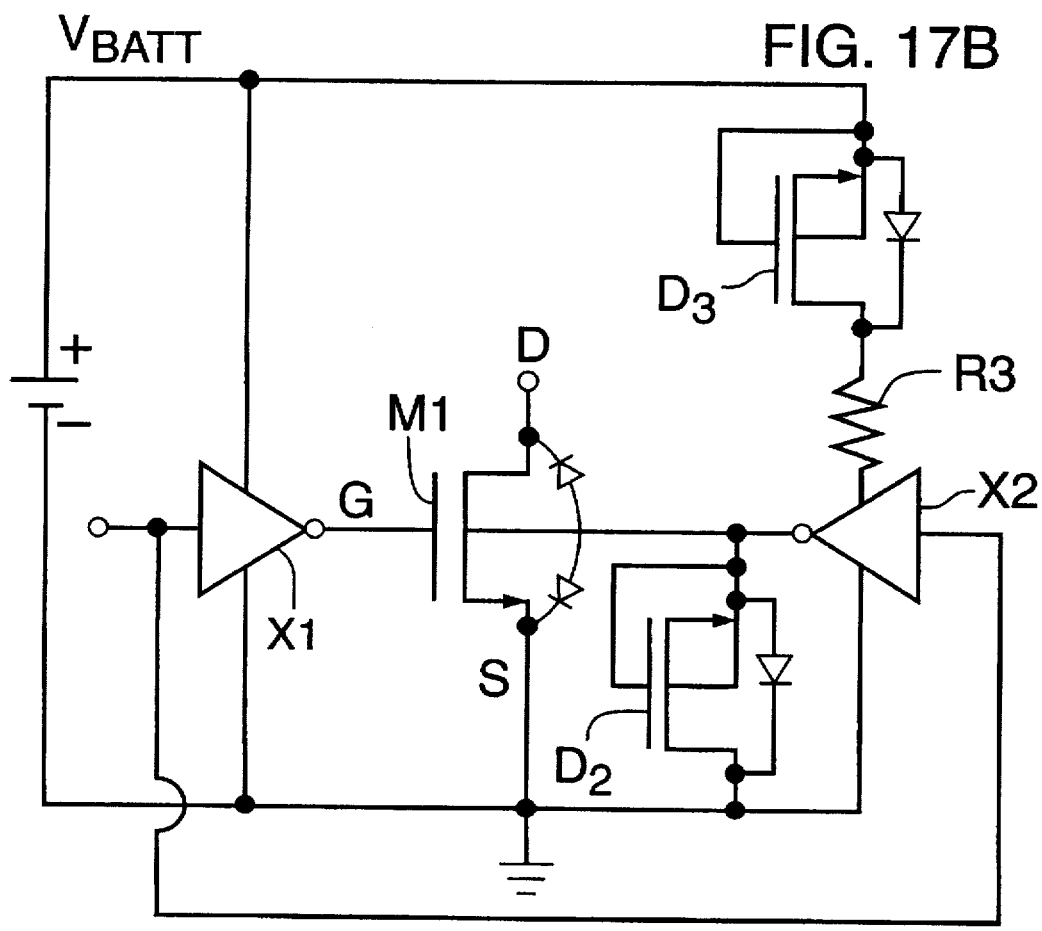
FIG. 17B illustrates a circuit diagram of a MOSFET in which both the gate drive and body bias are derived from a separate voltage supply line using a pair of inverters and a pseudo-Schottky diode.

In the embodiment of FIG. 17A, the gate and body of MOSFET M1 are connected to the outputs of inverters X1 and X2, respectively. A battery provides a supply voltage $V_{batt}$. $V_{batt}$ is connected directly to the high-side power input to inverter X1 and through a current-limiting resistor R2 to the high-side power input to inverter X2. MOSFET M1 is turned on by pulling the input to inverter X1 low which essentially connects $V_{batt}$ to the gate of MOSFET M1. The output of inverter X2 is $V_{batt}$ less the voltage drop across resistor R2, which is delivered at the output of inverter X2. As in several of the embodiments previously described, pseudo-Schottky diode D2 clamps the body voltage of MOSFET M1, producing the desired voltage drop across the source-body junction of MOSFET M1. MOSFET M1 is turned off by pulling the inputs to inverters X1 and X2 high, which shorts the source, body and gate terminals of MOSFET M1 together. The embodiment shown in FIG. 17B is similar, except that a second pseudo-Schottky diode D3 is substituted for the current-limiting resistor R2. Optionally, a small resistor R3 may be connected in series with pseudo-Schottky diode D3, to limit the current in the pseudo-Schottky diode. Since a pseudo-Schottky diode typically turns on at about 0.4 V the output of inverter X2 is at a voltage approximately equal to $V_{batt}$ less 0.4 V.

Figure 18:
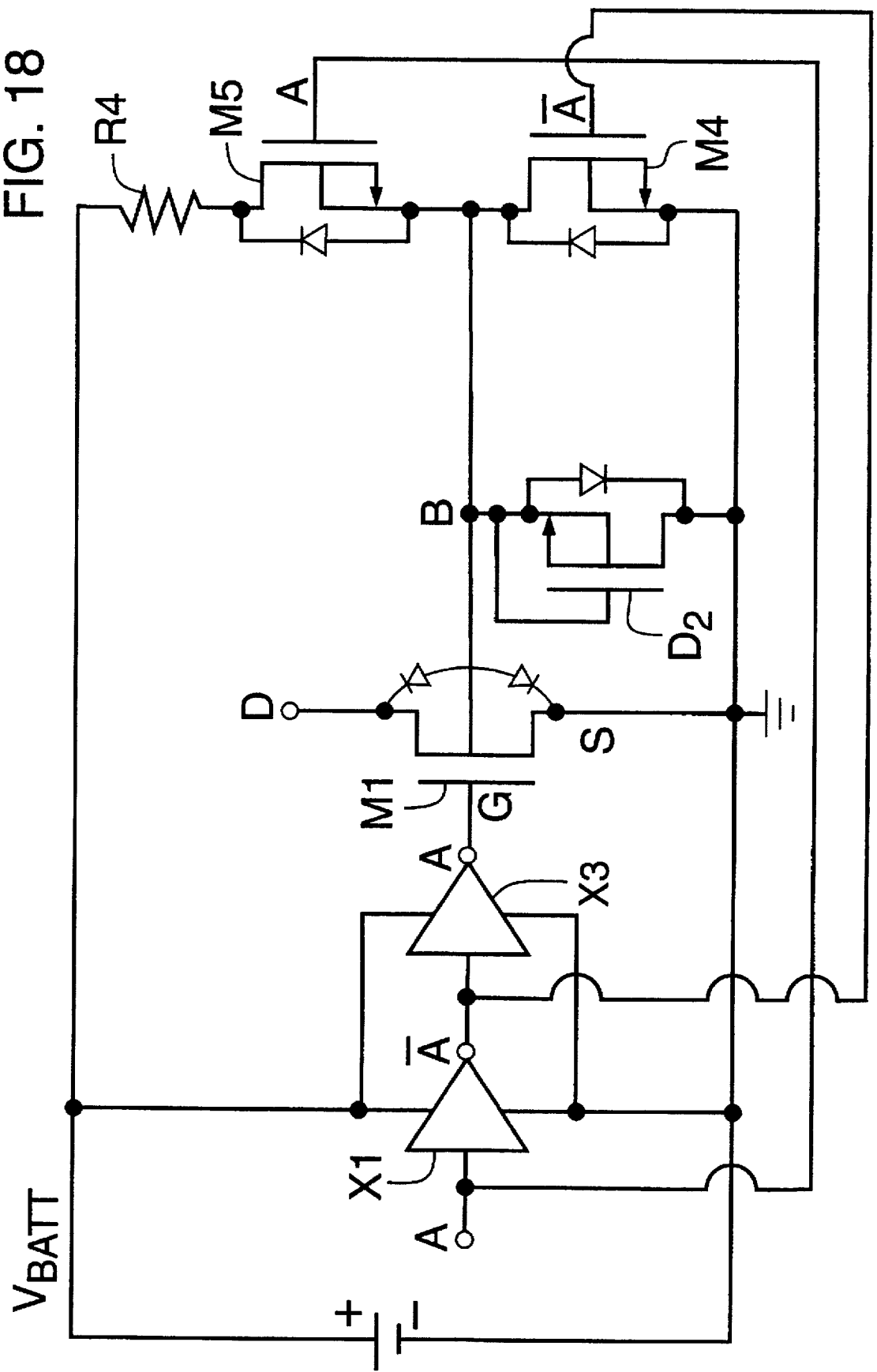
FIG. 18 illustrates a circuit diagram of a MOSFET in which both the gate drive and body bias are derived from a separate voltage supply line using a pair of inverters and a pair of series-connected N-channel MOSFETs.

The inverters X1 and X2 in FIGS. 17A and 17B are typically CMOS inverters which include a series-connected PMOSFET and NMOSFET. In FIG. 18, the CMOS pair of inverter X2 is replaced by a pair of NMOSFETS M4 and M5, with the high side NMOSFET M5 acting as a source follower. A second inverter X3 is connected between the output of inverter X1 and the gate of MOSFET M1. MOSFET M1 is turned on by pulling the input to inverter X1 high, which raises the gate voltage of MOSFET M1 to $V_{batt}$. Since the input to inverter X1 is connected to the gate of NMOSFET M5, NMOSFET M5 is turned on; conversely, the output of inverter X1 is connected to the gate of NMOSFET M4, and this turns NMOSFET M4 off. Thus, the body of MOSFET M1 sees a voltage which is limited to a threshold drop below the gate drive of MOSFET M1. MOSFET M1 is turned off by pulling the input to inverter X1 low, which turns NMOSFET M4 on and shorts the source and body terminals of MOSFET M1 together.

Figure 19:
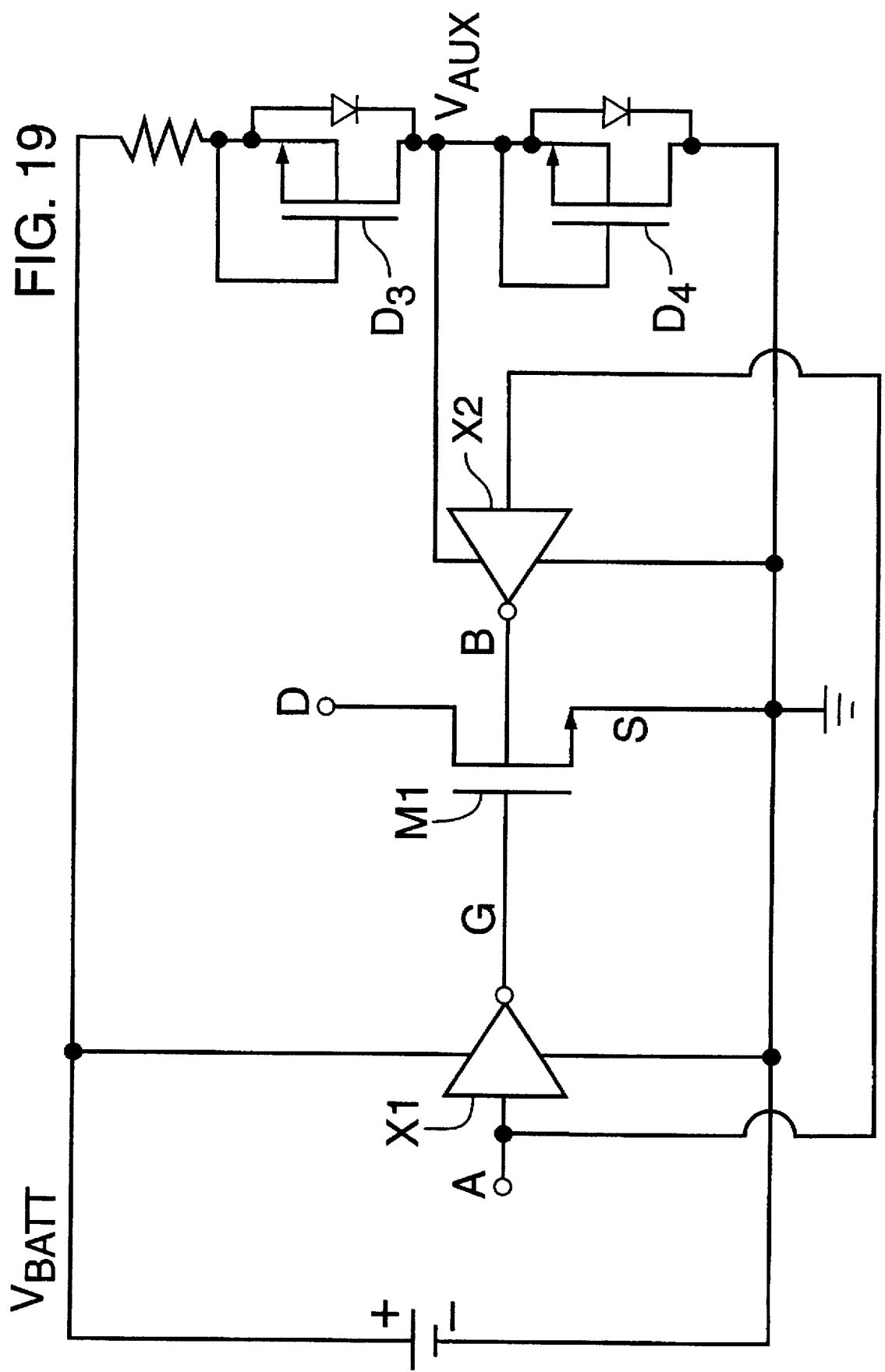
FIG. 19 illustrates a circuit diagram of a MOSFET in which both the gate drive and body bias are derived from a separate voltage supply line using a pair of inverters and voltage divider including a pair of pseudo-Schottky diodes.
Figure 20:
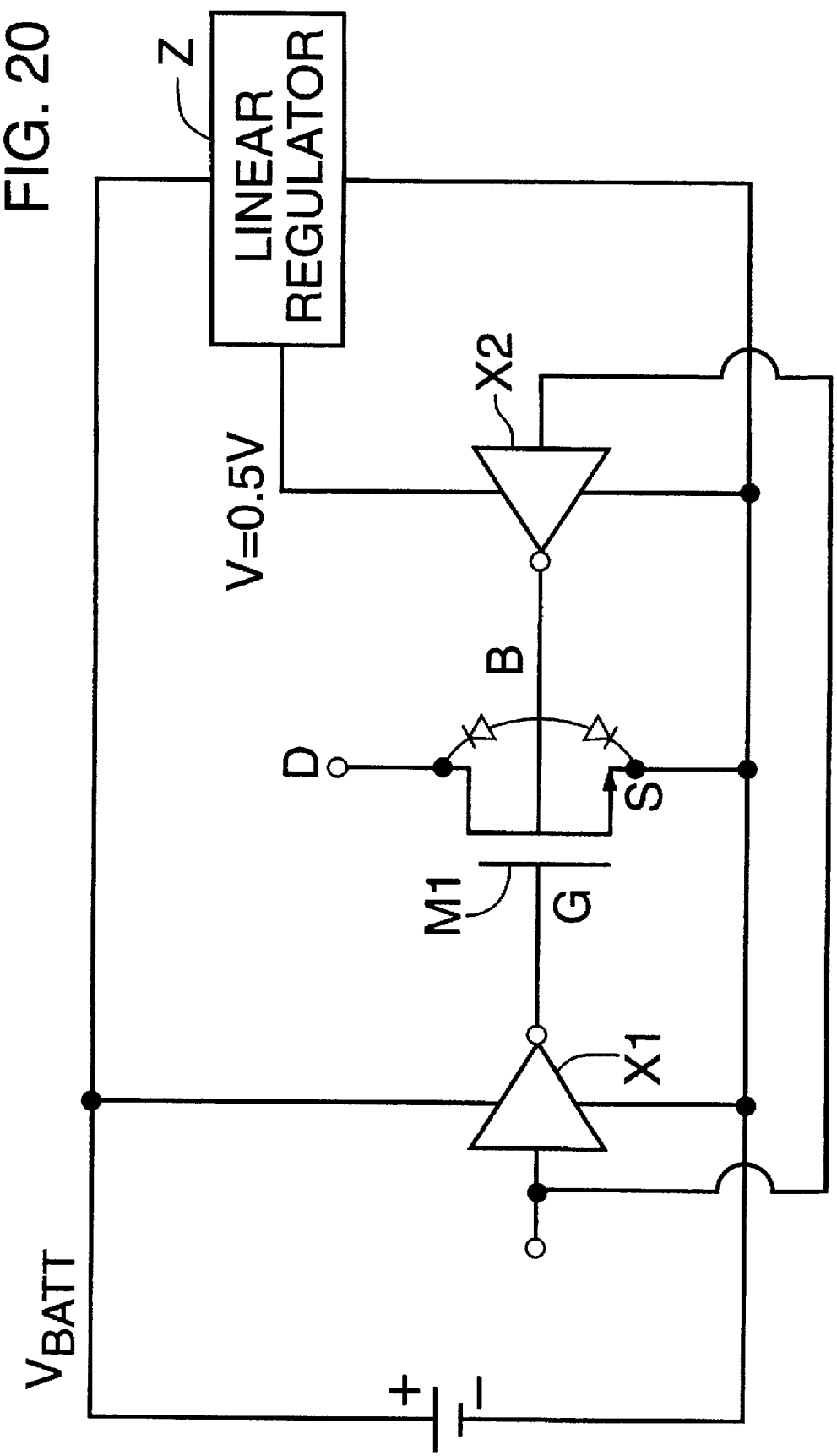
FIG. 20 illustrates a circuit diagram of a MOSFET in which both the gate drive and body bias are derived from a separate voltage supply line using a pair of inverters and a linear regulator.

In the embodiment of FIG. 19, a pair of pseudo-Schottky diodes D3 and D4 form a voltage divider which supplies a voltage $V_{aux}$ to the high-side power input of inverter X2. Thus, when MOSFET M1 is turned on by lowering the inputs to inverters X1 and X2, inverter X2 delivers a body bias which is approximately equal to $V_{batt}$ less the voltage drop across pseudo-Schottky diode D3, or about 0.4 V. The embodiment of FIG. 20 is similar, except that a linear regulator Z has been substituted for the voltage divider consisting of pseudo-Schottky diodes D3 and D4. In this embodiment, linear regulator Z supplies an output equal to 0.5 V, which is delivered to the body of MOSFET M1 when it is turned on. To operate at low input voltages (e.g., down to 0.8 V), linear regulator Z must be of the low-dropout type.

While the influence of the body terminal in lowering the threshold voltage has been mentioned in the semiconductor literature (e.g., S. M. Sze, *Physics of Semiconductor Devices*, 2nd ed., John Wiley & Sons (1981), p. 462), and while body biasing has been used in some very low voltage circuits such as watch circuits, the use of this technique in high-power switches to reduce on-resistance under "starved gate" drive conditions is new and raises issues and concerns not previously encountered. In particular, the construction of a power MOSFET for "starved gate" drive operation requires the combination of several features to offer acceptable performance at extremely low input voltages. These features include: maximizing the gate perimeter per unit area of the device, and providing a short channel length and a low series drain resistance. Beyond this, generating a high body effect and low threshold voltage requires the same design considerations that are described in connection with the pseudo-Schottky diode in the above referenced Application Ser. No. 08/648,334.

In fabricating a four-terminal MOSFET in accordance with this invention, the body is formed with a high dopant concentration and is then counter-doped using some threshold adjust technique. The higher the body dopant concentration $N_B$, the higher the dosage of the threshold adjust implant must be. However, a high body dopant concentration and threshold adjust implant yield a device which provides superior performance at low operating voltages.

Figure 21:
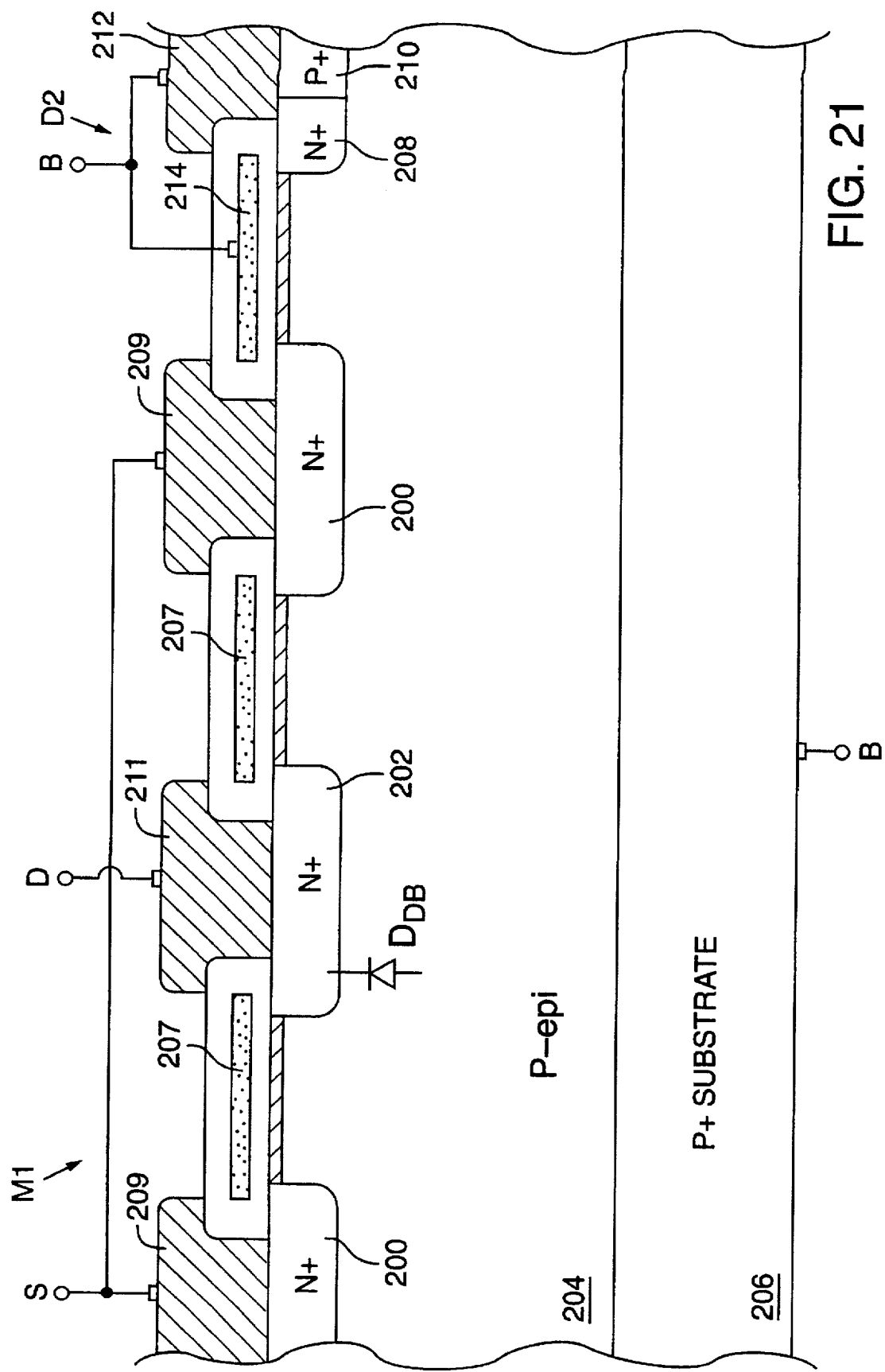
FIG. 21 illustrates a cross-sectional view of a lateral MOSFET in accordance with this invention.

FIGS. 21, 22, 23A, 23B, and 24 illustrate cross sectional views of various embodiments of a four-terminal MOSFET M1 in accordance with this invention. FIG. 21 shows MOSFET M1 in a lateral version. An N+ source region 200 and an N+ drain region 202 are formed in a P-epitaxial layer 204. P-epitaxial layer 204 overlies a P+ substrate 206. The current flow between source region 200 and drain region 202 is controlled by a gate 207. Source region 200 and drain region 202 are contacted by metal contact layers 209 and 211, respectively.

Pseudo-Schottky diode D2 used as a body clamp includes an N+ source region 208 which is shorted to a P+ body contact region 210 by a metal contact layer 212. As shown, source region and body contact region are shorted to the gate 214 of pseudo-Schottky diode D2 as described in the above referenced Application Ser. No. 08/648,334, the channel of pseudo-Schottky diode D2 conducts when the voltage at source region 208 (anode) exceeds the voltage at the drain (cathode) of the pseudo-Schottky diode (which is also the source of MOSFET M1) by a voltage in the range 0.3–0.5 V. Pseudo-Schottky diode D2 accordingly insures that the body voltage of MOSFET M1 does not exceed the source voltage of MOSFET M1 by more than 0.3–0.5 V.

Figure 22:
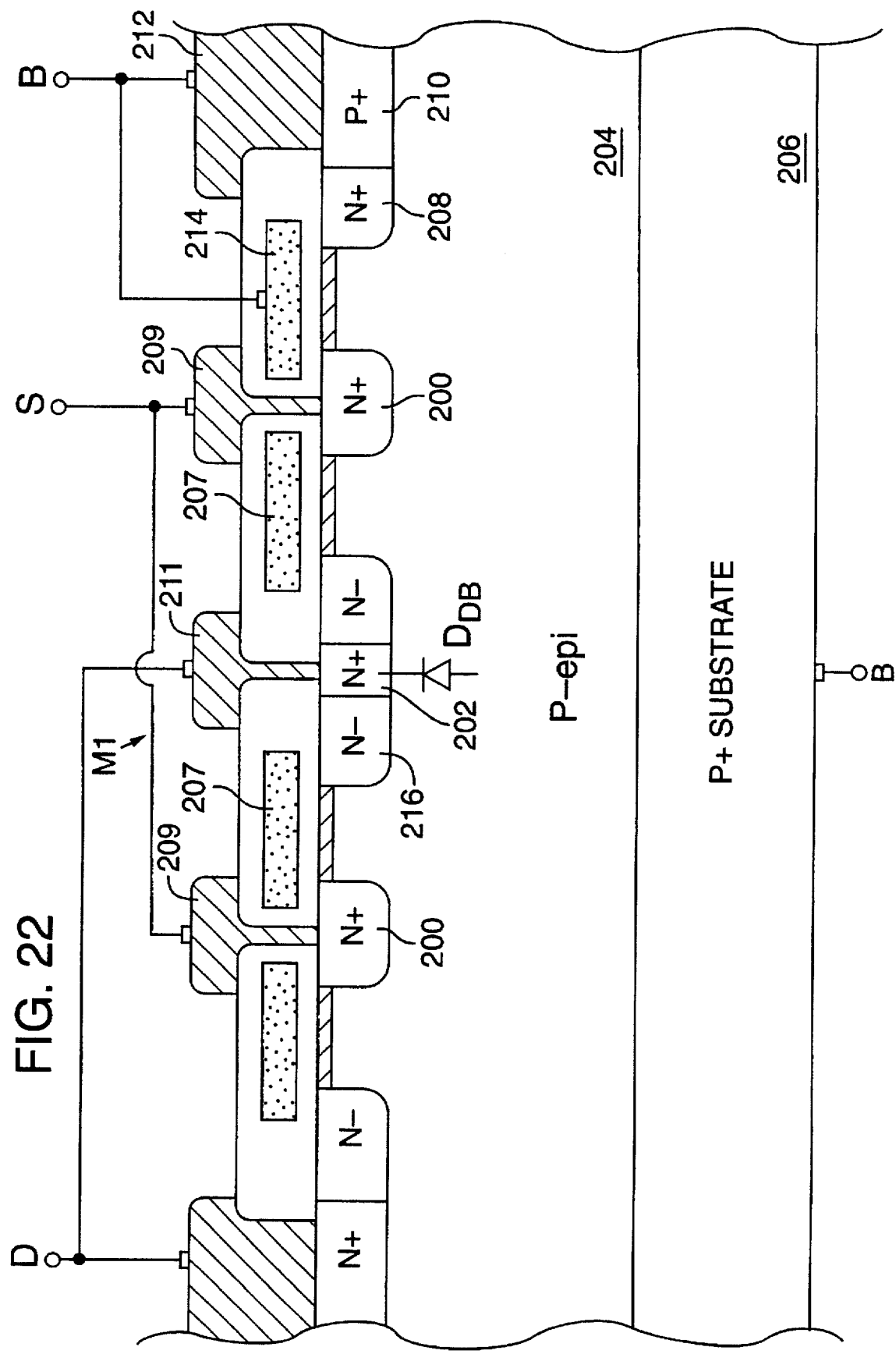
FIG. 22 illustrates a cross-sectional view of a lateral MOSFET in accordance with this invention including a drifted drain for tolerating higher drain voltages.

FIG. 22 shows a similar embodiment with the difference that the N+ drain region of MOSFET M1 is provided with an N– "drift" region 216. Drift region 216 allows the device to tolerate higher drain voltages (e.g. 12–100 V) than the undrifted version shown in FIG. 21.

FIG. 23A shows a cross sectional view of a four-terminal vertical planar DMOSFET according to this invention. In this embodiment, MOSFET M1 is formed in an N-epitaxial layer 230 which overlies an N+ substrate 232. N+ substrate 232 serves as the drain of MOSFET M1. MOSFET M1 also includes a P body region 234 and N+ source region 236 and a P+ body contact region 238. A channel region is formed in P body 234 under a gate 240. Pseudo-Schottky diode D2 includes a P body 242, and N+ source region 244, a P+ body contact region 246, and an N+ drain region 248, which is connected to the N+ source region 236 of MOSFET M1. As shown, the body region 242 and source region 244 of pseudo-Schottky diode D2 are tied through a metal layer to a gate 250.

Figure 23B:
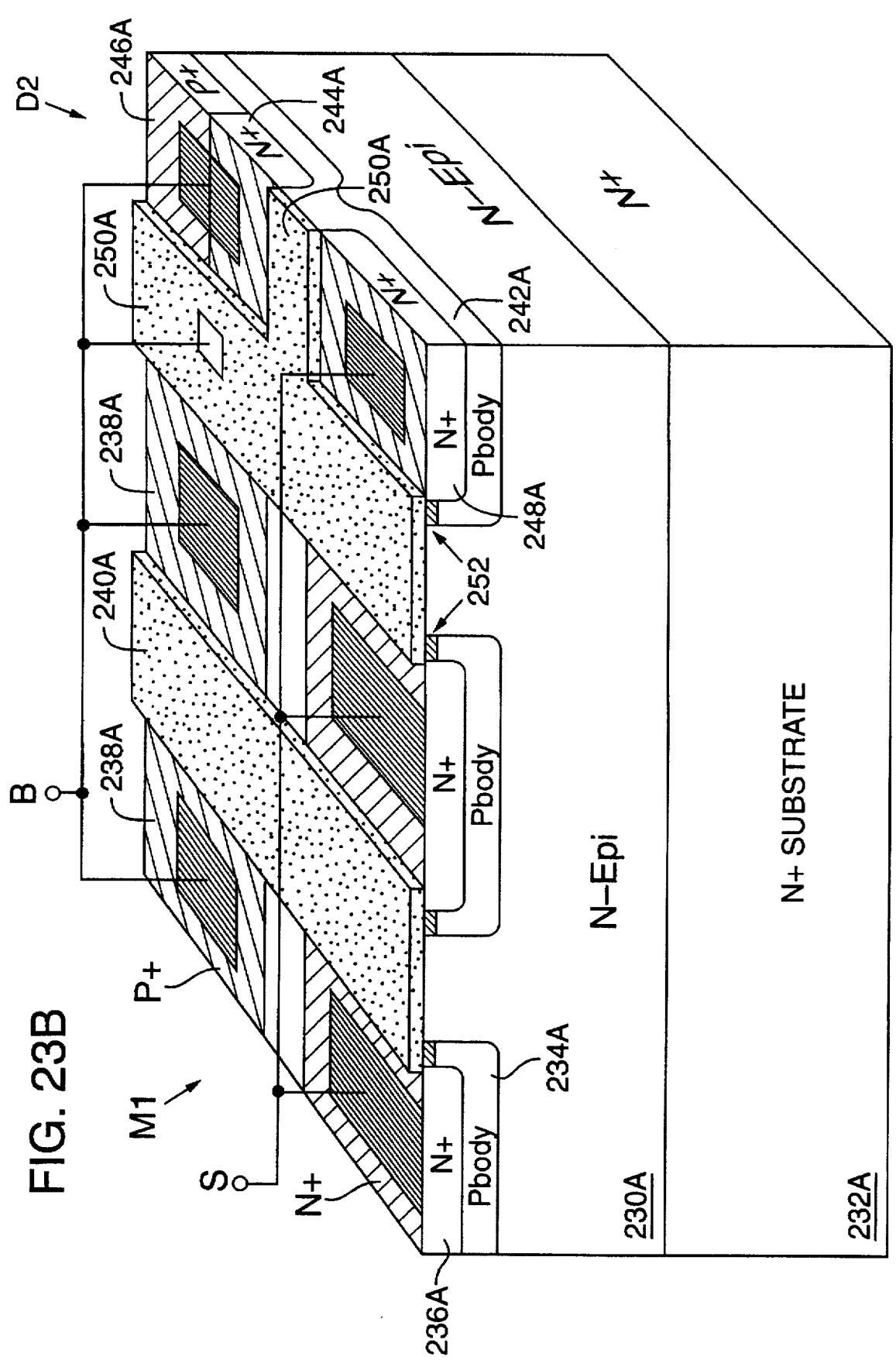
FIG. 23B illustrates a three-dimensional cross-sectional view of a modified version of the MOSFET of FIG. 23A.

FIG. 23B illustrates a three-dimensional view of a modified version of the embodiment of FIG. 23A. DMOSFET M1 includes a P-body region 234A, an N+ source region 236A and a gate 240A. Contact with P-body region 234A is made in the third dimension by means of a P+ contact region 238A. Pseudo-Schottky diode D2 includes an N+ source region 244A and a P+ body contact region 246A, which provides contact with a P-body region 242A. P+ body contact regions 238A and 246A are tied together and with a gate 250A of pseudo-Schottky diode D2. Pseudo-Schottky diode D2 also includes an N+ drain region 248A, which is tied to N+ source region 236A. An arm of gate 250A controls the current flow in channel regions 252, which actually form a part of MOSFET M1. Since gate 250A would not be driven as high as gate 240A, the current through channel regions 252 would not be as large as the current in the channel regions lying under gate 240A. This modest penalty is more than compensated for, however, by the efficient use of the surface area of the chip. The current in pseudo-Schottky diode D2 flows laterally between N+ source region 244A and N+ drain region 248A.

FIG. 24 illustrates a cross sectional view of a trench-gated version of MOSFET M1. The MOSFET is formed in an N-epitaxial layer 260 overlying an N+ substrate 262, which serves as the drain of the device. The gate 266 is formed in a series of trenches at the top surface of N-epitaxial layer 260. MOSFET M1 also includes a P-body region 262 and an N+ source region 264. Pseudo-Schottky diode D2 includes a P body region 263, a P+ body contact region 264, an N+ source region 266 and an N+ drain region 268, the latter being connected to the N+ source region 264 of MOSFET M1. P+ body contact region 264 and N+ source region 266 are connected through a metal layer to a drain 270 of pseudo-Schottky diode D2. As shown, in the third dimension the source-body-gate (anode) terminal of pseudo-Schottky diode D2 is connected via a wire or other conductive path to a P+ body contact region 272 at the top surface of the device, which adjoins P body region 262. In this way, the anode of pseudo-Schottky diode D2 is connected to the body of MOSFET M1. Also, as shown, the N+ drain region 268 of pseudo-Schottky diode D2 is tied to the N+ source region 264 of MOSFET M1.

Figure 25A:
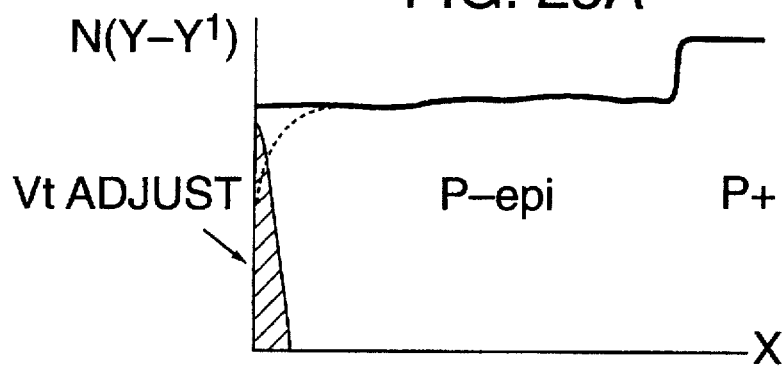
FIG. 25A illustrates a graph showing a profile of the dopant concentration along the axis Y—Y' of the lateral MOSFET of FIG. 25B formed in an epitaxial layer.
Figure 25B:
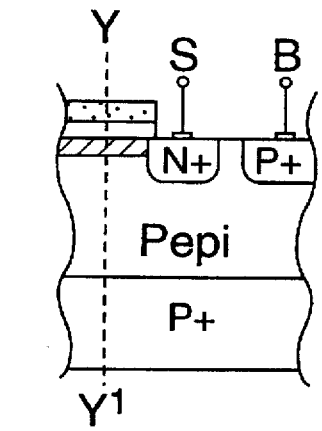

FIG. 25A shows a dopant profile of the lateral MOSFET shown in cross-section in FIG. 25B (which is similar to the lateral MOSFET of FIG. 21), taken along the Y—Y' axis. The vertical axis of FIG. 25A corresponds to the surface of the MOSFET and the horizontal axis represents the distance below the surface. As shown, the P-epitaxial layer is doped quite heavily (e.g., to a resistivity of from 40 to 3 mΩ-cm) and a shallow threshold adjust implant is introduced at the surface to lower the threshold voltage of the MOSFET.

Figure 26A:
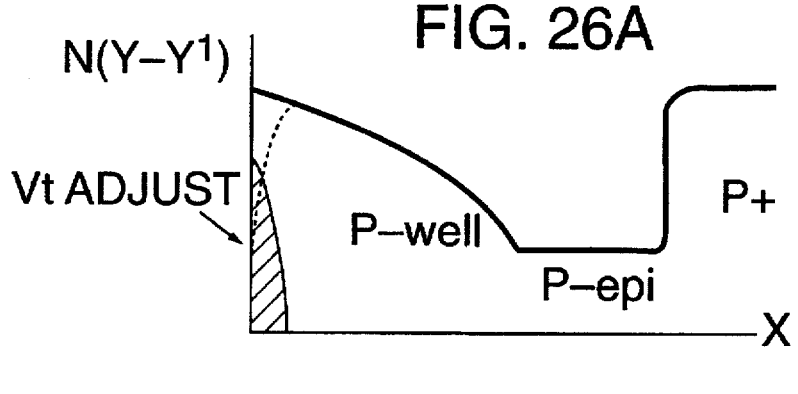
FIG. 26A illustrates a graph showing a profile of the dopant concentration along the axis Y—Y' of the lateral MOSFET of FIG. 26B formed in a well.
Figure 26B:
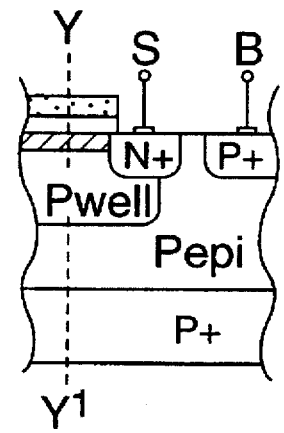
Figure 27A:
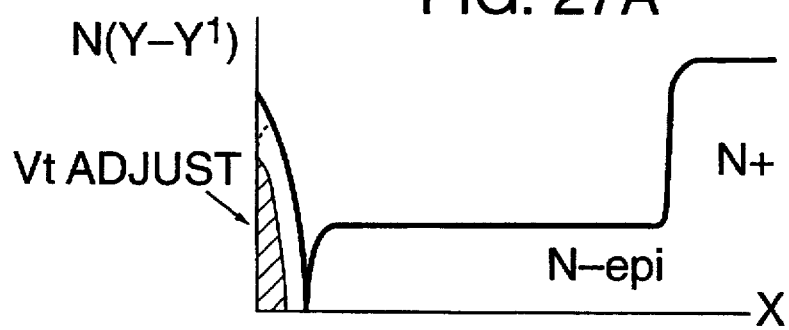
FIG. 27A illustrates a graph showing a profile of the dopant concentration along the axis Y—Y' of the double-diffused MOSFET of FIG. 27B.
Figure 27B:
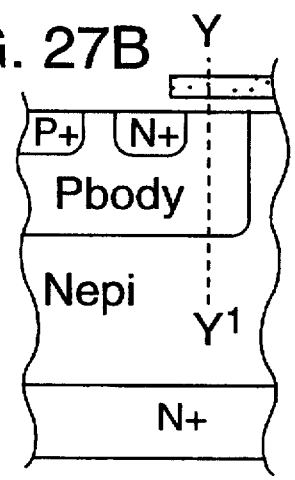

FIGS. 26A and 27A are similar dopant profiles of the dopant concentrations of the MOSFETs shown in FIGS. 26B and 27B along the Y—Y' axes. The MOSFET of FIG. 26B is a lateral MOSFET formed in a P-well. As shown in FIG. 26A, the P-well is heavily doped in comparison to the P-epitaxial layer, and again this heavy dopant concentration is countered by a shallow threshold adjust implant at the surface of the MOSFET. The MOSFET of FIG. 27B is a DMOSFET similar to the MOSFET shown in FIG. 23A. The P body is doped heavily but is counterdoped by a threshold adjust implant. FIGS. 25A–27A illustrate the general principle that the body effect is maximized by doping the body to a heavy concentration $N_B$, and then the threshold voltage is adjusted downward by introducing a shallow threshold adjust implant at the surface of the channel region.

FIGS. 28A–28C illustrate the behavior of the drain current as a function of the drain voltage ($V_{DS}$) in a MOSFET of this invention at temperatures of –20° C., 25° C. and 60° C., respectively. In one set of curves (solid lines) the source and body are shorted together ($V_{SB}$=0 V) and in another set of curves (dashed lines) the body is forward-biased by 0.5 V with respect to the source ($V_{SB}$=–0.5 V). The curves represent gate voltages ($V_{GS}$) of 0.9 V, 1.2 V, 1.7 V and 3.0 V, and are arranged in pairs with the arrows between the two related curves indicating the increase in the drain current as the body bias is changed from $V_{SB}$=0 V to $V_{SB}$=–0.5 V. In each instance, the drain current increases significantly when the source-body junction of the MOSFET is forward-biased by 0.5 V as compared to the condition where the source and body are shorted. Note, for example, that while the highest saturation current at $V_{GS}$=3.0 V decreases from 0.65 A to 0.56 A to 0.50 A with increasing temperature, in each instance the saturation current is about 14% higher when the body is biased at –0.5 V. At $V_{GS}$=1.2 V the absolute value of the higher saturated current is only 0.8 A at every temperature, but the magnitude of the increase from $V_{SB}$=0 to $V_{SB}$=–0.5 V is much larger on a percentage basis.

Figure 28D:
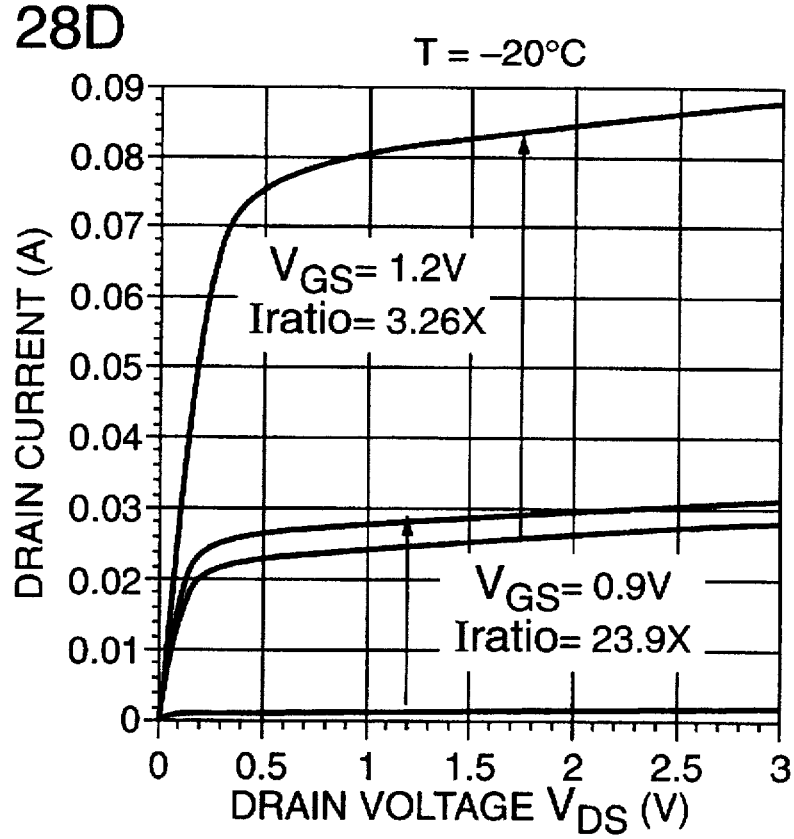
FIGS. 28D and 28E are detailed views showing portions of the graphs illustrated in FIGS. 28A and 28B.
Figure 28E:
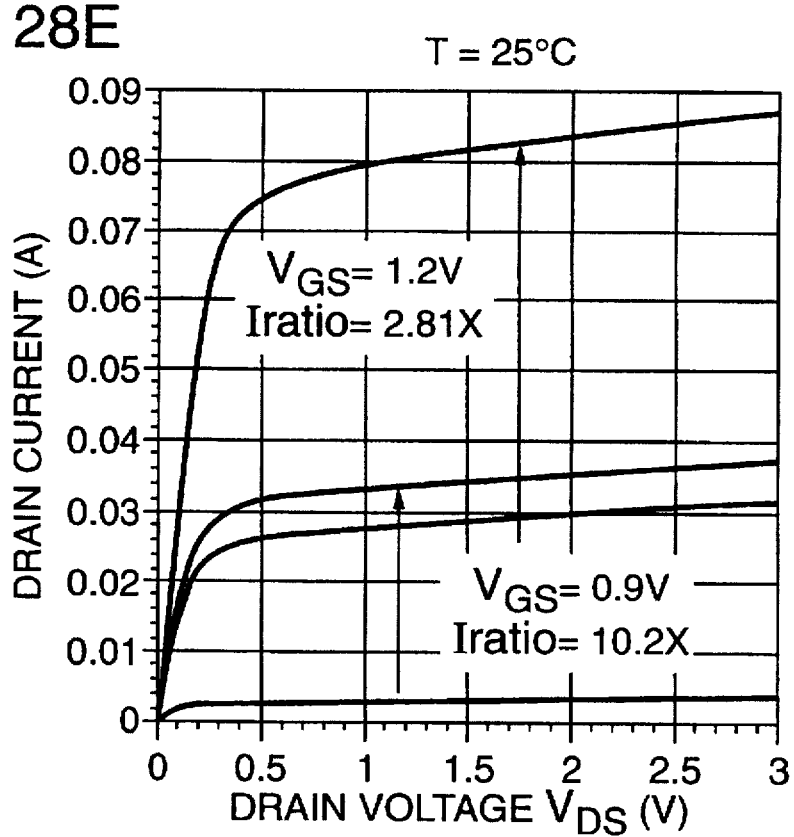

The situation with low drain currents is more clearly shown in FIGS. 28D and 28E, which show the drain currents at –20° C. and 25° C., respectively, for a $V_{GS}$ equal to 0.9 V and 1.2 V. The arrows indicate the shift of the drain current upward from the condition where $V_{SB}$=0 V to the condition where $V_{SB}$=–0.5 V. At $V_{GS}$=1.2 V, the drain current increases by a factor of 3.26 at –20° C. and 2.81 at 25° C. At $V_{GS}$=0.9, the improvements are much greater because the gate bias is only slightly above the threshold voltage of the device: the drain current increases by a factor of 23.9 at –20° C. and by a factor of 10.2 at 25° C.

FIGS. 29A and 29B show the drain current as a function of $V_{DS}$ at temperatures of –20° C., 25° C. and 60° C. and for source-body voltages of 0 V and –0.5 V. FIG. 29A is plotted on linear paper and FIG. 29B is plotted on semilog paper. Without body biasing, the maximum current at any temperature is less than 5 mA, and the magnitude of the current increases with increasing temperature. This occurs because the threshold voltage decreases with increasing temperature. One disadvantage of a positive temperature coefficient of current is the risk of hot spot formation in the device, as the hotest areas conduct the most current.

In contrast, with body biasing, the peak current ranges from 27 mA to 40 mA and decreases with increasing temperature. This occurs because, in the body biased condition, the sensitivity of the current to threshold voltage is reduced, and the decrease in the carrier mobility with increasing temperature becomes the dominant mechanism. While the variation of the drain current with temperature appears greater in the body biased case, on a percentage basis it varies by only ±15%. Viewing the same data on semilog paper in FIG. 29B, with no body bias the saturation current varies by +39% as the temperature increases from 25° C. to 60° C. and by –99% as the temperature falls from 25° C. to −20° C. In other words, at the cold temperature the device nearly turns off when $V_{SB}=0$ V.

Figure 30:
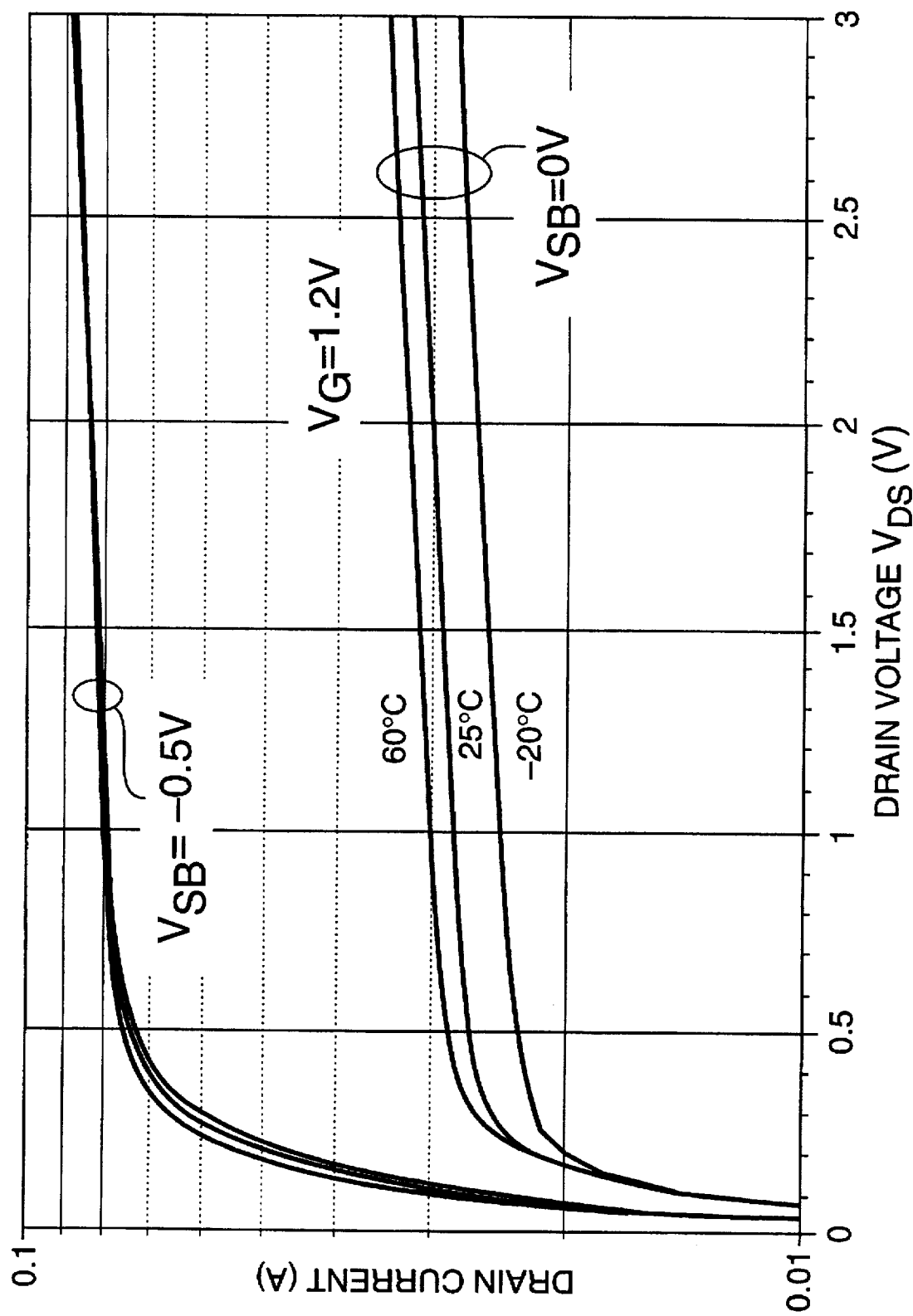
FIG. 30 illustrates a graph showing drain current as a function of drain voltage in conventional and body-biased MOSFETs at temperatures of −20° C., 25° C. and 60° C., respectively, and at a gate voltage of 1.2 V.

FIG. 30, which is similar to FIG. 29B except that $V_{GS}=1.2$ V, illustrates another advantage of a MOSFET fabricated in accordance with this invention. When the body bias of −0.5 V is applied, the three curves merge and the drain current becomes almost entirely independent of temperature. This phenomenon occurs because the carrier mobility decrease with increasing temperature is almost exactly cancelled by the drop in the threshold voltage. The conventional device still shows a variation of ±15% over the range of temperatures plotted.

FIG. 31 shows a graph of the drain current as a function of temperature in the linear region of the device. (The curves are identified by the designation "$TC_{x,y}$", where x is the gate voltage $V_{GS}$ and y is the body bias $V_{BS}$.) The curves for $V_{GS}=0.9$ exhibit a positive slope while for all of the other cases the sensitivity to threshold shift is negligible or negative. As noted above, positive temperature coefficient of drain current is undesirable because it can lead to hot spots and current crowding, phenomena that normally plague bipolar transistors but not MOSFETs. By body biasing to −0.5 V, the positive temperature coefficient of current is reduced by a factor of approximately three, and by further optimization of the fabrication process the temperature coefficient of current for the body-biased version could remain negative over the desired range of voltages.

To understand the variation of drain current with temperature we must consider that the equation for drain current has two terms with pronounced temperature dependence—carrier mobility $\mu(T)$ and threshold voltage $V_{to}(T)$. An increase in temperature lowers the carrier mobility which tends to decrease the drain current. This decrease is partially or completely counterbalanced by an increase in the effective gate overdrive term ($V_{GS}-V_t$) resulting from the reduction in the threshold voltage ($V_t$) which accompanies higher temperatures. Which term is dominant depends on the value of $V_{GS}$ which acts as a weighing factor between the two terms. Specifically, the drain current ($I_D$) is expressed as a function of $\mu(T)$ and $V_{to}(T,V_{SB})$ as follows:

$$I_D = \frac{\mu(T)W}{2L} C_{ox}(V_{GS}-V_{to}(T,V_{SB}))^2 \qquad (22)$$

$$\frac{dI_D}{dT} = \frac{d\mu(T)}{dT} \cdot \frac{C_{ox}W}{2L}(V_{GS}-V_{to}(T,V_{SB}))^2 - \qquad (23)$$

$$\frac{\mu(T)}{L} C_{ox}(V_{GS}-V_{to}(T,V_{SB})) \frac{dV_{to}(T,V_{SB})}{dT}$$

$$\frac{dI_D}{dT} = \qquad (24)$$

$$I_D \cdot \left[ \frac{1}{\mu(T)} \cdot \frac{d\mu(T)}{dT} - \frac{2}{(V_{GS}-V_{to}(T,V_{SB}))} \cdot \frac{dV_{to}(T,V_{SB})}{dT} \right]$$

From equation (23) it is apparent that a negative $d\mu/dT$ decreases the drain current and a negative $dV_{to}/dT$ increases the drain current. When $V_{GS}$ is small the second term is important while when $V_{GS}$ is large the second term is negligible. To find the point where the opposing effects cancel each other we set:

$$\frac{dI_D}{dT} = 0 \qquad (25)$$

$$\frac{d\mu(T)}{dT} \cdot \frac{C_{ox}}{2L}(V_{GS}-V_{to}(T,V_{SB}))^2 = \qquad (26)$$

-continued $$\frac{\mu(T)}{L} C_{ox}(V_{GS}-V_{to}(T,V_{SB})) \frac{dV_{to}(T,V_{SB})}{dT}$$

$$V_{GS}(OTC) = \frac{2 \cdot \mu(T)}{\left[\frac{d\mu(T)}{dT}\right]} \cdot \frac{dV_{to}(T,V_{SB})}{dT} + V_{to}(T,V_{SB}) \qquad (27)$$

The zero temperature coefficient point is therefore a gate enhancement voltage above $V_{to}$. By reducing the value of $V_{to}$ using body biasing, the temperature-independent operating point can be located near the point where $V_{GS}=1.2$ V.

Figure 32B:
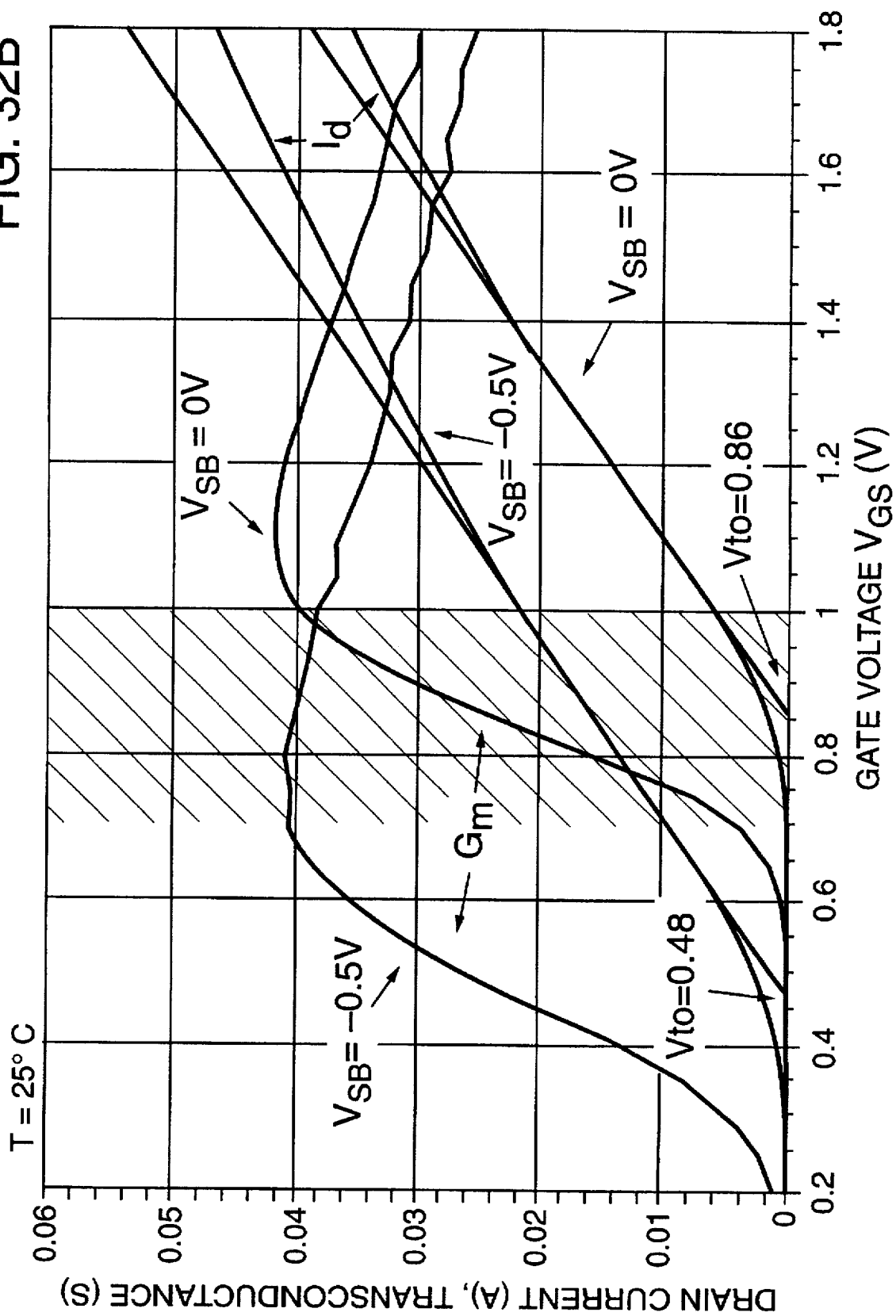

FIGS. 32A–32C show the gate characteristics of a MOSFET according to this invention in the linear region at temperatures of −20° C., 25° C. and 60° C., respectively. The drain current and transconductance are shown as a function of $V_{GS}$ for the body-biased condition ($V_{SB}=-0.5$ V) (solid line) and for the condition in which the body is shorted to the source ($V_{SB}=0$ V) (dashed line). Using a widely accepted technique in the semiconductor industry, an extrapolated value of $V_{to}$ is determined by constructing a tangent to the drain current curves at the point where the transconductance is a maximum. FIG. 32A shows that biasing the body shifts $V_{to}$ downward 350 mV at −20° C.; FIG. 32B shows that biasing the body shifts $V_{to}$ downward 380 mV at room temperature; and FIG. 32C shows that biasing the body shifts $V_{to}$ downward 430 mV at 60° C. FIG. 33 plots $V_{to}$ as a function of temperature for $V_{SB}=-0.5$ V and $V_{to}=0$ V on the left vertical axis, and the shift in threshold voltage ($^\Delta V_{to}$) between these conditions of $V_{SB}$ on the right-hand vertical axis. The threshold voltage varies by 1.75 mV/° C. when $V_{SB}=0$ V and by −2.74 mV/° C. when $V_{SB}=-0.5$ V. In every case, body biasing lowers the threshold voltage. Moreover, the advantages are the greatest when the temperature is high and carrier mobility is impaired.

FIG. 34 illustrates the full linear region subthreshold characteristics of a MOSFET at $V_{SB}=-0.5$ V and $V_{SB}=0$ V. The drain current is plotted against the gate voltage at temperatures of −20° C., 25° C. and 60° C., with the drain-to-source voltage ($V_{DS}$) being equal to 0.1 V. The shift in current to lower gate biases when the body is biased is clearly visible. The points at which the current is independent of temperature are also apparent: 1.2 V without body biasing and 0.95 V with body biasing. Currents below these points have a positive temperature coefficient (increase with increasing temperature), and currents above these points have a negative temperature coefficient (decrease with increasing temperature).

Figure 35:
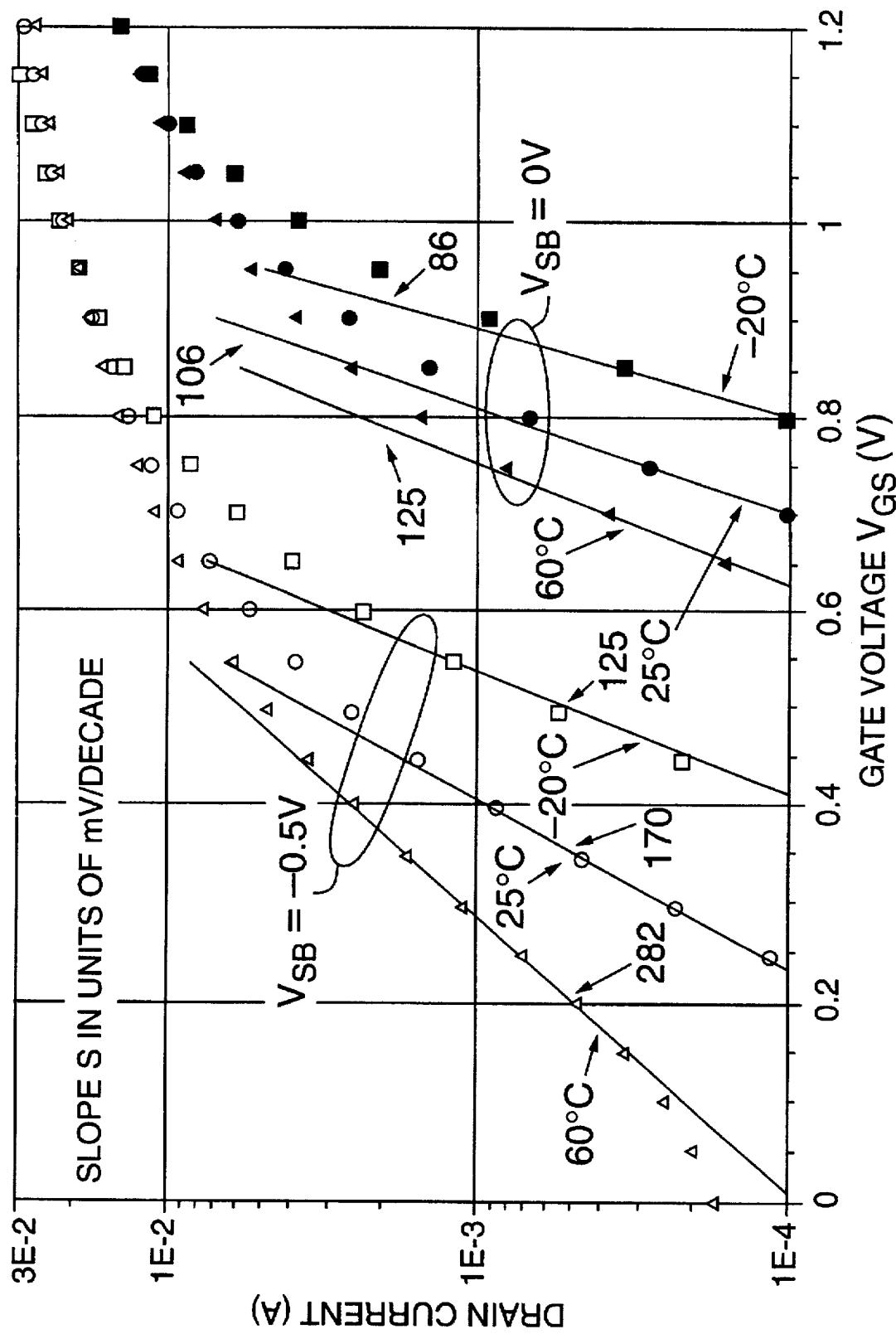
FIG. 35 illustrates a graph showing the slope of the curves shown in FIG. 34.

Like FIG. 34, FIG. 35 illustrates a plot on semilog paper of the subthreshold conduction curves of conventional and body-biased MOSFETs over a range of $V_{GS}$ from 0 to 1.2 V. The subthreshold slope S (given in units of mV/decade of current) illustrates the rate at which the MOSFET goes from its off-state to its on-state as a function of $V_{GS}$, the steeper the slope (lower number) the better. While body-biasing adversely affects the slope by a factor of 1.5 to 2, FIG. 35 clearly shows that a lower $V_{GS}$ is required to turn the MOSFET on when it is body-biased.

Figure 36:
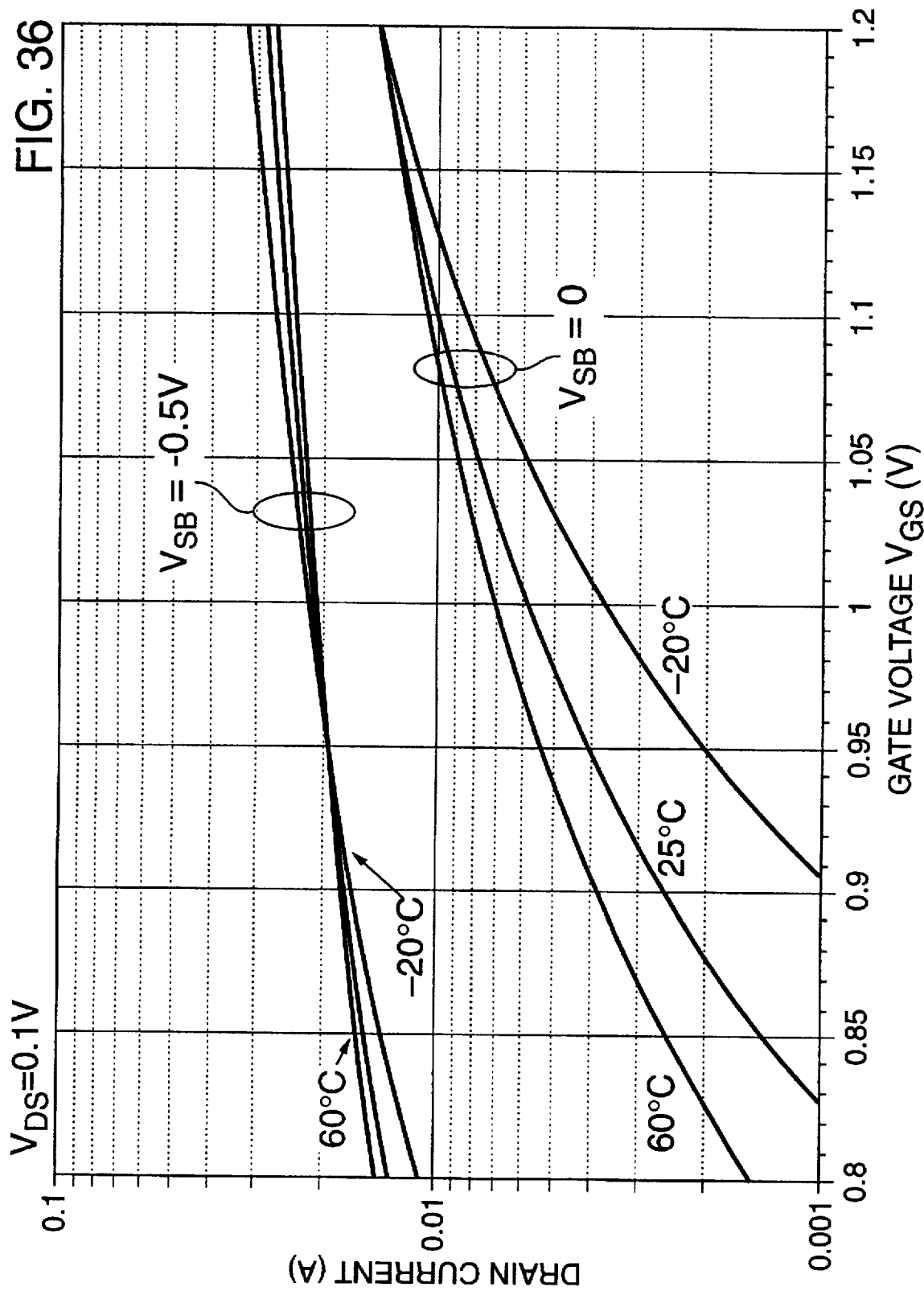
FIG. 36 illustrates a detailed graph similar to the graph of FIG. 34 for a range of gate voltages from 0.8 V to 1.2 V.

FIG. 36 shows a close-up of the curves shown if FIG. 34 in the region of particular interest (0.9 V–1.2 V). Note that the curves for $V_{SB}=-0.5$ V indicate that the current is practically independent of temperature throughout this range, whereas there is significant variation with temperature when the body biasing is omitted.

Figure 37:
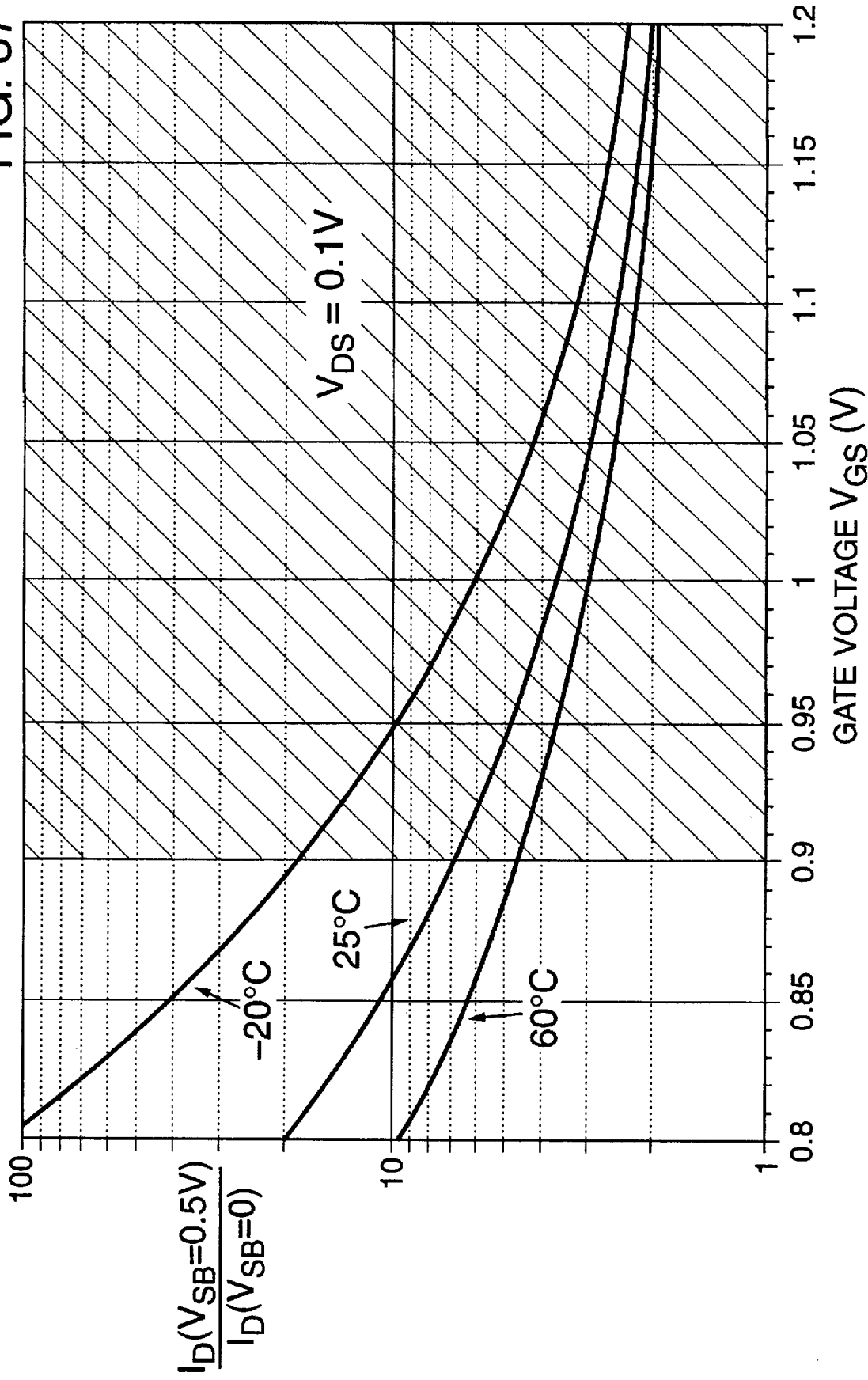
FIG. 37 illustrates a graph showing the ratio of drain currents in conventional and body-biased MOSFETs at temperatures of −20° C., 25° C. and 60° C., respectively, at a drain voltage of 0.1 V.
Figure 38:
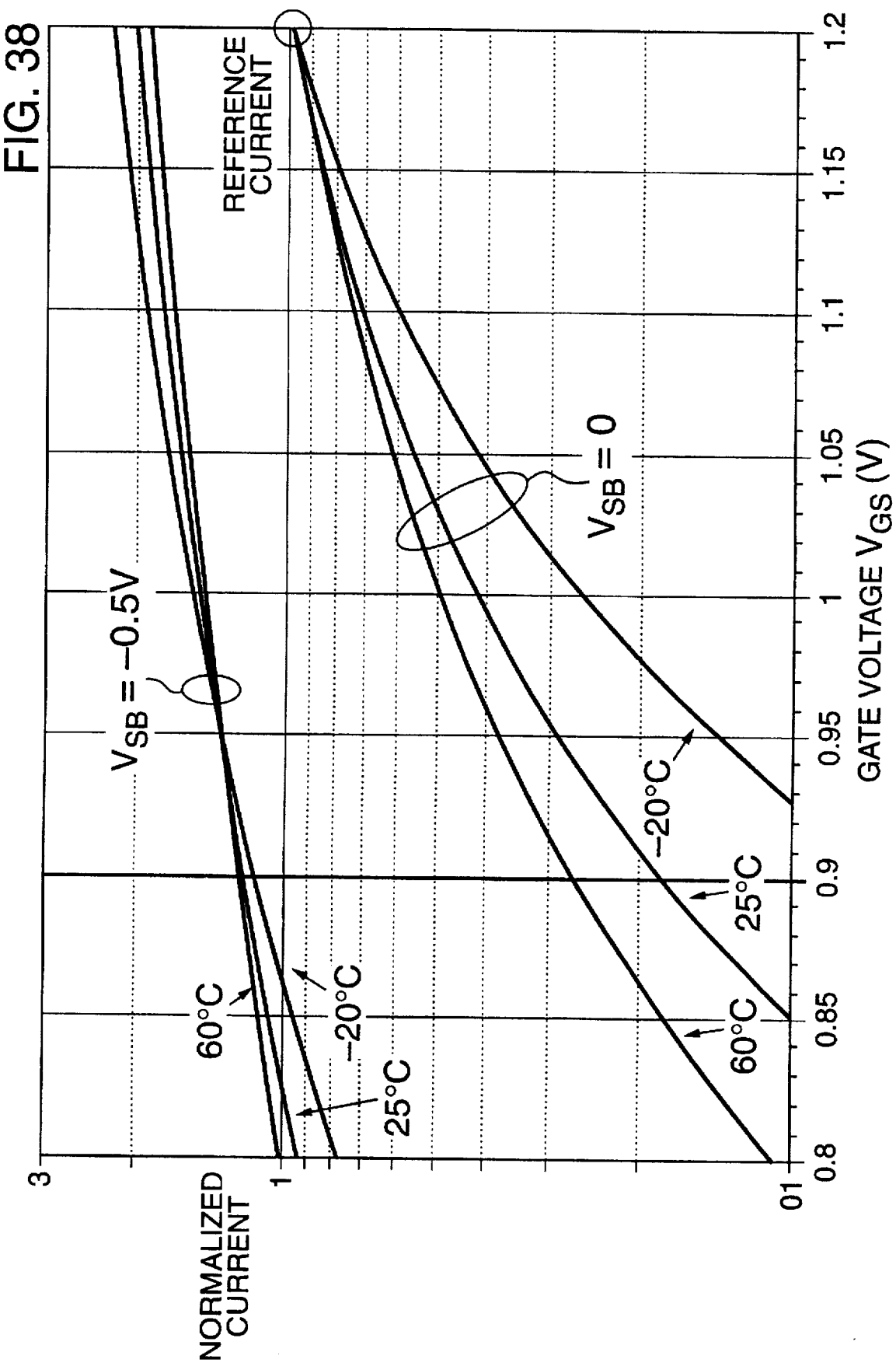
FIG. 38 illustrates a graph similar to the graph of FIG. 36 normalized for the drain current for the conventional MOSFET at a gate voltage of 1.2 V.

FIG. 37 illustrates the ratio of the drain currents at $V_{SB}=-0.5$ V and $V_{SB}=0$ V at temperatures of −20° C., 25° C. and 60° C. The advantages of body biasing are the greatest at low temperatures because of the dominance of the threshold effect. At $V_{GS}=0.9$ V, the current ratio is 4.6 at 60° C., 6.8 at room temperature, and nearly 20 at −20° C. At $V_{GS}=0.8$ V, the ratio approaches 100 at −20° C. FIG. 38 is identical to FIG. 36 except that the current values have been normalized to the current through the non-body biased devices at $V_{GS}=1.2$ V. Note that the currents for the body biased devices exceed those of the non-body biased devices over the entire range of interest (i.e., 0.9 to 1.2 V) and that the difference approaches an order of magnitude at $V_{GS}=0.9$ V.

FIG. 39A shows the resistivity in kΩ-μm of the body biased and non-body biased devices at temperatures of −20° C., 25° C. and 60° C. Since a MOSFET must be sized to meet a target on-resistance, the higher the resistivity the larger the required area. The resistance of a given MOSFET can be found be multiplying its geometric efficiency in packing gate perimeter W into the smallest possible area A. The resistance-area product is then $$R_{DS}A = \left(\frac{A}{W}\right) \cdot (R_{DS}W) \tag{28}$$

To meet a given specification for $R_{DS}$ the die area needed is:

$$A = \frac{R_{DS}A}{R_{DS}(spec)} = \frac{\left(\frac{A}{W}\right)(R_{DS}W)}{R_{DS}(spec)} \tag{29}$$

For the same geometry (hence constant A/W) and the specified $R_{DS}(spec)$, halving $R^{DS}W$ leads to a halving of the die size. At $V_{GS}=0$, which is the worst case gate drive condition (largest die), the improvement in $R_{DS}W$ at room temperature shown by FIG. 39A is:

$$\frac{R_{DS}W(V_{SB} = 0.5)}{R_{DS}W(V_{SB} = 0)} = \frac{93}{600} \tag{30}$$

or roughly a factor of six. At higher temperatures the benefits are even greater.

Figure 39B:
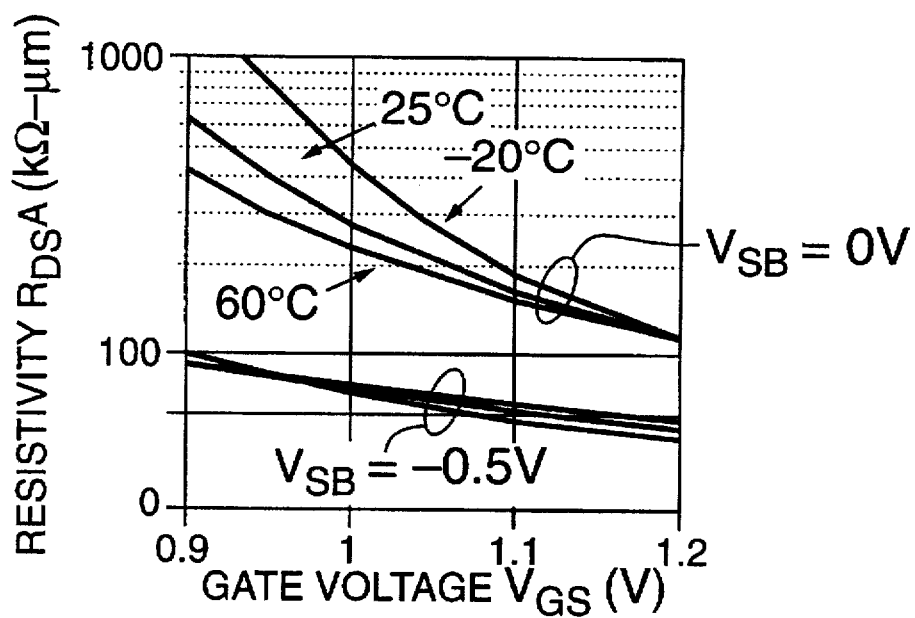
FIG. 39B illustrates a detailed view of a portion of the graph of FIG. 39A.

FIG. 39B illustrates a detailed view of the portion of the graph of FIG. 39A where $V_{GS}$ is between 0.9 V and 1.2 V.

Figure 40B:
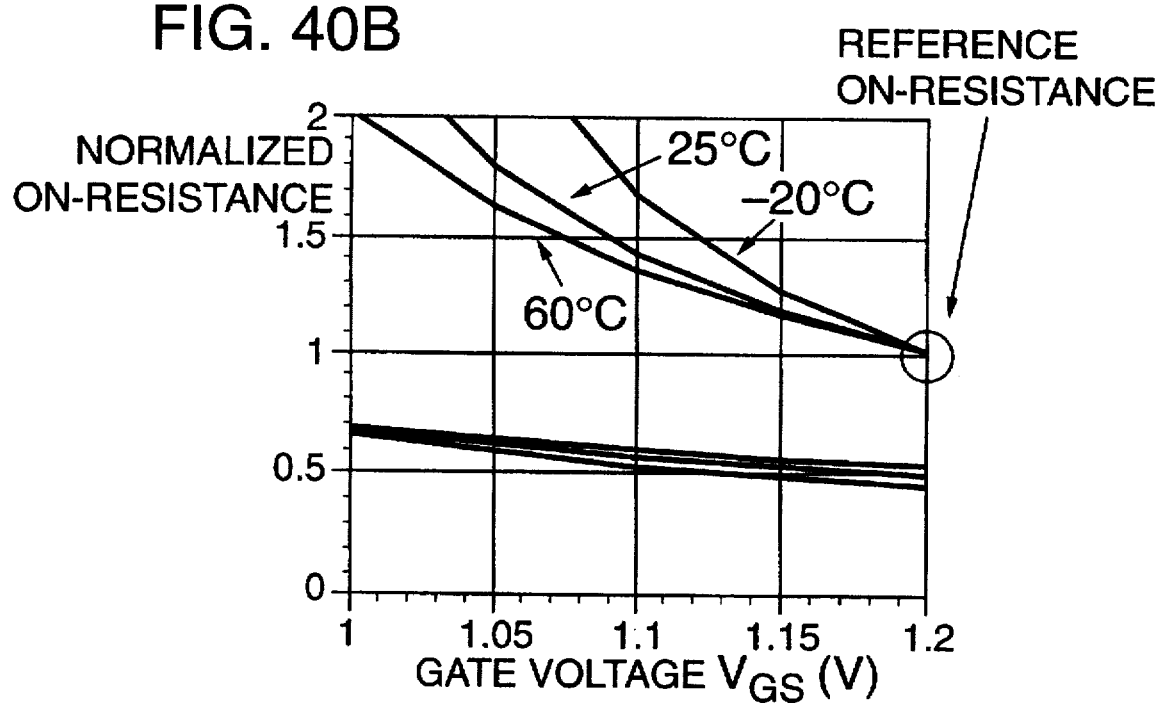
FIGS. 40A and 40B illustrate graphs showing the on-resistance of conventional and body-biased MOSFETs as a function of gate voltage at temperatures of −20° C., 25° C. and 60° C.
Figure 40A:
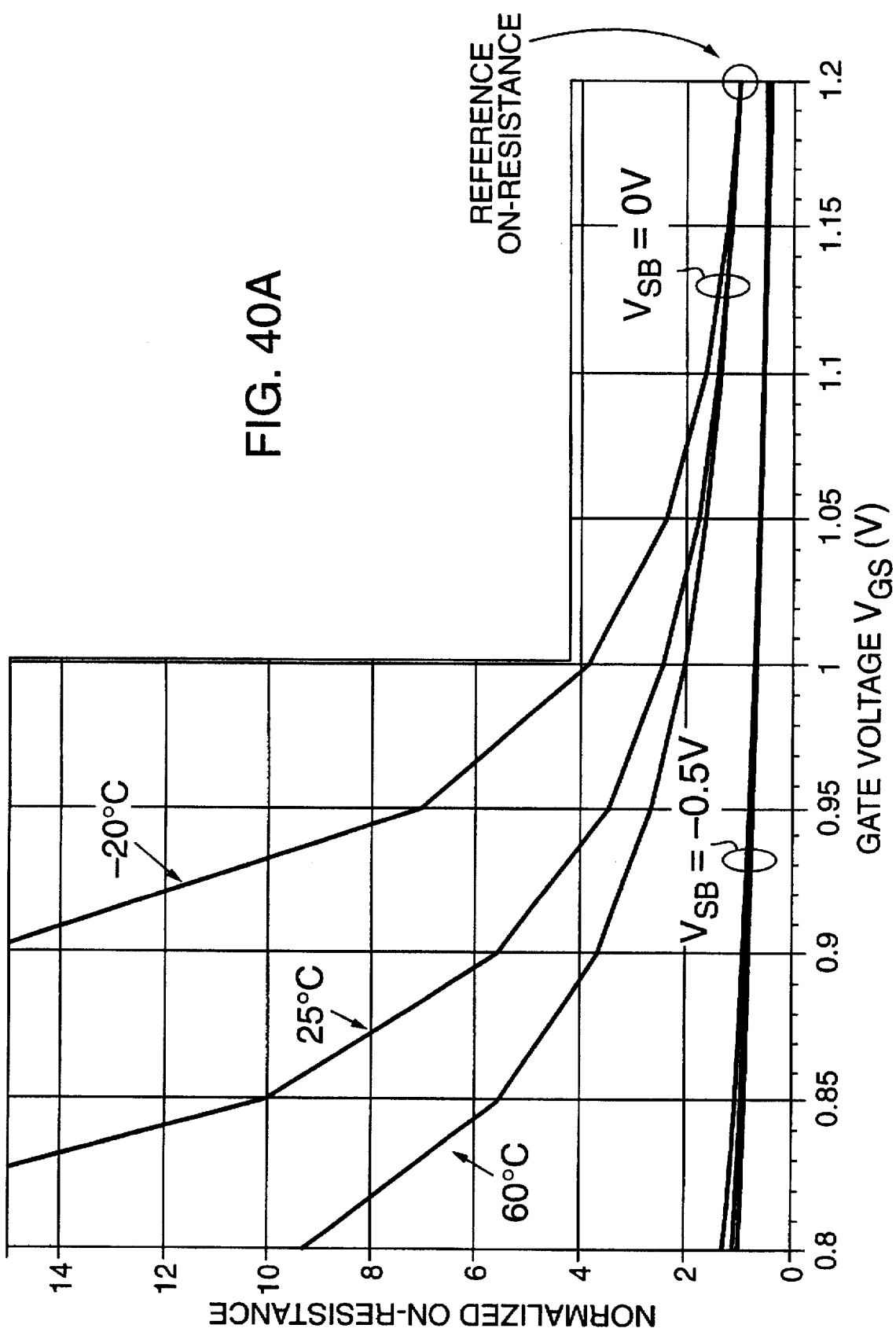

FIG. 40A shows the same data normalized such that the resistance of the non-body biased devices is equal to one at $V_{GS}=1.2$ V. FIG. 40B is a close-up of the interval from $V_{GS}=1.0$ V to $V_{GS}=1.2$ V. Note that with body-biasing the normalized resistance is 0.5 as compared to 1 for the conventional device at $V_{GS}=1.2$ V. At $V_{GS}=1.0$ V, the resistancek of the conventional device has more than doubled while the resistance of the body-biased device is only about 15% higher. At $V_{GS}=0.9$ V, the resistance of the body-biased device is still not as high as the resistance of the conventional device at $V_{GS}=1.2$ V, and at a temperature of −20° C. it is less than the resistance of the conventional device by a factor of 15.

Figure 41:
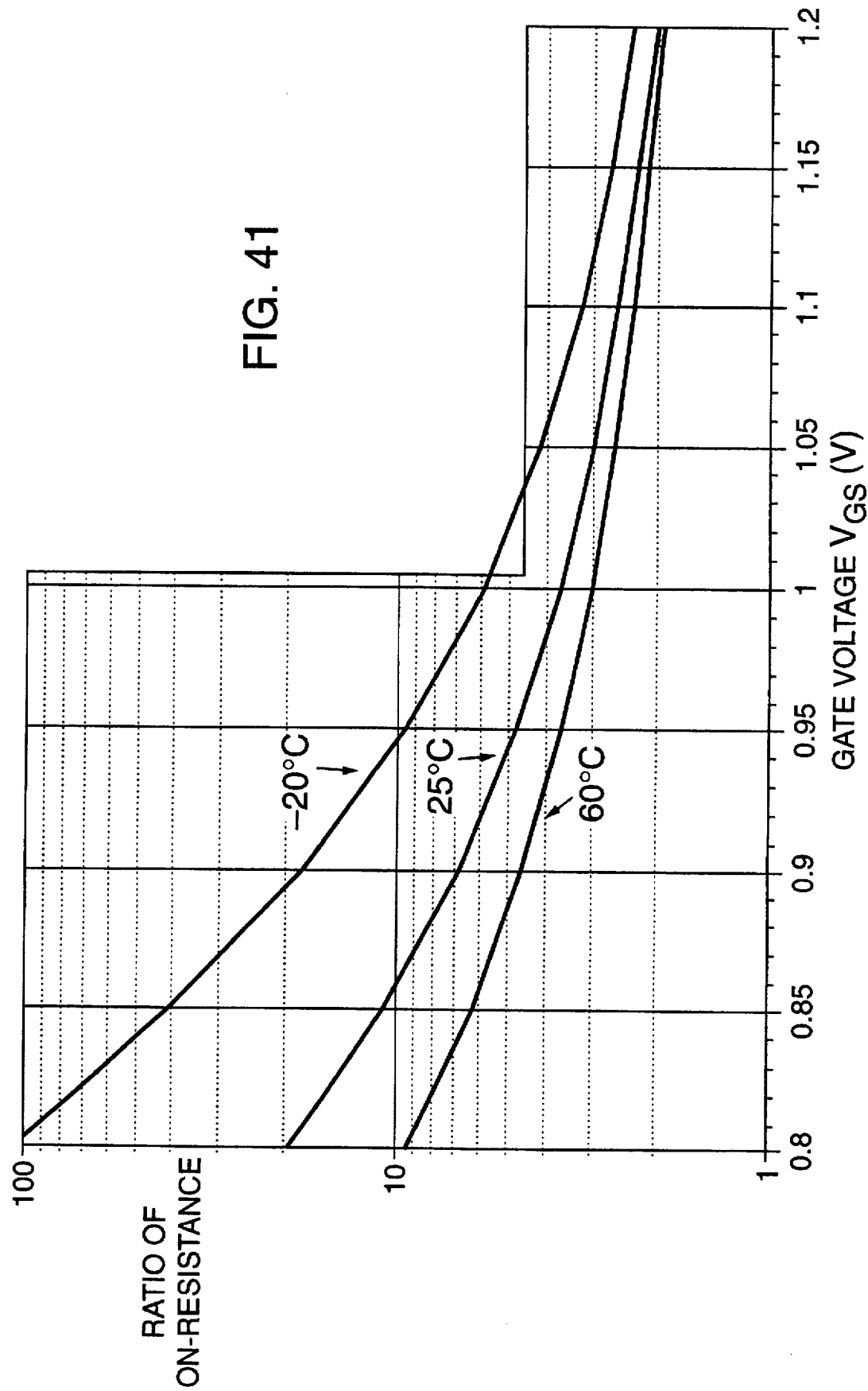
FIG. 41 illustrates a graph showing the ratio of the on-resistance of conventional and body-biased MOSFETs as a function of gate voltage at temperatures of −20° C., 25° C. and 60° C.

FIG. 41 uses the data of FIG. 40A to show the ratio of the performance of the body-biased and conventional devices (in terms of on-resistance) for each of the $V_{GS}$ and T conditions shown in FIG. 40A. Note that at $V_{GS}=1.2$ V body-biasing reduces the resistance by a factor of two, and that at $V_{GS}=0.9$ V the improvement is eighteen-fold at −20° C. and eight-fold at room temperature.

The foregoing description is intended to be illustrative and not limiting. Many additional and modified embodiments of this invention will be apparent to those skilled in the art, and all such embodiments are intended to be covered by the following claims.

I claim:

1. A method of switching a current on and off comprising the steps of:

providing a MOSFET, the MOSFET comprising first and second regions of a first conductivity type formed in a semiconductor substrate and separated by a body region of a second conductivity type, and a gate separated from channel region within the body region by a dielectric layer, neither of the first and second regions being shorted to the body region;

applying a voltage $V_{DS}$ across the first and second regions;

applying a voltage $V_G(on)$ to the gate so as to cause a current to flow between the first and second regions through the channel region;

applying a voltage $V_B$ to the body region so as to forward-bias a PN junction between the body region and the second region, the voltage $V_G$ being set at a level such that a resulting forward-bias across the PN junction is not sufficient to cause a substantial current to flow across the PN junction;

applying a voltage $V_G(off)$ to the gate so as to terminate the flow of current between the first and second regions through the channel region; and removing the voltage $V_B$ from the body region.

2. The method of claim 1, wherein the step of applying the voltage $V_G(on)$ to the gate and the step of applying the voltage $V_B$ to the body region are performed simultaneously.

3. The method of claim 2, wherein the step of applying the voltage $V_G(off)$ to the gate and the step of removing the voltage $V_B$ from the body region are performed simultaneously.

4. The method of claim 1 wherein the step of applying the voltage $V_G(off)$ to the gate and the step of removing the voltage $V_B$ from the body region are performed simultaneously.

5. A power MOSFET switch for switching a current to a load, the power MOSFET switch comprising:

a four-terminal MOSFET having first, second gate and body terminals, no one of the terminals being shorted to any of the other terminals;

a first switch connected between the first and gate terminals;

a second switch connected between the first and body terminals;

wherein the first and second switches are ganged together, the first switch passing a voltage $V_G(on)$ to the gate terminal and the second switch passing a voltage $V_B$ to the body terminal when the first and second switches are in a first position, the first switch passing a voltage $V_G(off)$ to the gate terminal and the second switch removing the voltage $V_B$ from the body terminal when the first and second switches are in a second position.

6. The power MOSFET switch of claim 5 wherein each of the first and second switches comprises a single-pole, double-throw switch, the first switch having a common terminal connected to the gate terminal, a first terminal connected to the voltage $V_G$ and a second terminal connected to the first terminal of the MOSFET, the second switch having a common terminal connected to the body terminal, a first terminal connected to the voltage $V_B$ and a second terminal connected to the first terminal of the MOSFET.

7. A power MOSFET switch arrangement comprising:

a four-terminal power MOSFET having source, drain, gate and body terminals, no one of the terminals being shorted to any of the other terminals; and a resistor connected between the gate and body terminals.

8. The power MOSFET switch arrangement of claim 7 further comprising a voltage clamping device connected between the body and source terminals.

9. The power MOSFET switch arrangement of claim 8 wherein the voltage clamping device comprises a diode.

10. The power MOSFET switch arrangement of claim 9 wherein the diode is a Schottky diode.

11. The power MOSFET switch arrangement of claim 8 wherein the voltage clamping device comprises a second MOSFET, the second MOSFET having source, gate and body terminals shorted to the body terminal of the power MOSFET and a drain terminal connected to the source terminal of the power MOSFET.

12. A power MOSFET switch arrangement comprising:

a four-terminal power MOSFET having source, drain, gate and body terminals, no one of the terminals being shorted to any of the other terminals; and a depletion-mode MOSFET connected between the gate and body terminals, the depletion-mode MOSFET having source, body and gate terminals shorted together.

13. The power MOSFET switch arrangement of claim 12 further comprising a voltage clamping device connected between the body and source terminals.

14. The power MOSFET switch arrangement of claim 13 wherein the voltage clamping device comprises a diode.

15. The power MOSFET switch arrangement of claim 14 wherein the diode is a Schottky diode.

16. The power MOSFET switch arrangement of claim 13 wherein the voltage clamping device comprises a second MOSFET, the second MOSFET having source, gate and body terminals shorted to the body terminal of the power MOSFET and a drain terminal connected to the source terminal of the power MOSFET.

17. A power MOSFET switch arrangement comprising:

a four-terminal power MOSFET having source, drain, gate and body terminals, no one of the terminals being shorted to any of the other terminals;

a resistor connected between the gate and body terminals; and a depletion-mode MOSFET connected between the source and body of the power MOSFET, the depletion-mode MOSFET having source and body terminals shorted together and a gate terminal connected to the gate of the power MOSFET.

18. The power MOSFET switch arrangement of claim 17 further comprising a voltage clamping device connected between the body and source terminals.

19. The power MOSFET switch arrangement of claim 18 wherein the voltage clamping device comprises a second MOSFET, the second MOSFET having source, gate and body terminals shorted to the body terminal of the power MOSFET and a drain terminal connected to the source terminal of the power MOSFET.

20. The power MOSFET switch arrangement of claim 17 further comprising a second depletion-mode MOSFET connected between the gate and body terminals of the power MOSFET, the depletion-mode MOSFET having source, body and gate terminals shorted together.

21. A power MOSFET switch arrangement comprising:

a power MOSFET having source, drain, gate and body terminals, no one of the terminals being shorted to any of the other terminals;

a voltage supply line;

a first inverter having an output terminal connected to the gate terminal and a power input terminal connected to the voltage supply line; and a second inverter having an output terminal connected to the body terminal and a power input terminal connected through a resistor to the voltage supply line.

22. The power MOSFET switch arrangement of claim 21 further comprising a voltage clamping device connected between the body and source terminals.

23. The power MOSFET switch arrangement of claim 22 wherein the voltage clamping device comprises a second MOSFET, the second MOSFET having source, gate and body terminals shorted to the body terminal of the power MOSFET and a drain terminal connected to the source terminal of the power MOSFET.

24. A power MOSFET switch arrangement comprising:

a power MOSFET having source, drain, gate and body terminals, no one of the terminals being shorted to any of the other terminals;

a voltage supply line;

a first inverter having an output terminal connected to the gate terminal and a power input terminal connected to the voltage supply line;

a second inverter having an output terminal connected to an input terminal of the first inverter and a power input terminal connected to the voltage supply line; and third and fourth MOSFETs connected in series between the voltage supply line and ground, a common node between the third and fourth MOSFETs being connected to the body terminal of the power MOSFET, the output terminal of the first inverter being connected to the gate of the third MOSFET and the output terminal of the second inverter being connected to the gate of the fourth MOSFET.

25. The power MOSFET switch arrangement of claim 24 further comprising a voltage clamping device connected between the body and source terminals of the power MOSFET.

26. A power MOSFET switch arrangement comprising:

a power MOSFET having source, drain, gate and body terminals, no one of the terminals being shorted to any of the other terminals;

a voltage supply line;

a first inverter having an output terminal connected to the gate terminal and a power input terminal connected to the voltage supply line;

a second inverter having an output terminal connected to the body terminal; and a voltage divider connected to the voltage supply line, a midpoint of the voltage divider being connected to a power input terminal of the second inverter.

27. The power MOSFET switch arrangement of claim 26 wherein the voltage divider comprises second and third MOSFETs, each of said second and third MOSFETs having source, body and gate terminals shorted together.

28. A power MOSFET switch arrangement comprising:

a power MOSFET having source, drain, gate and body terminals, no one of the terminals being shorted to any of the other terminals;

a voltage supply line;

a first inverter having an output terminal connected to the gate terminal and a power input terminal connected to the voltage supply line;

a second inverter having an output terminal connected to the body terminal; and a linear regulator connected to the voltage supply line, an output terminal of the linear regulator being connected to a power input terminal of the second inverter.

* * * * *

UNITED STATES PATENT AND TRADEMARK OFFICE
CERTIFICATE OF CORRECTION

PATENT NO. : 5,689,144
DATED : November 18, 1997
INVENTOR(S) : Williams, Richard K.

It is certified that error appears in the above-identified patent and that said Letters Patent is hereby corrected as shown below:

On the title page, item [54] and column 1, lines 1-3, the title should read --FOUR-TERMINAL POWER MOSFET SWITCH HAVING REDUCED THRESHOLD VOLTAGE AND ON-RESISTANCE AND METHOD OF SWITCHING A CURRENT--.

Figure 1A:
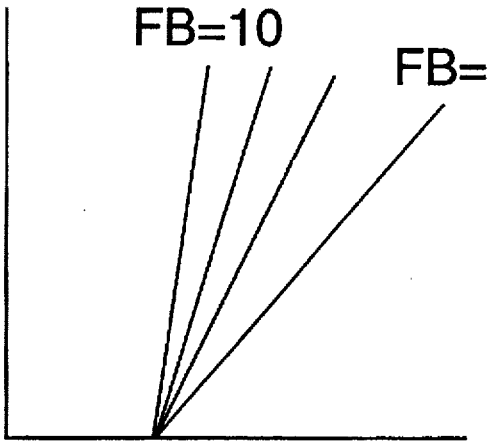
FIG. 1A illustrates a graph showing the output characteristic of a saturated bipolar transistor for various values of $I_c/I_b$.
Figure 1B:
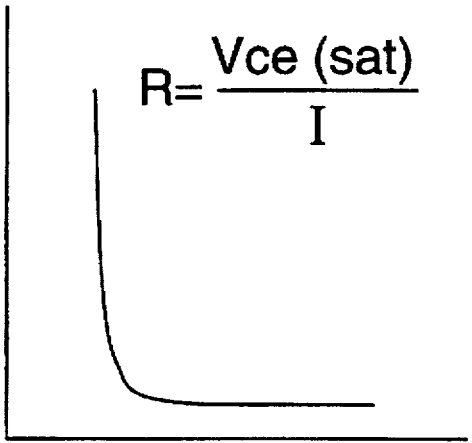
FIG. 1B illustrates a graph showing the collector-emitter resistance of a saturated bipolar transistor as a function of $V_{ce}$.
Figure 2:
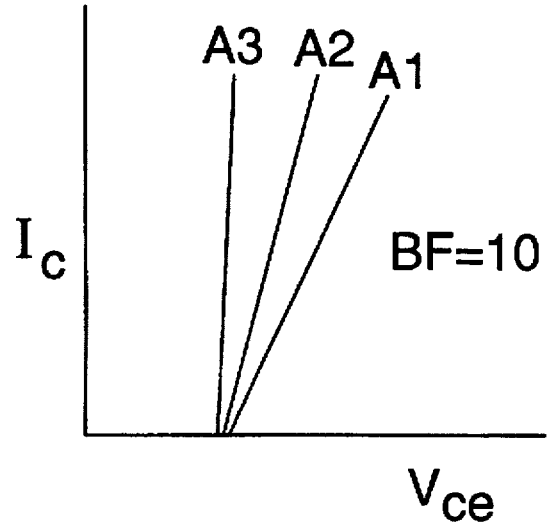
FIG. 2 illustrates a graph showing the effect of area scaling on the resistance $R_{ce}$ of a bipolar transistor.
Figure 3B:
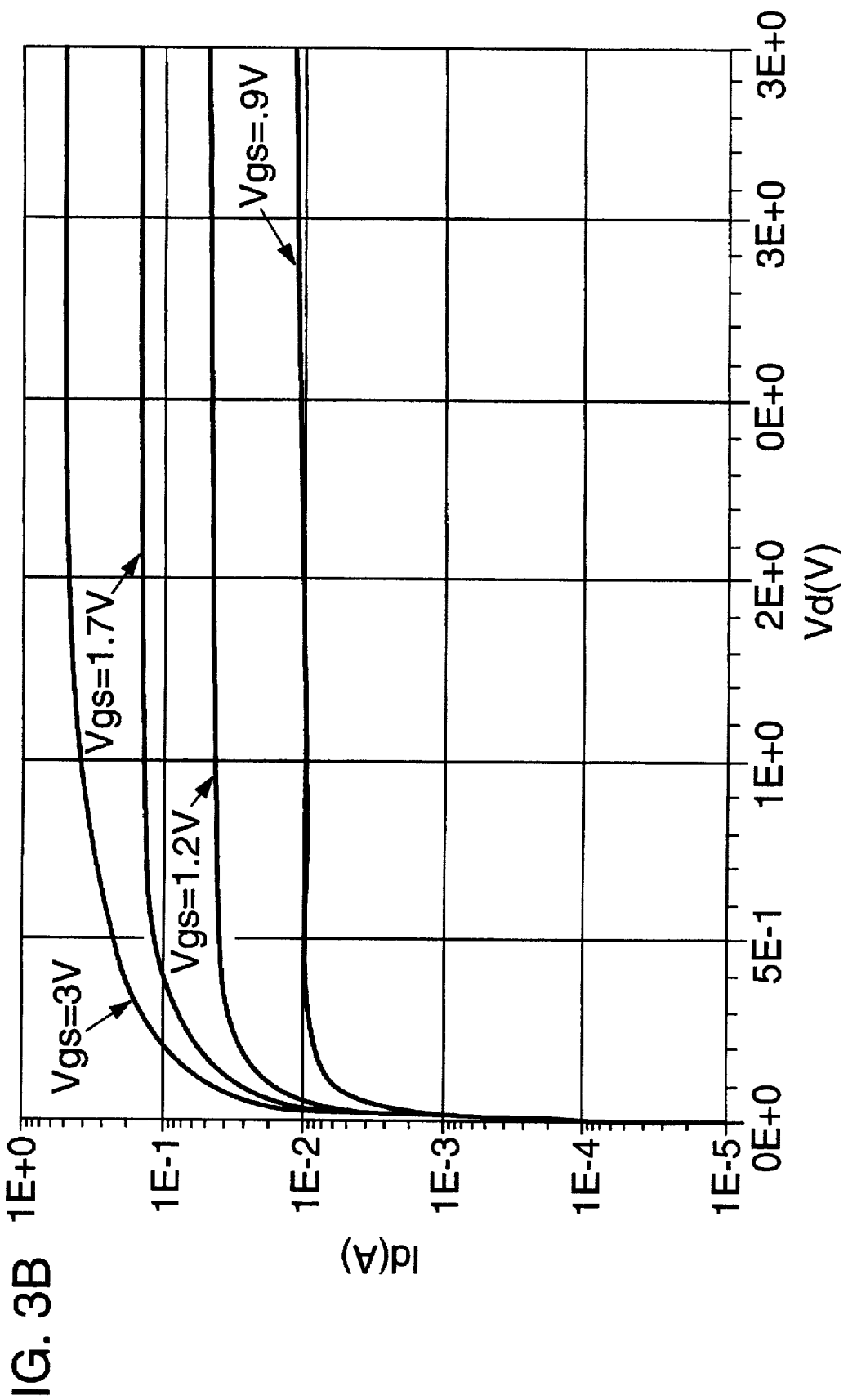
Figure 4:
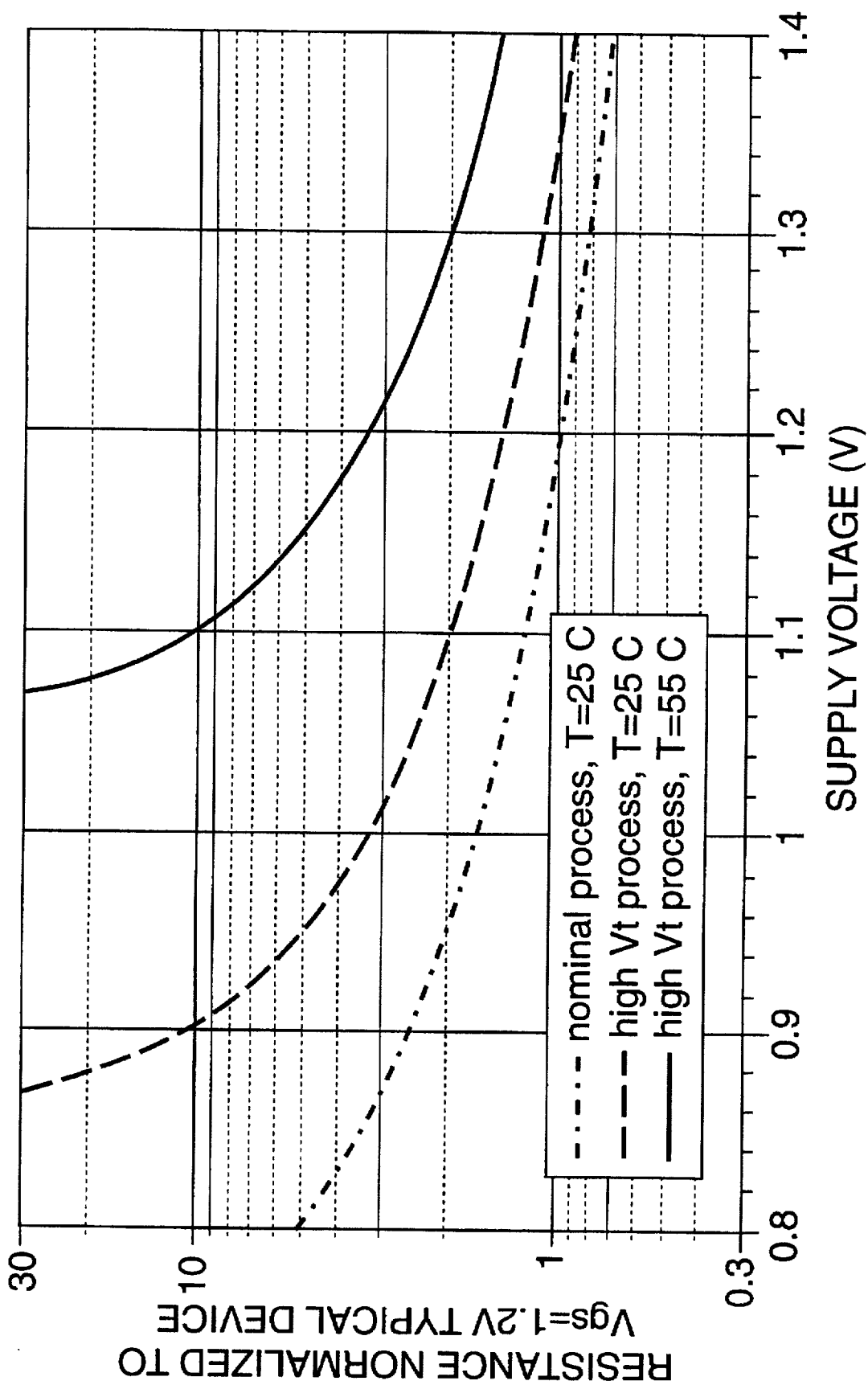
FIG. 4 illustrates a graph showing the normalized on-resistance of a MOSFET as a function of supply voltage at three different temperatures.
Figure 5A:
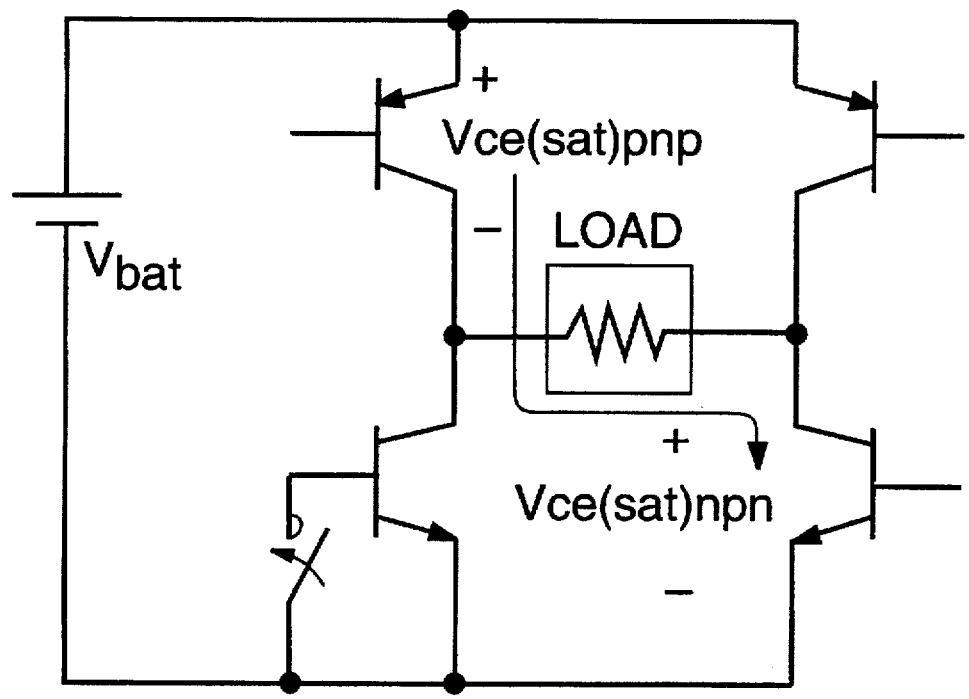
FIGS. 5A and 5B illustrate circuit diagrams of an H-bridge circuit containing bipolar transistors and MOSFETs, respectively.
Figure 5B:
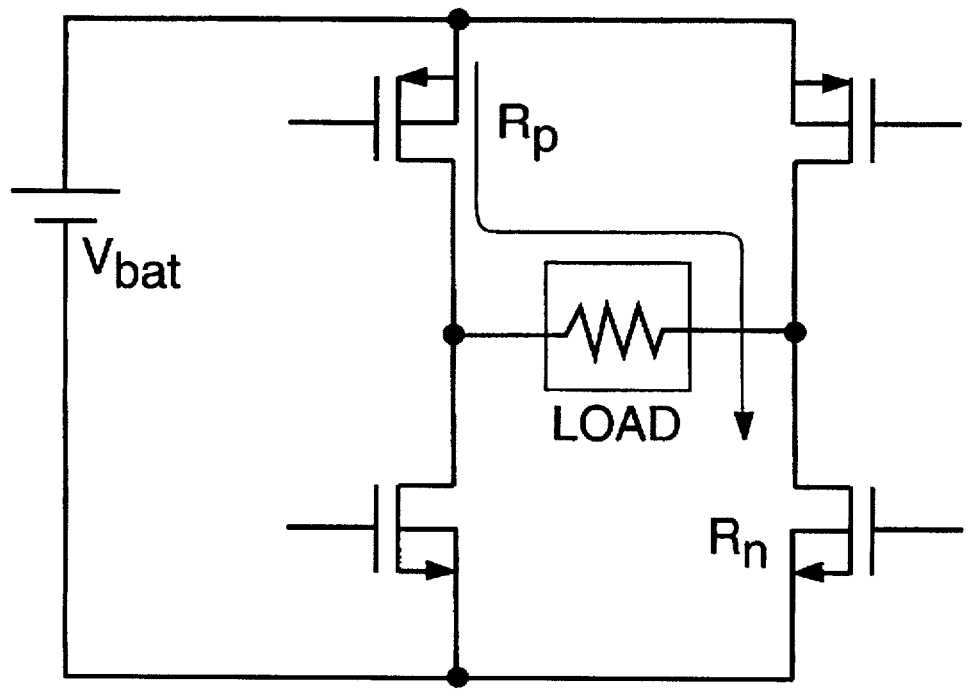
Figure 6:
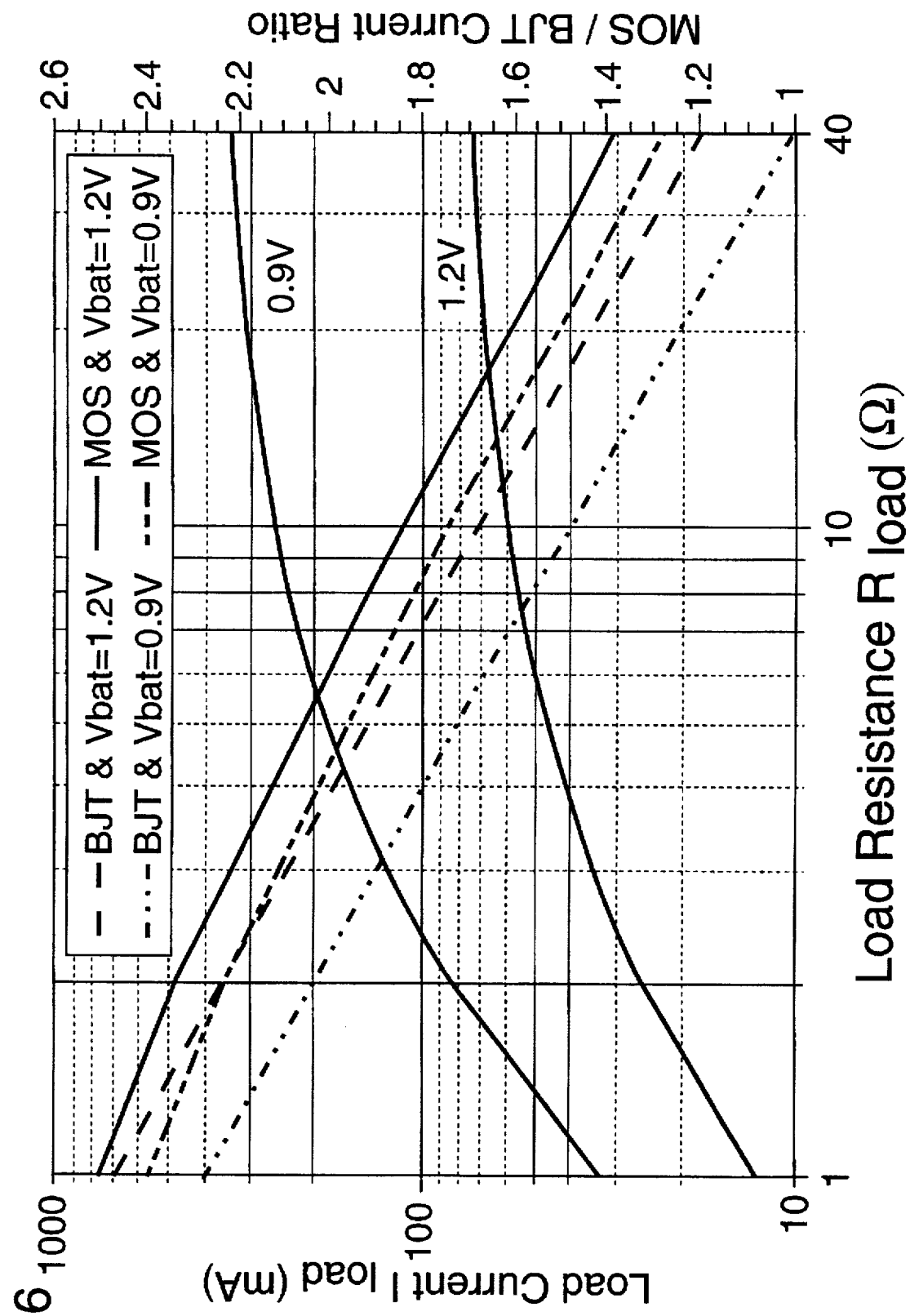
FIG. 6 illustrates a graph showing the load current and ratio of load currents for the circuits shown in FIGS. 5A and 5B.

Column 2, lines 24-25, "Fig. 3A" should not start a new paragraph.

Column 8, line 67, delete "$V_r$" and insert --$V_t$--.

Signed and Sealed this

Fourth Day of August, 1998

Attest:

Attesting Officer

BRUCE LEHMAN

*Commissioner of Patents and Trademarks*